(12) United States Patent
Choi et al.

(10) Patent No.: US 12,513,896 B2
(45) Date of Patent: Dec. 30, 2025

(54) METHOD OF MANUFACTURING INTEGRATED CIRCUIT DEVICE

(71) Applicant: Samsung Electronics Co., Ltd., Suwon-si (KR)

(72) Inventors: Jinseo Choi, Suwon-si (KR); Sohyang Lee, Suwon-si (KR); Jeongmin Jin, Suwon-si (KR); Sohee Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 377 days.

(21) Appl. No.: 18/339,299

(22) Filed: Jun. 22, 2023

(65) Prior Publication Data

US 2024/0155831 A1 May 9, 2024

(30) Foreign Application Priority Data

Nov. 8, 2022 (KR) .......................... 10-2022-0148191

(51) Int. Cl.
*H10B 12/00* (2023.01)

(52) U.S. Cl.
CPC ....... *H10B 12/482* (2023.02); *H10B 12/0335* (2023.02); *H10B 12/50* (2023.02)

(58) Field of Classification Search
CPC ... H10B 12/0335; H10B 12/482; H10B 12/50
See application file for complete search history.

(56) References Cited

U.S. PATENT DOCUMENTS

| | | | |
|---|---|---|---|
| 9,064,731 B2 | 6/2015 | Park | |
| 9,379,114 B2 | 6/2016 | Jeong et al. | |
| 10,332,831 B2 | 6/2019 | Hong et al. | |
| 11,251,188 B2 | 2/2022 | Kim et al. | |
| 11,270,885 B2 | 3/2022 | Lee et al. | |
| 11,329,050 B2 | 5/2022 | Seong et al. | |
| 2015/0214146 A1* | 7/2015 | Kim | H10B 12/0335 257/773 |
| 2018/0175045 A1 | 6/2018 | Lee et al. | |
| 2019/0067294 A1* | 2/2019 | Lee | H10B 12/315 |
| 2022/0037251 A1 | 2/2022 | Park et al. | |

(Continued)

FOREIGN PATENT DOCUMENTS

TW     I792617 B     2/2023

*Primary Examiner* — Steven M Page
(74) *Attorney, Agent, or Firm* — Wolf, Greenfield & Sacks, P.C.

(57) ABSTRACT

A method of manufacturing an integrated circuit device includes forming, on a substrate, a plurality of bit line structures, which each include a bit line and an insulating capping pattern, and a plurality of contact plugs between the plurality of bit line structures, forming a plurality of recess contact plugs from the plurality of contact plugs and forming a plurality of recess spaces on the plurality of recess contact plugs, forming an engraved insulating pattern having openings, on the plurality of bit line structures and the plurality of recess contact plugs, forming a plurality of cut-off spaces by partially removing the insulating capping pattern of each bit line structure through the openings, and forming a plurality of conductive landing pads to respectively fill the plurality of recess spaces and the plurality of cut-off spaces and respectively contact upper surfaces of the plurality of recess contact plugs.

20 Claims, 53 Drawing Sheets

(56) References Cited

U.S. PATENT DOCUMENTS

| | | |
|---|---|---|
| 2022/0122986 A1 | 4/2022 | Jang et al. |
| 2022/0139921 A1* | 5/2022 | Kim .................... H10B 12/315 257/532 |

* cited by examiner

FIG. 9E
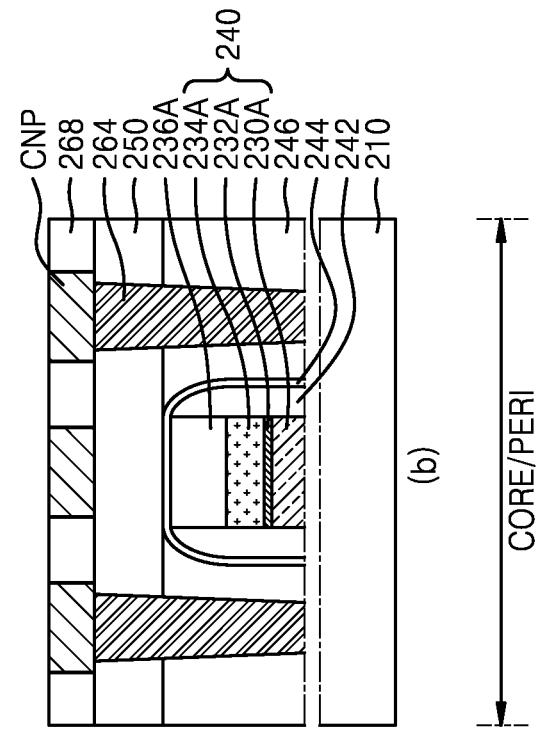
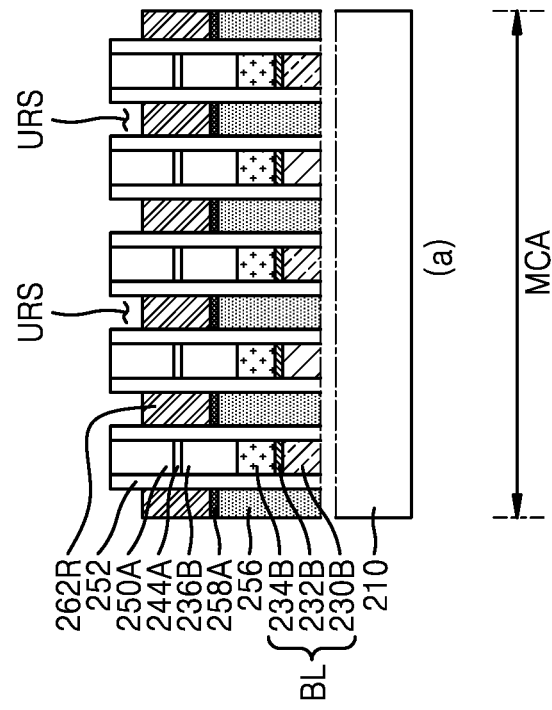

FIG. 14B
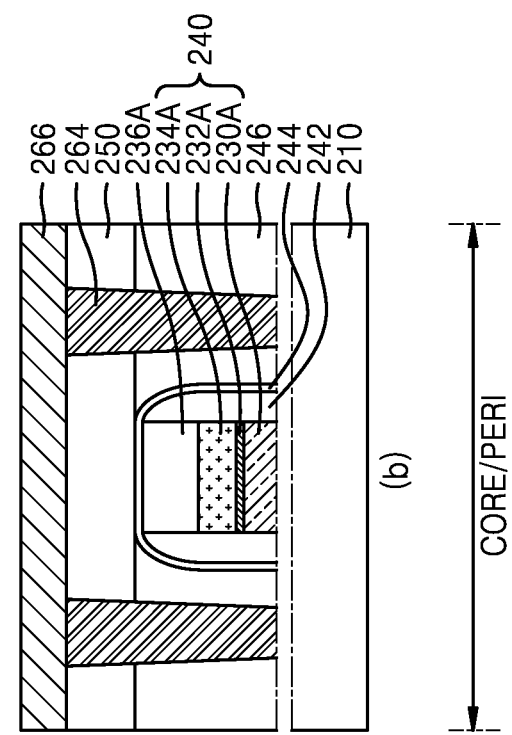
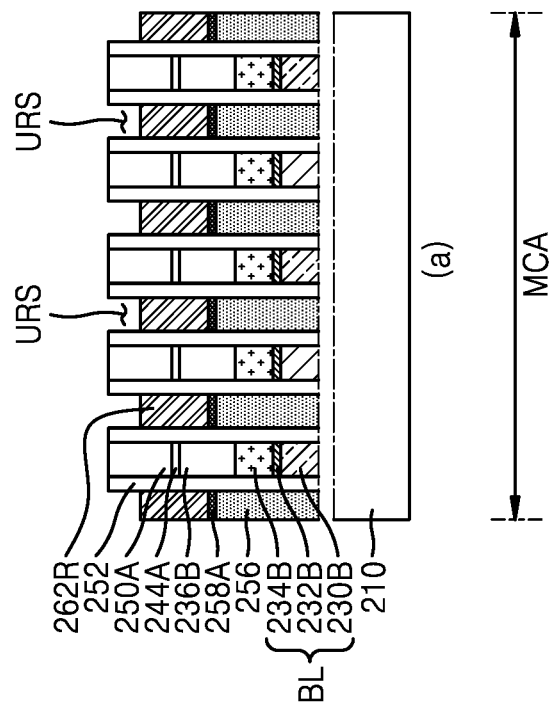

METHOD OF MANUFACTURING INTEGRATED CIRCUIT DEVICE

CROSS-REFERENCE TO RELATED APPLICATION

This application is based on and claims priority under 35 U.S.C. § 119 to Korean Patent Application No. 10-2022-0148191, filed on Nov. 8, 2022, in the Korean Intellectual Property Office, the disclosure of which is incorporated by reference herein in its entirety.

BACKGROUND

The inventive concept relates to a method of manufacturing an integrated circuit device, and more particularly, to a method of manufacturing an integrated circuit device, in which a plurality of conductive patterns are formed by using an engraved pattern.

Due to the advancement of electronics technology, integrated circuit devices have been rapidly down-scaled in recent years, and feature sizes of integrated circuit devices have been finer. Therefore, there is increasing process difficulty in forming patterns having various shapes, various sizes, and various densities as required for integrated circuit devices.

SUMMARY

The inventive concept provides a method of manufacturing an integrated circuit device, which has a reduced device area due to down-scaling, the method allowing the reliability of the integrated circuit device to be improved by suppressing an increase in process difficulty and maximizing a process margin when patterns having various shapes, various sizes, and various densities are formed.

According to an aspect of the inventive concept, there is provided a method of manufacturing an integrated circuit device, the method including forming, on a substrate, a plurality of bit line structures, each of the bit line structures comprising a bit line and an insulating capping pattern, and a plurality of contact plugs between the plurality of bit line structures, forming a plurality of recess contact plugs respectively from the plurality of contact plugs and forming a plurality of recess spaces respectively on the plurality of recess contact plugs between the plurality of bit line structures, by partially removing each of the plurality of contact plugs, forming an engraved insulating pattern having a plurality of openings, on the plurality of bit line structures and the plurality of recess contact plugs, the plurality of openings being arranged to be respectively shifted in a horizontal direction from the plurality of recess contact plugs, forming a plurality of cut-off spaces, which are respectively connected to the plurality of recess spaces and overlap at least a portion of the bit line in a vertical direction, by partially removing the insulating capping pattern of each of the plurality of bit line structures through the plurality of openings, and forming a plurality of conductive landing pads respectively in the plurality of recess spaces and the plurality of cut-off spaces and respectively contacting upper surfaces of the plurality of recess contact plugs.

According to another aspect of the inventive concept, there is provided a method of manufacturing an integrated circuit device, the method including, on a substrate having a cell array area and a peripheral circuit area, forming a plurality of bit line structures, each of the bit line structures comprising a bit line and an insulating capping pattern, and a plurality of first contact plugs between the plurality of bit line structures, in the cell array area, and forming a plurality of second contact plugs, which are configured to be electrically connected to the substrate, in the peripheral circuit area, forming a plurality of peripheral circuit wiring patterns, which are connected to at least a subset of the plurality of second contact plugs, in the peripheral circuit area, after the plurality of peripheral circuit wiring patterns are formed, forming a plurality of first recess contact plugs respectively from the plurality of first contact plugs and forming a plurality of recess spaces respectively on the plurality of first recess contact plugs between the plurality of bit line structures, by removing a portion of each of the plurality of first contact plugs in the cell array area, forming an engraved insulating pattern having a plurality of openings, on the plurality of bit line structures and the plurality of first recess contact plugs in the cell array area, the plurality of openings being arranged to be respectively shifted in a horizontal direction from the plurality of first recess contact plugs, forming, in the cell array area, a plurality of cut-off spaces, which are respectively connected to the plurality of recess spaces and overlap at least a portion of the bit line in a vertical direction, by removing a portion of the insulating capping pattern of each of the plurality of bit line structures through the plurality of openings, and forming, in the cell array area, a plurality of conductive landing pads respectively in the plurality of recess spaces and the plurality of cut-off spaces and respectively contacting upper surfaces of the plurality of first recess contact plugs.

According to yet another aspect of the inventive concept, there is provided a method of manufacturing an integrated circuit device, the method including, on a substrate having a cell array area and a peripheral circuit area, forming a plurality of bit line structures, each of the bit line structures comprising a bit line and an insulating capping pattern, and a plurality of first contact plugs between the plurality of bit line structures, in the cell array area, and forming a plurality of second contact plugs, which are configured to be electrically connected to the substrate, in the peripheral circuit area, forming a plurality of first recess contact plugs respectively from the plurality of first contact plugs and forming a plurality of recess spaces respectively on the plurality of first recess contact plugs between the plurality of bit line structures, by removing a portion of each of the plurality of first contact plugs in the cell array area, after the plurality of recess spaces are formed, forming a plurality of peripheral circuit wiring patterns, which are respectively connected to at least a subset of the plurality of second contact plugs, in the peripheral circuit area, forming an engraved insulating pattern having a plurality of openings, on the plurality of bit line structures and the plurality of first recess contact plugs in the cell array area, the plurality of openings being arranged to be respectively shifted in a horizontal direction from the plurality of first recess contact plugs, forming, in the cell array area, a plurality of cut-off spaces, which are respectively connected to the plurality of recess spaces and overlap at least a portion of the bit line in a vertical direction, by removing a portion of the insulating capping pattern of each of the plurality of bit line structures through the plurality of openings, and forming, in the cell array area, a plurality of conductive landing pads respectively in the plurality of recess spaces and the plurality of cut-off spaces and respectively contacting upper surfaces of the plurality of first recess contact plugs.

BRIEF DESCRIPTION OF THE DRAWINGS

Embodiments will be more clearly understood from the following detailed description taken in conjunction with the accompanying drawings, wherein like reference numerals (when used) indicate corresponding elements throughout the several views, and in which:

FIGS. 9A to 9J are cross-sectional views respectively illustrating a sequence of intermediate processes of an exemplary method of manufacturing an integrated circuit device, according to some embodiments;

DETAILED DESCRIPTION OF THE EMBODIMENTS

Figure 1:
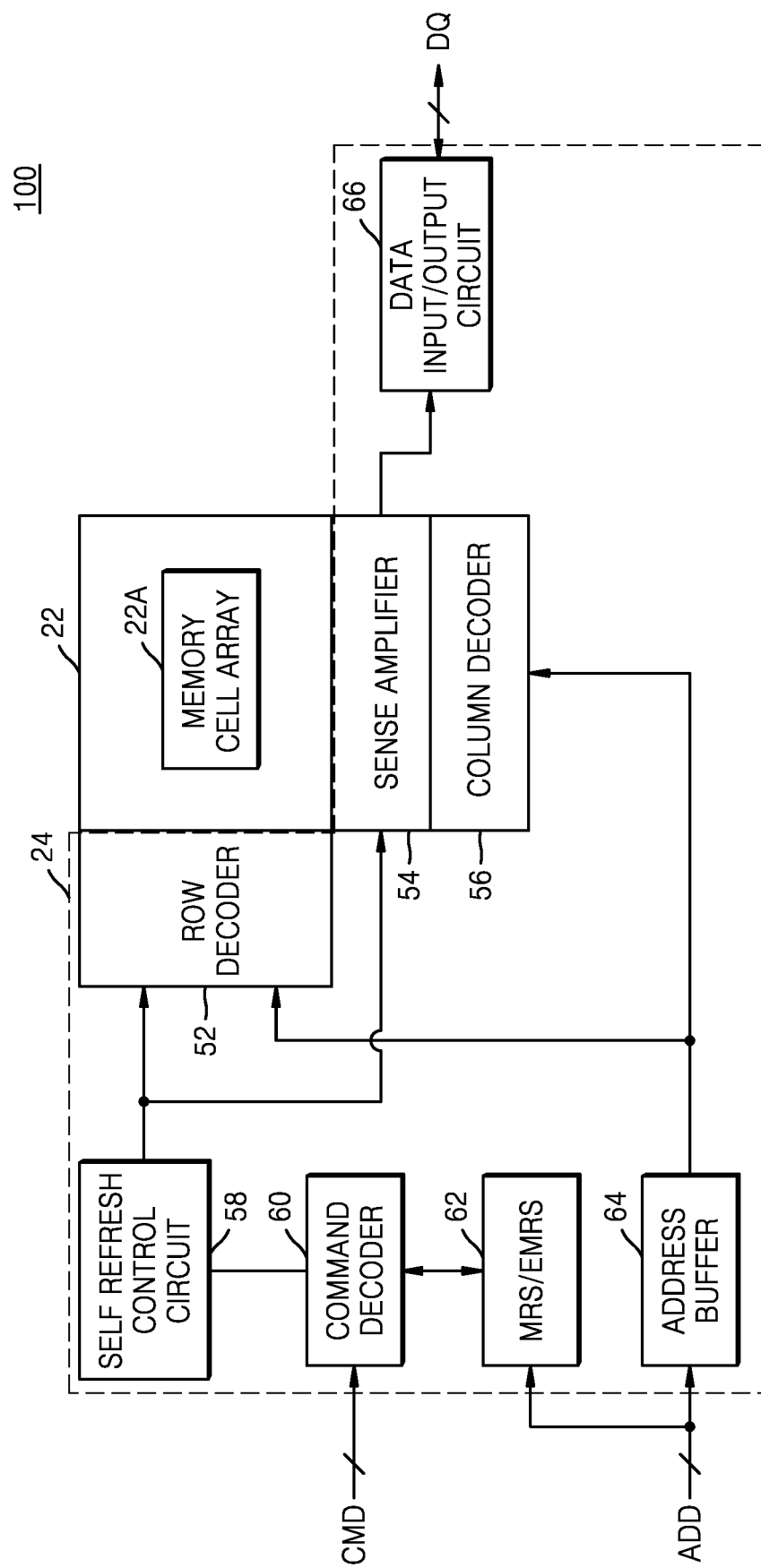
FIG. 1 is a block diagram illustrating an example of a configuration of an integrated circuit device, according to some embodiments.

Hereinafter, embodiments of the inventive concept will be described in detail with reference to the accompanying drawings. Like components are denoted by like reference numerals throughout the specification, and repeated descriptions thereof are omitted.

FIG. 1 is a block diagram illustrating an example of a configuration of an integrated circuit device 100, according to some embodiments.

Referring to FIG. 1, the integrated circuit device 100 includes a first area 22 and a second area 24. The first area 22 may be a memory cell area of a dynamic random access memory (DRAM) device, and the second area 24 may be a peripheral circuit area of the DRAM device. The first area 22 may include a memory cell array 22A. The second area 24 may include a row decoder 52, a sense amplifier 54, a column decoder 56, a self-refresh control circuit 58, a command decoder 60, a Mode Register Set/Extended Mode Register Set (MRS/EMRS) circuit 62, an address buffer 64, and a data input/output circuit 66.

Figure 2:
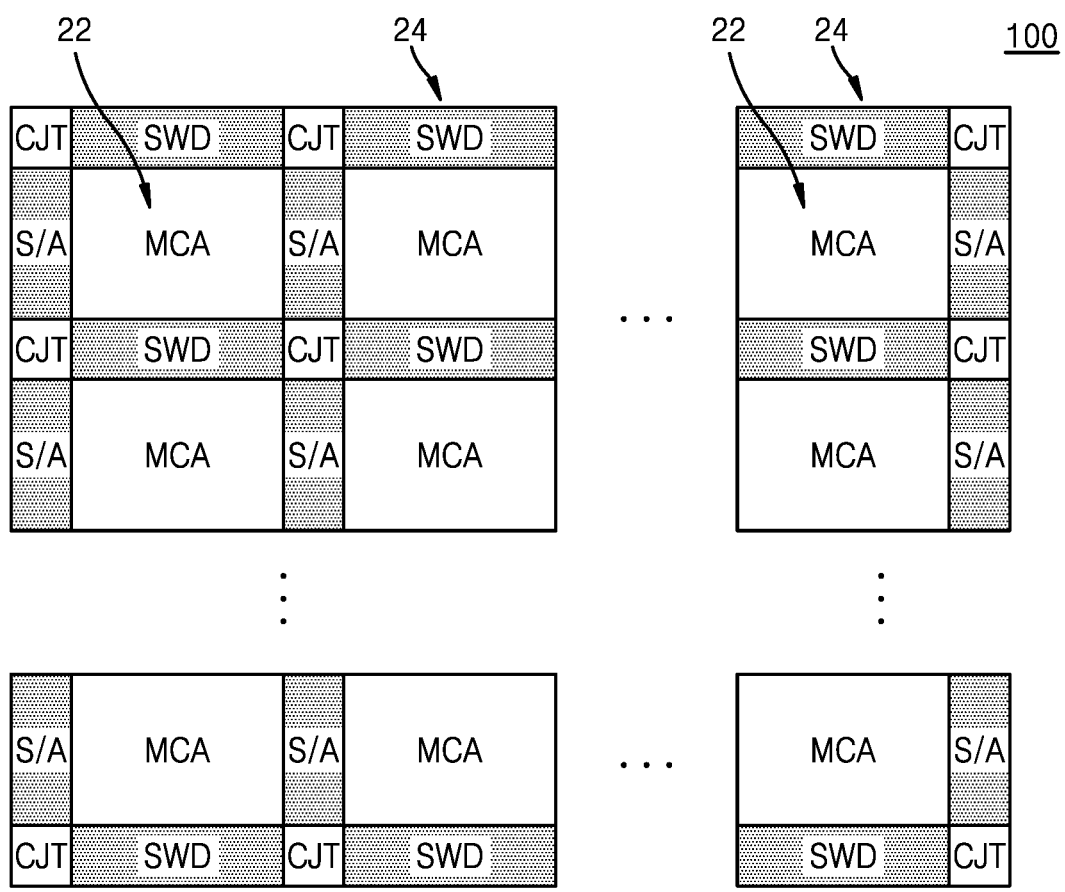
FIG. 2 is a plan view illustrating an example of an arrangement configuration in an integrated circuit device, according to some embodiments.

FIG. 2 is a plan view illustrating an example of an arrangement configuration in the integrated circuit device 100 shown in FIG. 1.

Referring to FIG. 2, the integrated circuit device 100 includes a plurality of first areas 22. Each of the plurality of first areas 22 may be surrounded by (i.e., extending around) the second area 24.

Each of the plurality of first areas 22 may include a cell array area MCA of a DRAM device, and the second area 24 may include an area, in which peripheral circuits of the DRAM device are formed, and a core area (hereinafter, referred to as a peripheral circuit area). In the plurality of first areas 22, the cell array area MCA may include the memory cell array 22A described with reference to FIG. 1.

The second area 24 may include a sub-word line driver block SWD, a sense amplifier block S/A, and a conjunction block CJT. A plurality of bit line sense amplifiers may be arranged in the sense amplifier block S/A. The conjunction block CJT may be arranged at an intersection point between the sub-word line driver block SWD and the sense amplifier block S/A. Power drivers and ground drivers for driving a bit line sense amplifier may be alternately arranged in the conjunction block CJT. Peripheral circuits, such as an inverter chain and an input/output circuit, may be further formed in the second area 24.

Figure 3:
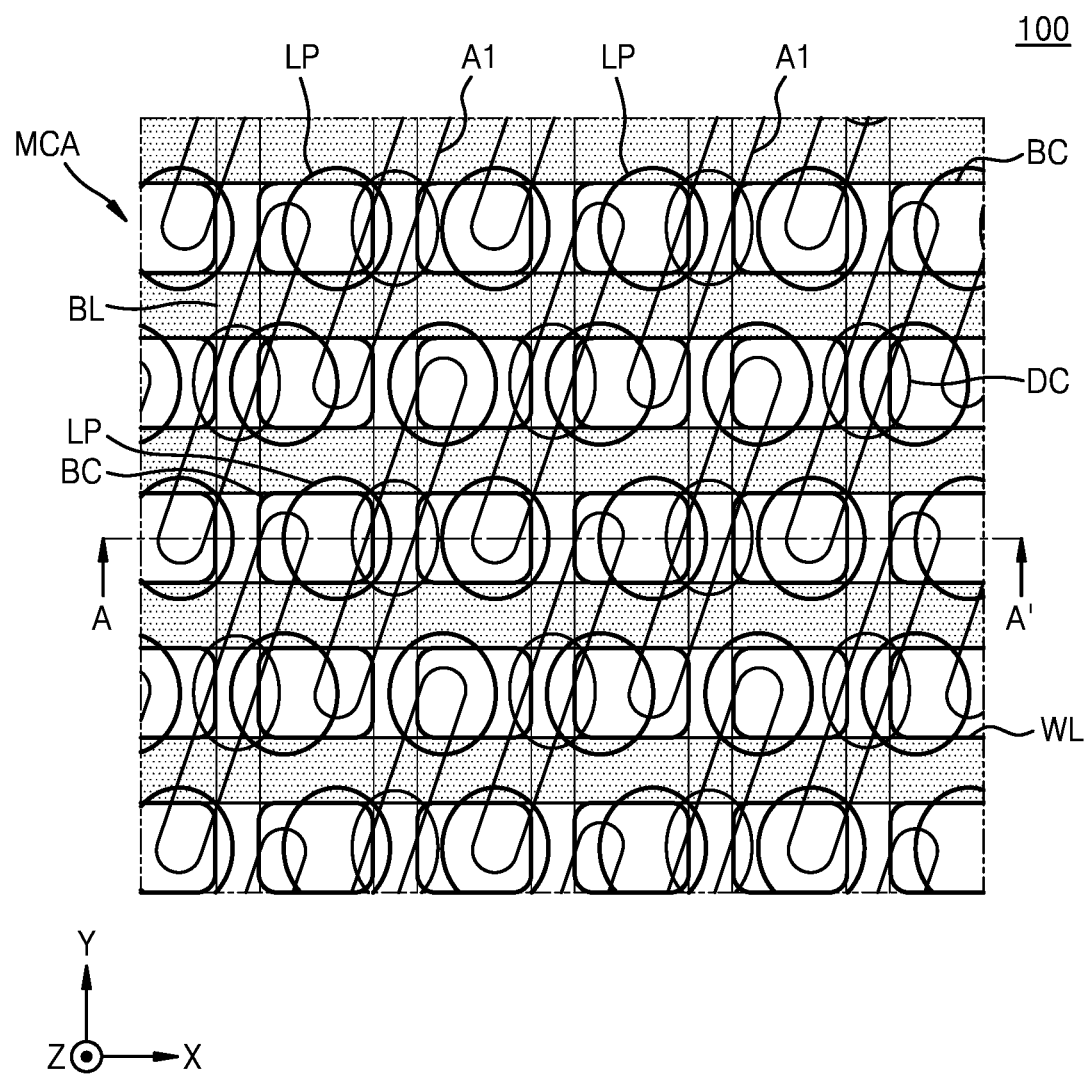
FIG. 3 is a schematic planar layout illustrating main components of a cell array area of an integrated circuit device, according to some embodiments.

FIG. 3 is a schematic planar layout illustrating main components of the cell array area MCA shown in FIG. 2.

Referring to FIG. 3, the cell array area MCA may include a plurality of cell active regions A1. Each of the plurality of cell active regions A1 may be arranged to have a major axis in an oblique direction with respect to a first horizontal direction (X direction) and a second horizontal direction (Y direction). A plurality of word lines WL may extend parallel to each other in the first horizontal direction (X direction) across the plurality of cell active regions A1. A plurality of bit lines BL may extend parallel to each other in the second horizontal direction (Y direction) over the plurality of word lines WL. Each of the plurality of bit lines BL may be connected to each of the plurality of cell active regions A1 via a direct contact DC. A plurality of buried contacts BC may be formed between two adjacent bit lines BL from among the plurality of bit lines BL. The plurality of buried contacts BC may be arranged in a line in the first horizontal direction (X direction) and the second horizontal direction (Y direction). A plurality of conductive landing pads LP may be respectively formed on the plurality of buried contacts BC. Each of the plurality of buried contacts BC and each of the plurality of conductive landing pads LP may connect a lower electrode (not shown) of a capacitor, which is formed over each of the plurality of bit lines BL, to a cell active region A1. Each of the plurality of conductive landing pads LP may be arranged to partially overlap a buried contact BC.

Figure 4:
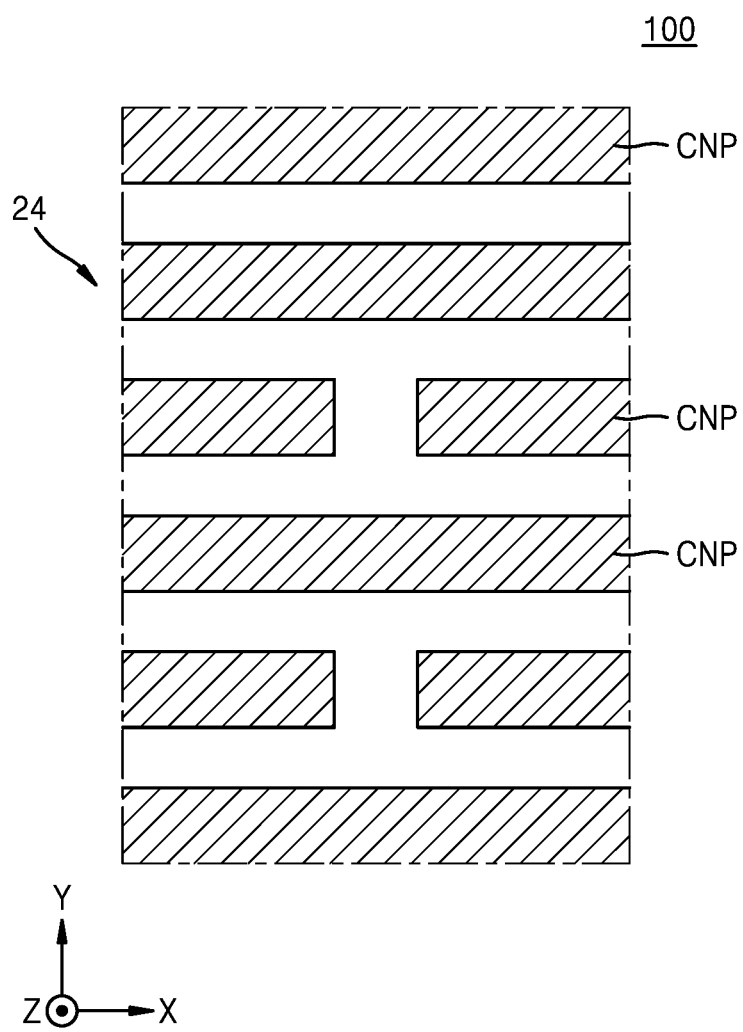
FIG. 4 is a plan view illustrating an example of an arrangement configuration of a plurality of conductive patterns arranged in a peripheral circuit area of an integrated circuit device, according to some embodiments.

FIG. 4 is a plan view illustrating an example of an arrangement configuration of a plurality of conductive patterns CNP arranged in a peripheral circuit area of an integrated circuit device, according to some embodiments.

The plurality of conductive patterns CNP may be arranged in the second area 24 of the integrated circuit device 100 shown in FIGS. 1 and 2. Some of the conductive patterns CNP may extend parallel to each other. Some of the conductive patterns CNP may each function as a conductive pad for connecting a lower conductive region to an upper conductive region. The plurality of conductive patterns CNP may be apart from each other with various-sized spaces therebetween, in a horizontal direction, for example, the first horizontal direction (X direction) or the second horizontal direction (Y direction). In a portion of the second area 24, a minimum separation distance between two adjacent conductive patterns CNP may be a minimum feature size of the integrated circuit device 100. In another portion of the second area 24, the minimum separation distance between two adjacent conductive patterns CNP may be several to tens of times the minimum feature size of the integrated circuit device 100.

Each of the plurality of conductive patterns CNP may have various widths in the horizontal direction, for example, in the first horizontal direction (X direction) and in the second horizontal direction (Y direction), and there may be various separation distances between the plurality of conductive patterns CNP in the horizontal direction, for example, in the first horizontal direction (X direction) and in the second horizontal direction (Y direction).

The plurality of conductive landing pads LP shown in FIG. 3 and the plurality of conductive patterns CNP shown in FIG. 4 may be formed by a series of processes including a plurality of exposure processes. In some embodiments, a series of processes of forming the plurality of conductive landing pads LP shown in FIG. 3 and the plurality of conductive patterns CNP shown in FIG. 4 may include one or two photolithography processes using an extreme ultraviolet (EUV) light source.

Figure 5:
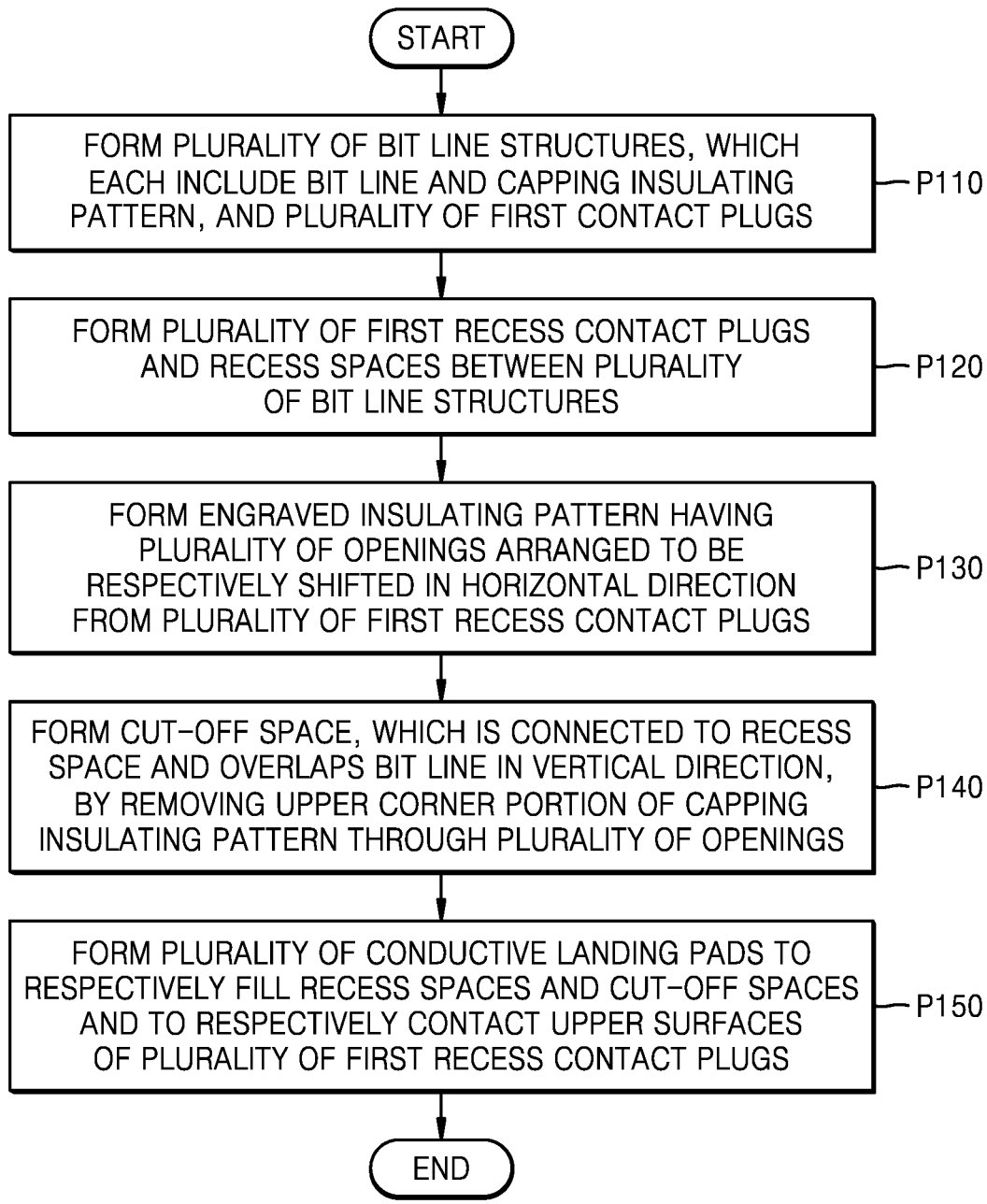
FIGS. 5 to 7 are each a flowchart illustrating an example of a method of manufacturing an integrated circuit device, according to some embodiments.
Figure 6:
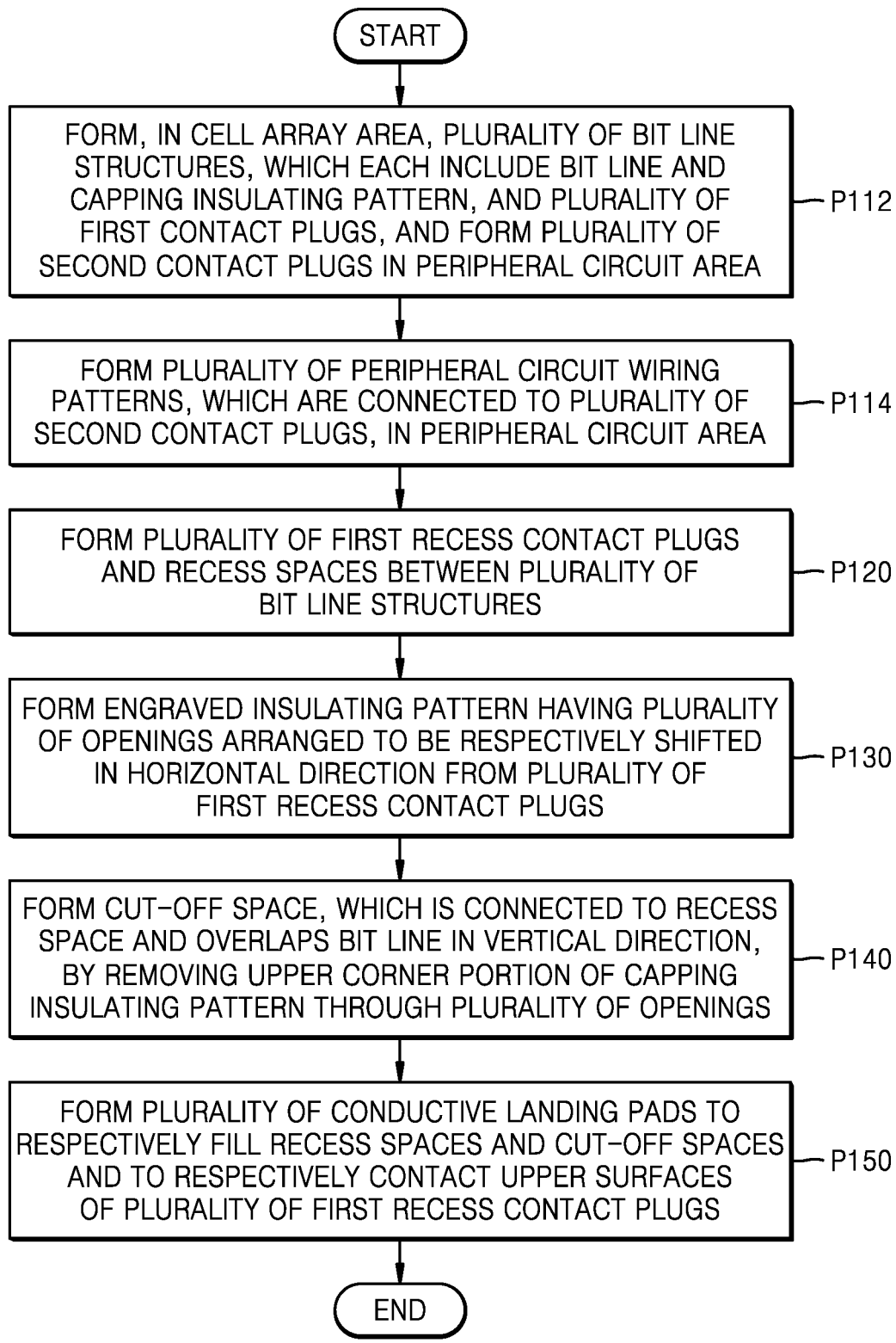
Figure 7:
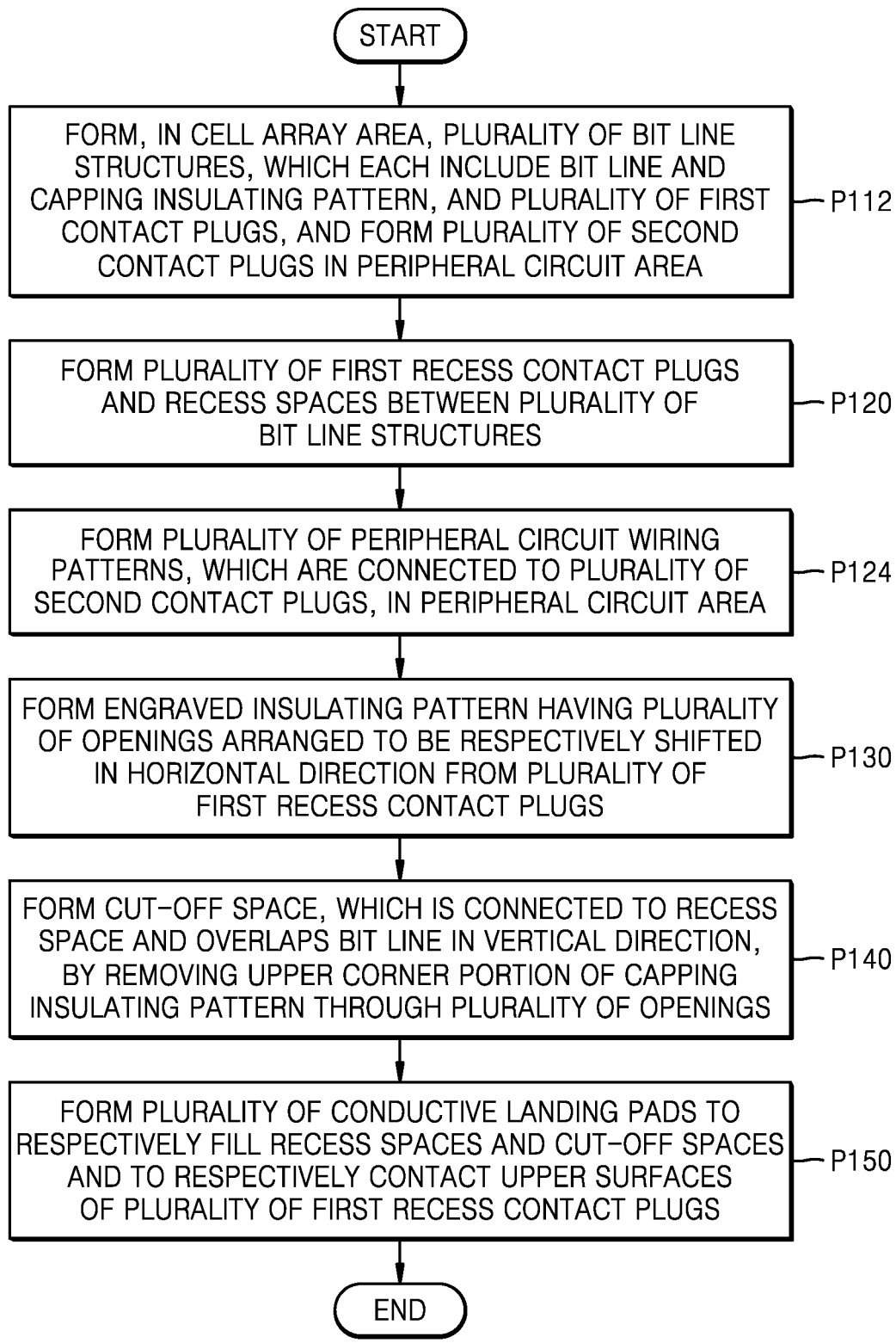

FIGS. 5 to 7 are each a flowchart illustrating an example of a method of manufacturing an integrated circuit device, according to some embodiments. FIGS. 8A to 8L, FIGS. 9A to 9J, and FIGS. 14A to 14P are cross-sectional views respectively illustrating methods of manufacturing an integrated circuit device based on respective sequences of intermediate processes, according to some embodiments.

More specifically, FIG. 5 is a flowchart illustrating the method of manufacturing an integrated circuit device in the cell array area MCA shown in FIGS. 8A to 8L, FIGS. 9A to 9J, and FIGS. 14A to 14P. Processes shown in FIG. 5 are described below by referring to the method described with reference to FIGS. 8A to 8L, the method described with reference to FIGS. 9A to 9J, and the method described with reference to FIGS. 14A to 14P.

FIG. 6 is a flowchart illustrating an example of the method of manufacturing an integrated circuit device in the cell array area MCA and the peripheral circuit area CORE/PERI shown in FIGS. 8A to 8L and FIGS. 9A to 9J. Processes shown in FIG. 6 are described below by referring to the method described with reference to FIGS. 8A to 8L and the method described with reference to FIGS. 9A to 9J.

FIG. 7 is a flowchart illustrating another example of the method of manufacturing an integrated circuit device in the cell array area MCA and the peripheral circuit area CORE/PERI shown in FIGS. 8A to 8L and FIGS. 14A to 14P. Processes shown in FIG. 7 are described below by referring to the method described with reference to FIGS. 8A to 8L and the method described with reference to FIGS. 14A to 14P.

FIGS. 8A to 8L, FIGS. 9A to 9J, and FIGS. 14A to 14P, (a) illustrate a cross-sectional view of a region corresponding to a cross-section taken along a line A-A' of FIG. 3, according to the sequence of processes, and (b) illustrate a cross-sectional view of some components of the peripheral circuit area CORE/PERI according to the sequence of processes. In FIGS. 9A to 9J and FIGS. 14A to 14P, some components shown in FIG. 8L are not illustrated for convenience.

First, the methods of manufacturing an integrated circuit device, respectively shown in FIGS. 5 and 6, are described with reference to FIGS. 8A to 8L and FIGS. 9A to 9J by taking specific examples.

Figure 8A:
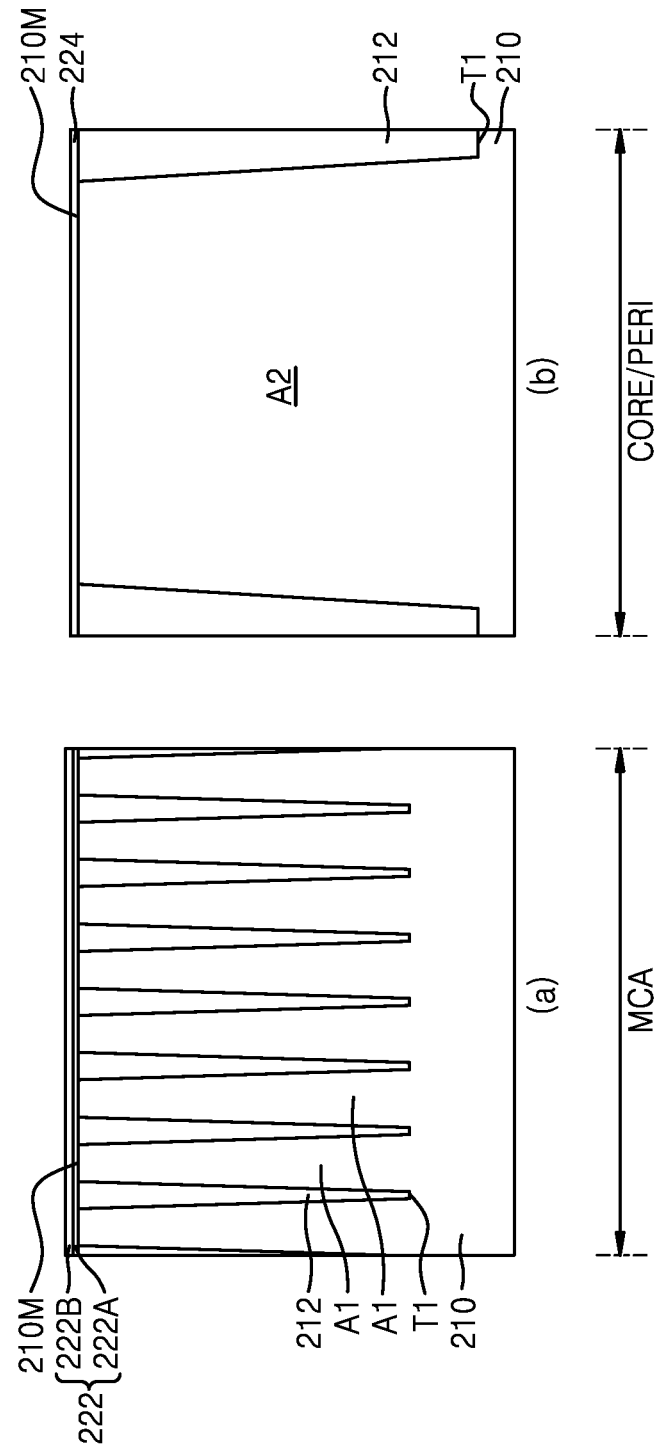
FIGS. 8A to 8L are cross-sectional views respectively illustrating a sequence of intermediate processes of an exemplary method of manufacturing an integrated circuit device, according to some embodiments.

Referring to FIG. 8A, by forming a plurality of device isolation trenches T1 and a plurality of device isolation films 212 in a substrate 210 having the cell array area MCA and the peripheral circuit area CORE/PERI, a plurality of cell active regions A1 may be defined in the cell array area MCA of the substrate 210, and a peripheral active region A2 may be defined in the peripheral circuit area CORE/PERI of the substrate 210.

A plurality of word line trenches (not shown), which extend parallel to each other, may be formed in the substrate 210 in the cell array area MCA, and then, a plurality of gate dielectric films, a plurality of word lines, and a plurality of buried insulating films may be respectively formed in the stated order in the plurality of word line trenches. The plurality of word lines may constitute the plurality of word lines WL shown in FIG. 3. A plurality of source/drain regions may be respectively formed in upper portions of the plurality of cell active regions A1 by implanting impurity ions into portions of each of the plurality of cell active regions A1 on both sides of each of the plurality of word lines WL. In some embodiments, the plurality of source/drain regions may be formed before the plurality of word lines WL are formed.

Next, a buffer film 222 may be formed on a main surface 210M of the substrate 210 in the cell array area MCA, and a gate dielectric film 224 may be formed on the main surface 210M of the substrate 210 in the peripheral circuit area CORE/PERI. The buffer film 222 may include a first insulating film 222A and a second insulating film 222B. Each of the first insulating film 222A and the second insulating film 222B may include an oxide film, a nitride film, or a combination thereof.

Figure 8B:
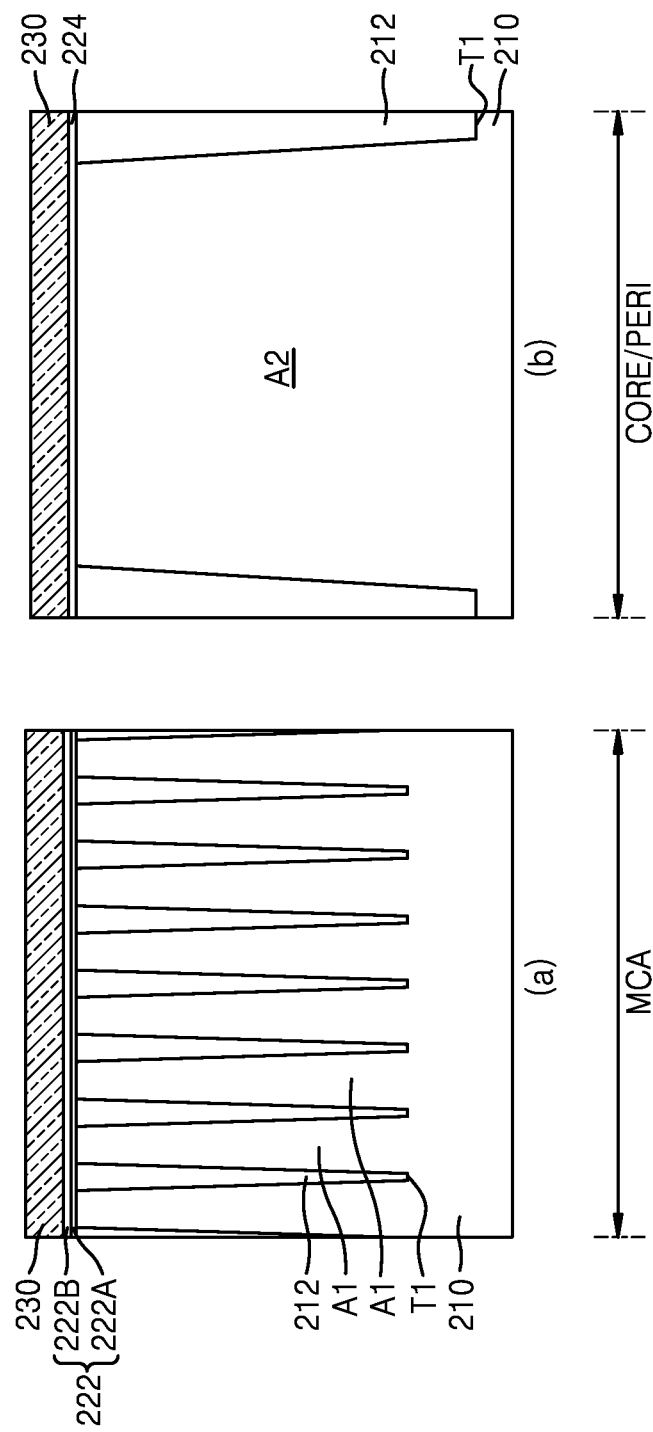

Referring to FIG. 8B, a lower conductive layer 230 may be formed on the buffer film 222 of the cell array area MCA and the gate dielectric film 224 of the peripheral circuit area CORE/PERI. The lower conductive layer 230 may include doped polysilicon.

Figure 8C:
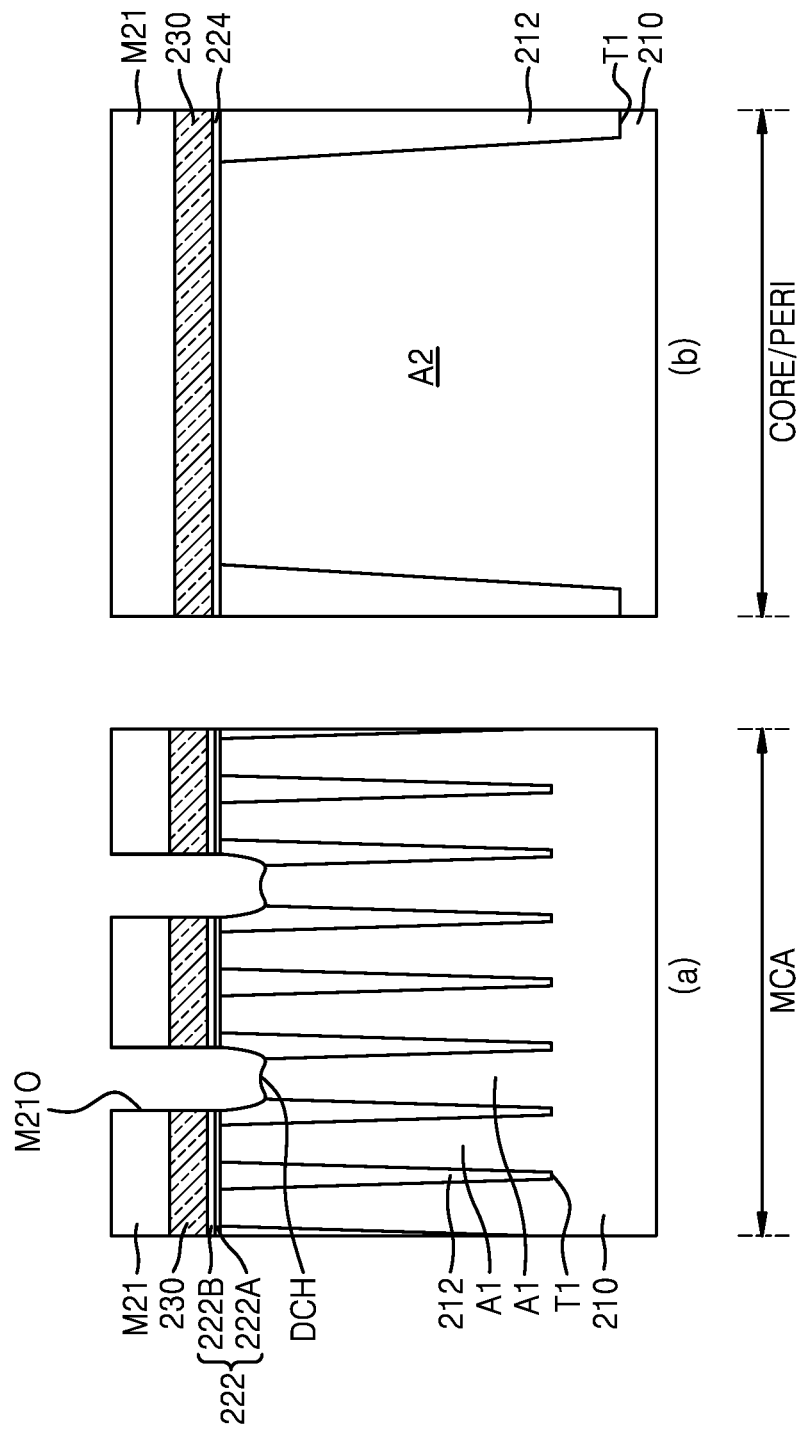

Referring to FIG. 8C, a mask pattern M21 may be formed on the lower conductive layer 230 in the cell array area MCA and the peripheral circuit area CORE/PERI, followed by etching the lower conductive layer 230 exposed by an opening M21O of the mask pattern M21 in the cell array area MCA, and then, a portion of the substrate 210 and a portion of a device isolation film 212, which are exposed as a result of the etching, may be etched, thereby forming a direct contact hole DCH to expose the cell active region A1 of the substrate 210. The mask pattern M21 may include an oxide film, a nitride film, or a combination thereof. It is to be appreciated that the term "exposed" as may be used throughout the specification to describe certain intermediate processes in forming a completed semiconductor device is not intended to necessarily require exposure of the particular region, layer, structure or other element in the actual completed device.

Figure 8D:
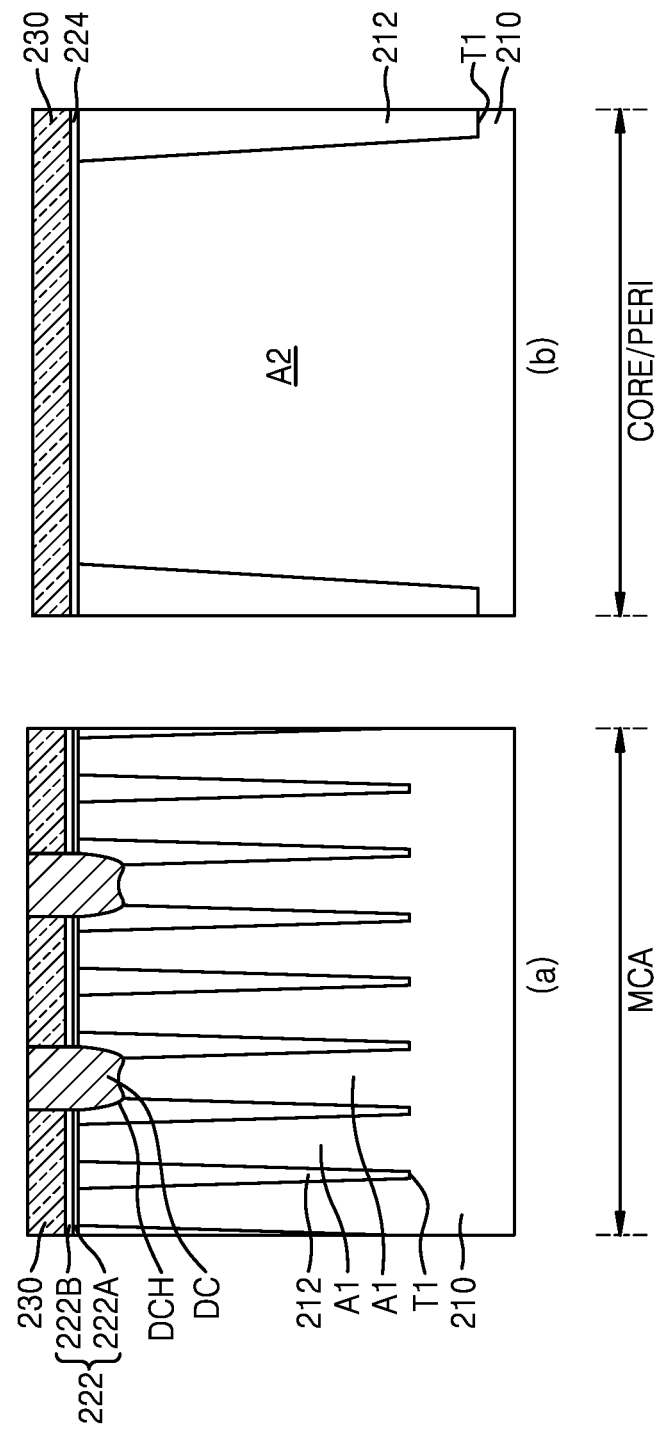

Referring to FIG. 8D, the mask pattern M21 may be removed from a resulting product of FIG. 8C, and a direct contact DC may be formed in the direct contact hole DCH in the cell array area MCA. In an example process of forming the direct contact DC, a conductive layer, which has a sufficient thickness to fill the direct contact hole DCH, may be formed in the direct contact hole DCH and on the lower conductive layer 230, and then, the conductive layer may be etched back to leave the conductive layer only in the direct contact hole DCH. The term "fill" as used herein is intended to refer to either completely filling a defined space (e.g., DCH) or partially filling the defined space; that is, the defined space need not be entirely filled but may, for example, be partially filled or have voids or other spaces throughout. The conductive layer may include doped polysilicon, Ge, W, WN, Co, Ni, Al, Mo, Ru, Ti, TiN, Ta, TaN, Cu, or a combination thereof.

Figure 8E:
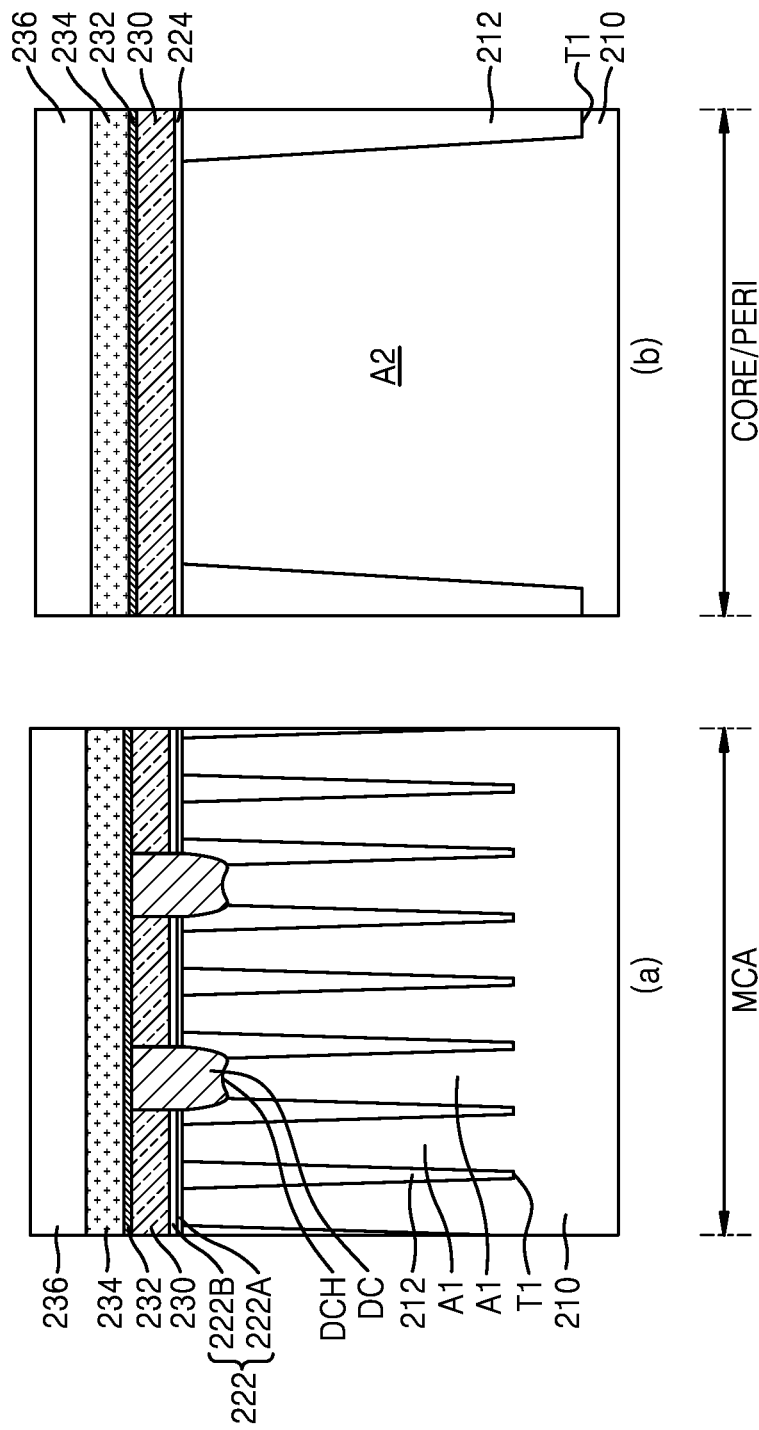

Referring to FIG. 8E, an intermediate conductive layer 232, an upper conductive layer 234, and a lower insulating capping layer 236 may be formed in the stated order on the direct contact DC and the lower conductive layer 230 in the cell array area MCA and the peripheral circuit area CORE/PERI.

Each of the intermediate conductive layer 232 and the upper conductive layer 234 may include titanium nitride (TiN), titanium silicon nitride (TiSiN), tungsten (W), tungsten silicide ($WSi_2$), or a combination thereof. The lower insulating capping layer 236 may include a silicon nitride film. In some embodiments, the intermediate conductive layer 232 may include TiN, TiSiN, or a combination thereof, and the upper conductive layer 234 may include W. The lower insulating capping layer 236 may include a silicon nitride film.

Figure 8F:
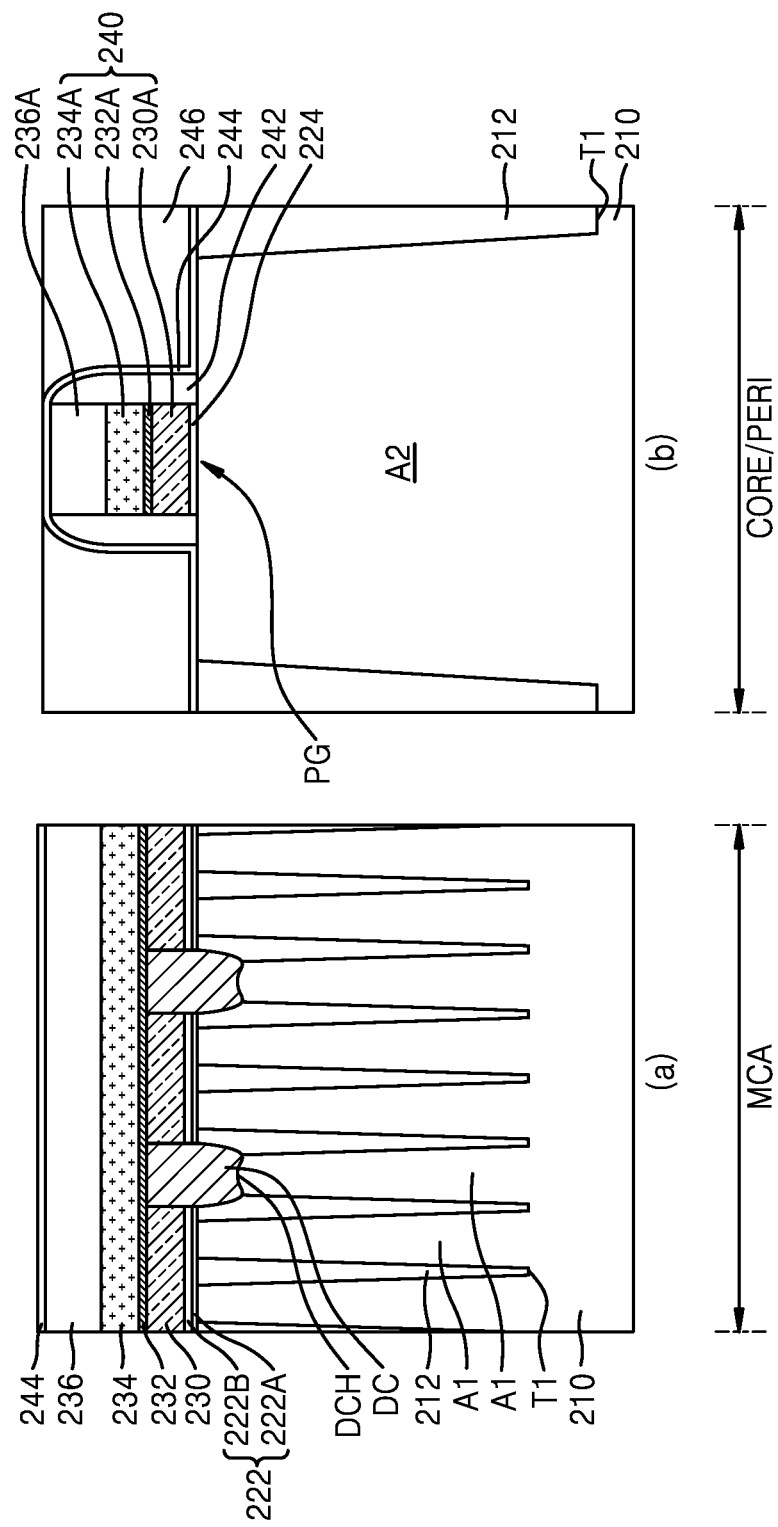

Referring to FIG. 8F, in a resulting product of FIG. 8E, by patterning the gate dielectric film 224, the lower conductive layer 230, the intermediate conductive layer 232, the upper conductive layer 234, and the lower insulating capping layer 236 in the peripheral circuit area CORE/PERI while the cell array area MCA is covered by a mask pattern (not shown), a gate electrode 240, which includes a lower conductive pattern 230A, an intermediate conductive pattern 232A, and an upper conductive pattern 234A, and a gate capping pattern 236A, which covers the gate electrode 240, may be formed on the gate dielectric film 224. Next, an insulating spacer 242 may be formed on both sidewalls of a gate structure PG that includes a stack structure of the gate dielectric film 224, the gate electrode 240, and the gate capping pattern 236A, and an ion implantation process for forming a source/drain region may be performed on the peripheral active region A2 on both sides of the gate structure PG. In some embodiments, the insulating spacer 242 may include an oxide film, a nitride film, or a combination thereof.

Next, the lower insulating capping layer 236 in the peripheral circuit area CORE/PERI may be exposed by removing the mask pattern having covered the cell array area MCA, and an insulating thin-film 244 may be formed to cover an entire surface of an exposed resulting product in the cell array area MCA and the peripheral circuit area CORE/PERI. Next, an interlayer dielectric 246 may be formed on an upper surface of the insulating thin-film 244 to fill a space around the gate structure PG in the peripheral circuit area CORE/PERI. The insulating thin-film 244 may include a silicon nitride film. The interlayer dielectric 246 may include, but is not limited to, polysilazane.

Figure 8G:
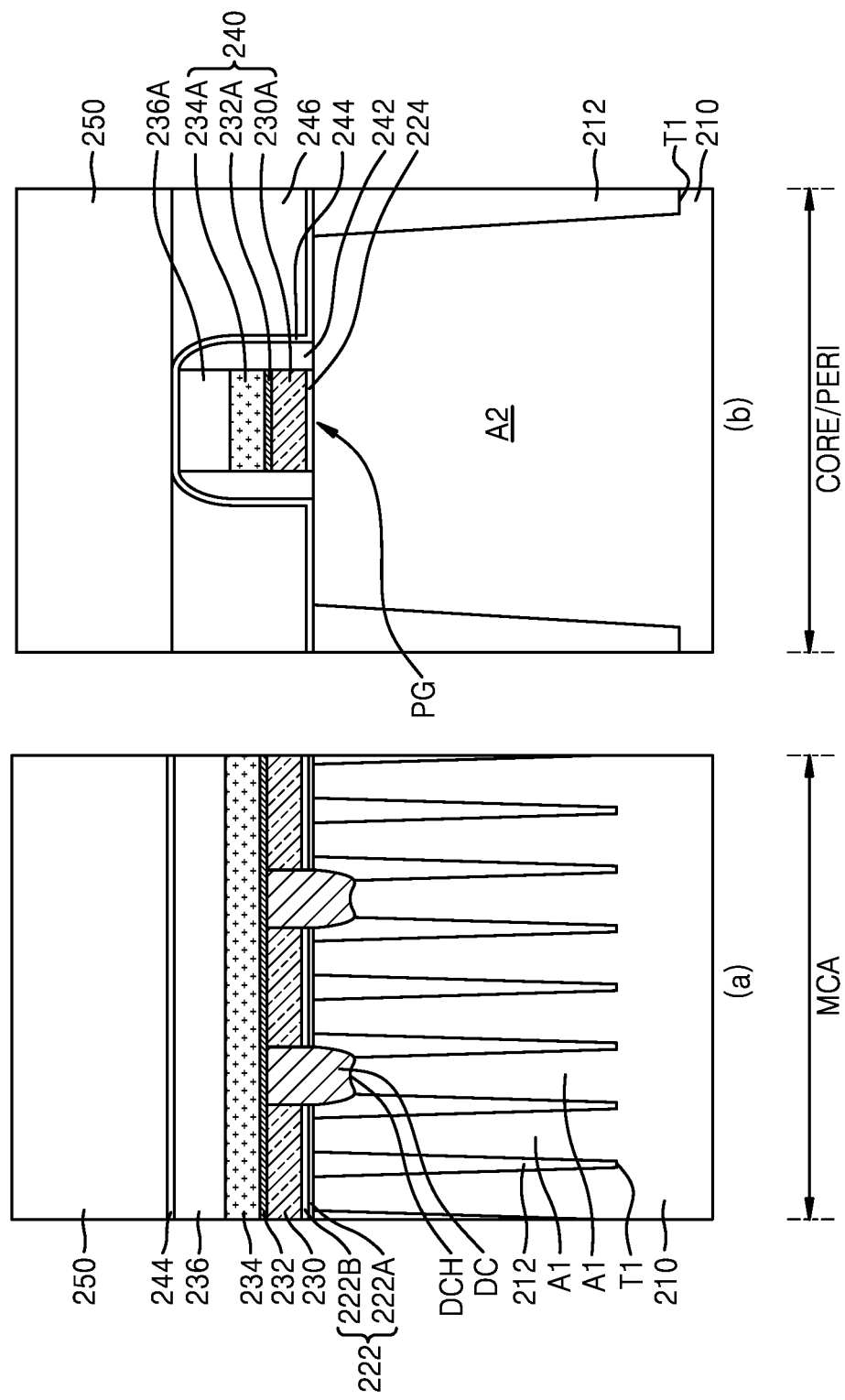

Referring to FIG. 8G, an upper insulating capping layer 250 may be formed on the insulating thin-film 244 and the interlayer dielectric 246 in the cell array area MCA and the peripheral circuit area CORE/PERI. The upper insulating capping layer 250 may include a silicon nitride film.

Figure 8H:
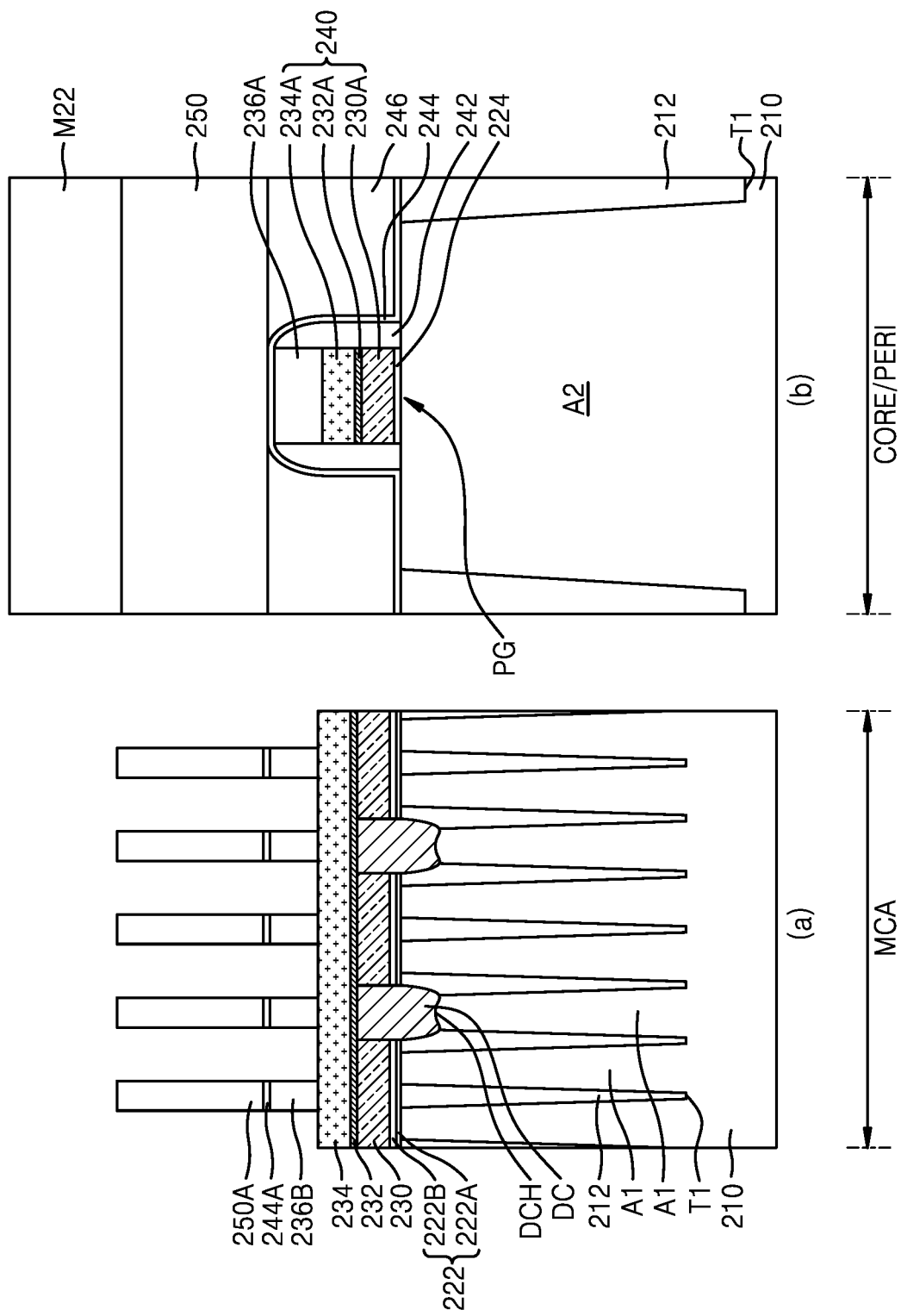

Referring to FIG. 8H, the upper insulating capping layer 250, the insulating thin-film 244, and the lower insulating capping layer 236 in the cell array area MCA may be patterned by a photolithography process while the upper insulating capping layer 250 in the peripheral circuit area CORE/PERI is covered by a mask pattern M22, thereby forming a lower insulating capping pattern 236B, an insulating thin-film pattern 244A, and an upper insulating capping pattern 250A, which are stacked in the stated order on the upper conductive layer 234.

Figure 8I:
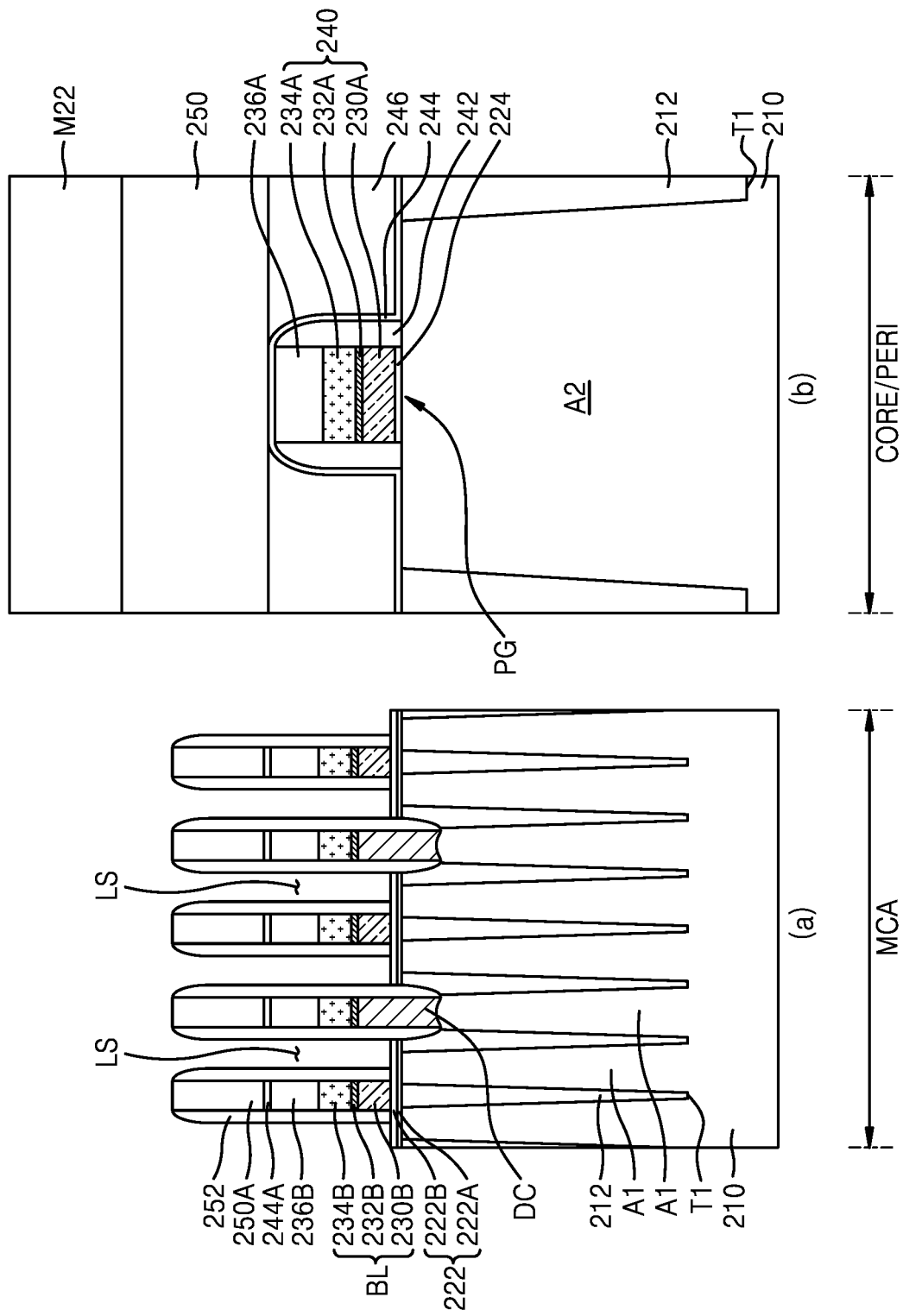

Referring to FIG. 8I, the upper conductive layer 234, the intermediate conductive layer 232, and the lower conductive layer 230 may be etched by using the lower insulating capping pattern 236B, the insulating thin-film pattern 244A, and the upper insulating capping pattern 250A in the cell array area MCA while the upper insulating capping layer 250 in the peripheral circuit area CORE/PERI is covered by the mask pattern M22, thereby forming a plurality of bit lines BL each including a lower conductive pattern 230B, an intermediate conductive pattern 232B, and an upper conductive pattern 234B.

Next, a plurality of insulating spacers 252 may be formed to cover both sidewalls of a bit line BL and both sidewalls of an insulating capping structure that includes the lower insulating capping pattern 236B, the insulating thin-film pattern 244A, and the upper insulating capping pattern 250A. The plurality of insulating spacers 252 may be formed to fill the direct contact hole DCH around the direct contact DC. After the plurality of insulating spacers 252 are formed, a line space LS may remain between the plurality of bit lines BL. The upper insulating capping pattern 250A may be reduced in height due to etching processes accompanied during the formation of the plurality of bit lines BL and the plurality of insulating spacers 252.

Figure 8J:
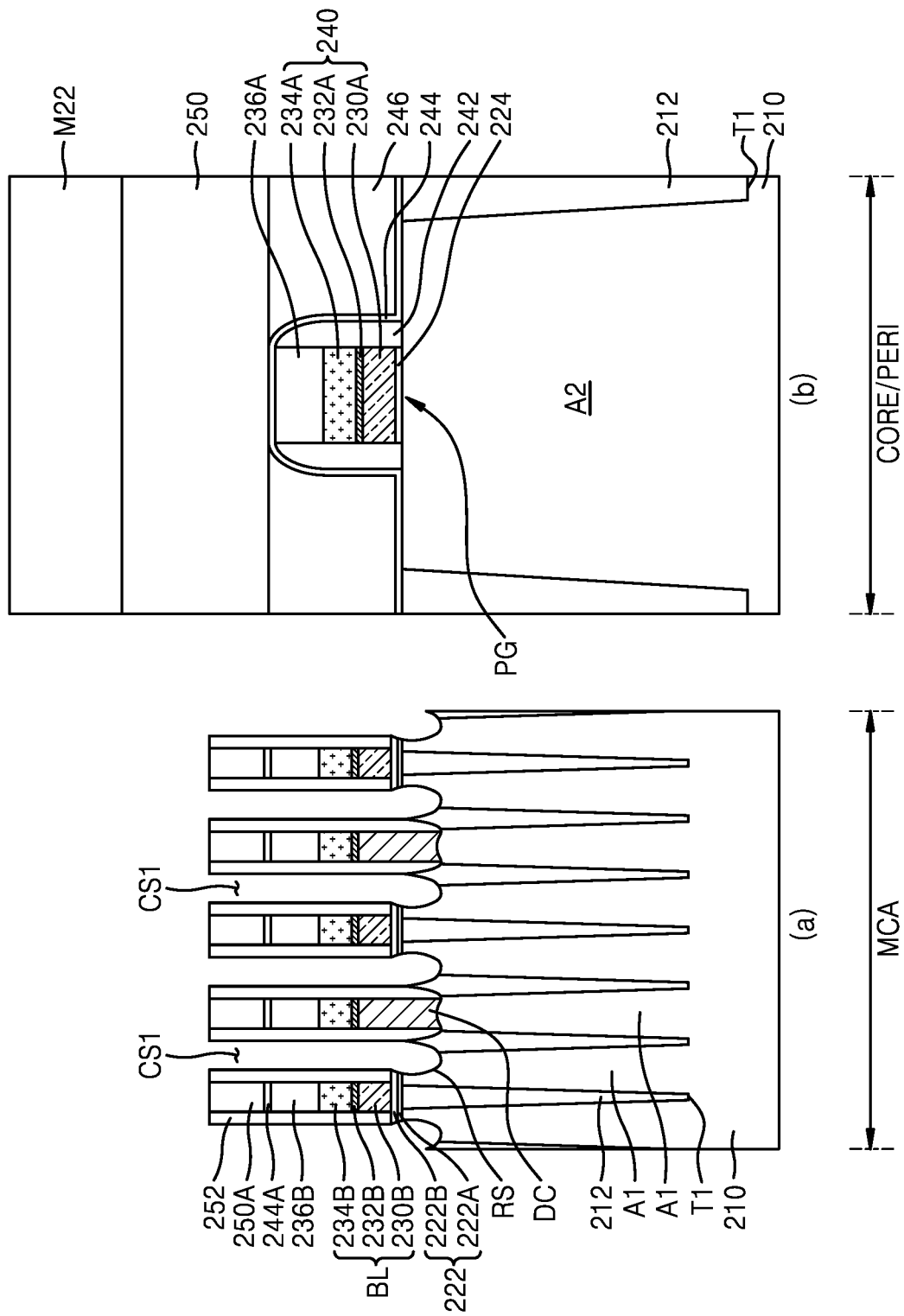

Referring to FIG. 8J, while the upper insulating capping layer 250 in the peripheral circuit area CORE/PERI is covered by the mask pattern M22, a plurality of insulating fences (not shown) may be formed between the plurality of bit lines BL in the cell array area MCA. As a result, one line space LS may be divided into a plurality of contact spaces CS1 having columnar shapes. A horizontal width of each of the plurality of contact spaces CS1 may be defined by the plurality of insulating spacers 252 and the plurality of insulating fences. As the upper insulating capping pattern 250A and an insulating spacer 252 are exposed to an etching atmosphere accompanied during the formation of the plurality of insulating fences, the upper insulating capping pattern 250A and the insulating spacer 252 may be consumed and thus reduced more in height.

Next, structures exposed by the plurality of contact spaces CS1 may be partially removed, thereby forming a plurality of recess spaces RS to expose the cell active area A1 of the substrate 210 between the plurality of bit lines BL.

Figure 8K:
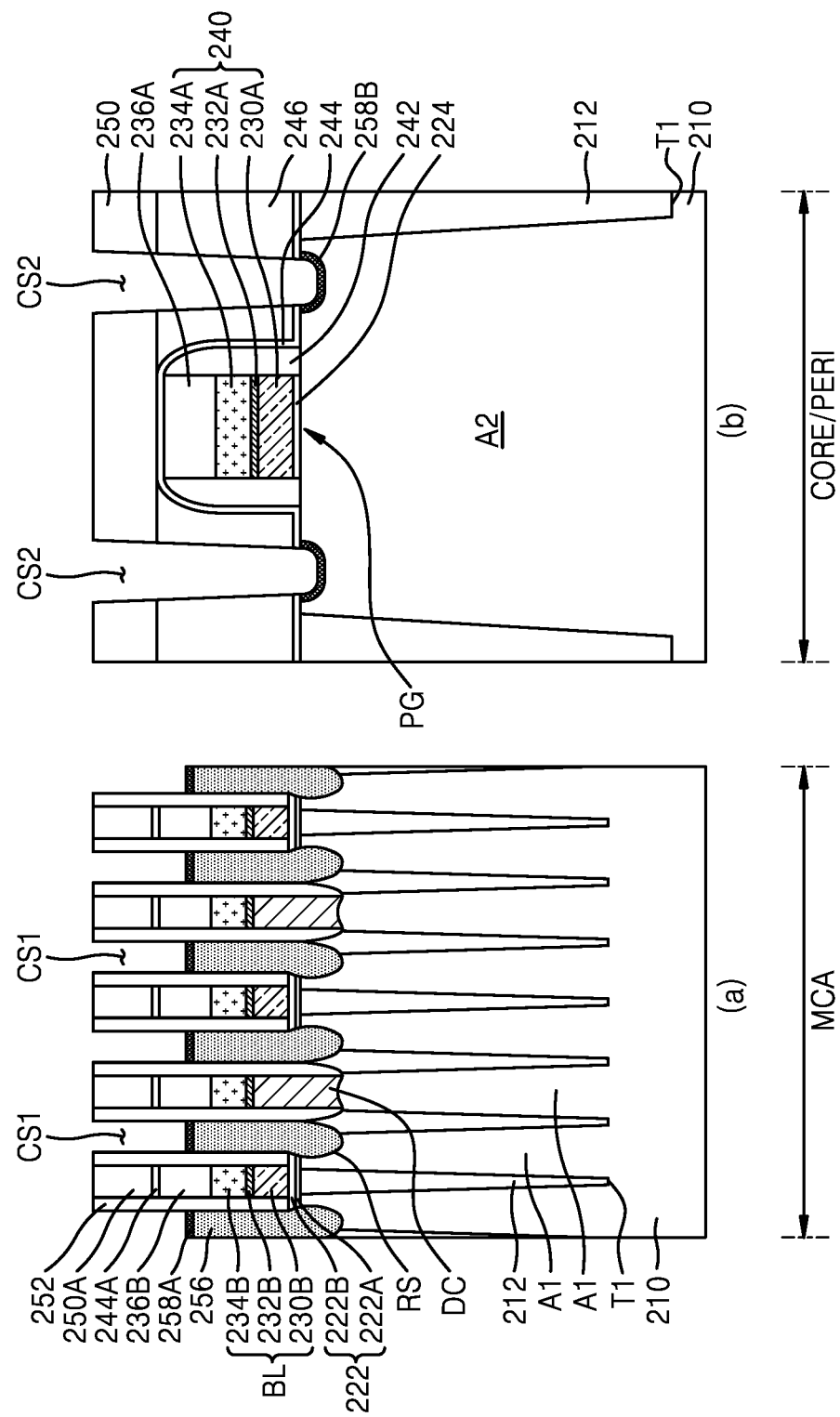
Figure 8L:
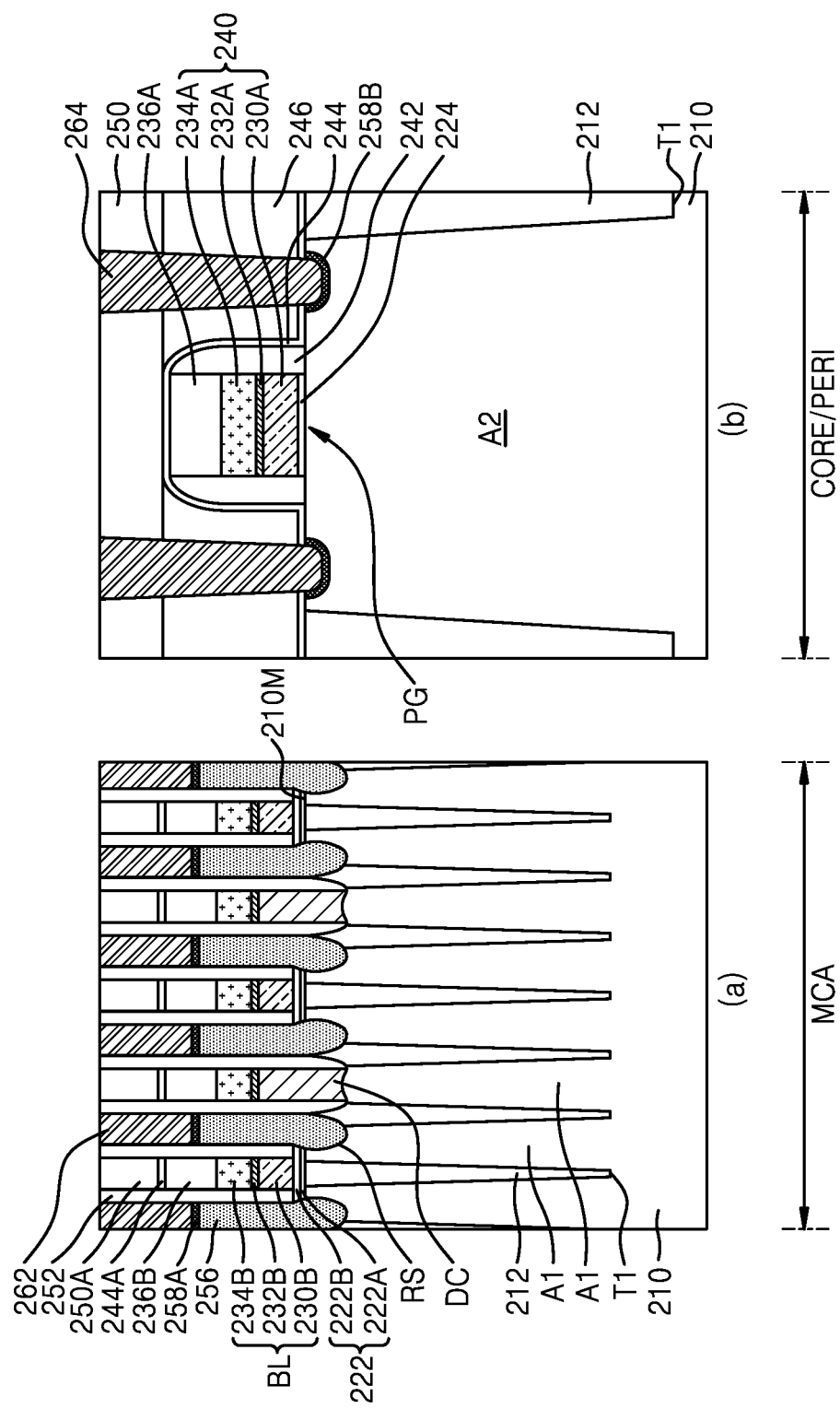

Referring to FIG. 8K, as in a resulting product of FIG. 8J, while the upper insulating capping layer 250 in the peripheral circuit area CORE/PERI is covered by the mask pattern M22, a plurality of lower contact plugs 256 may be formed to respectively fill the plurality of recess spaces RS between the plurality of bit lines BL and to fill a portion of each contact space CS1 between the plurality of bit lines BL. The plurality of lower contact plugs 256 may each include doped polysilicon.

Next, the upper insulating capping layer 250 may be exposed by removing the mask pattern M22 in the peripheral circuit area CORE/PERI, and then, the upper insulating capping layer 250, the interlayer dielectric 246, and the insulating thin-film 244 in the peripheral circuit area CORE/PERI may be etched while a mask pattern (not shown) covers the cell array area MCA, thereby forming a plurality of contact spaces CS2 to expose the peripheral active region A2 of the substrate 210.

After the mask pattern (not shown) having covered the cell array area MCA is removed, a metal silicide film 258A may be formed on each lower contact plug 256 exposed by the plurality of contact spaces CS1 in the cell array area MCA, and a metal silicide film 258B may be formed on a surface of the peripheral active region A2, which is exposed by the plurality of contact spaces CS2 in the peripheral circuit area CORE/PERI. The metal silicide films 258A and 258B may be formed simultaneously or by separate processes from each other. Each of the metal silicide films 258A and 258B may include, but is not limited to, cobalt silicide, nickel silicide, or manganese silicide. In some embodiments, a process of forming the metal silicide films 258A and 258B may be omitted.

Referring to FIG. 8L, a plurality of first contact plugs 262 may be formed to respectively fill the plurality of contact spaces CS1 remaining on the metal silicide film 258A in the cell array area MCA of a resulting product of FIG. 8K, and a plurality of second contact plugs 264 may be formed to respectively fill the plurality of contact spaces CS2 in the peripheral circuit area CORE/PERI of the resulting product of FIG. 8K. Herein, the plurality of first contact plugs 262 may be referred to as a plurality of contact plugs. In some embodiments, a process of forming the plurality of first contact plugs 262 and a process of forming the plurality of second contact plugs 264 may be simultaneously performed.

In the cell array area MCA, the bit line BL, the lower insulating capping pattern 236B, the insulating thin-film pattern 244A, the upper insulating capping pattern 250A, and a pair of insulating spacers 252 covering respective sidewalls thereof may constitute a bit line structure. In the cell array area MCA, each of the plurality of first contact plugs 262 may be arranged between a plurality of bit line structures on the substrate 210. In the peripheral circuit area CORE/PERI, each of the plurality of second contact plugs 264 may be configured to be electrically connected to the source/drain region formed in the substrate 210.

The plurality of first contact plugs 262 and the plurality of second contact plugs 264 may each include a metal, a conductive metal nitride, or a combination thereof. In some embodiments, the plurality of first contact plugs 262 and the plurality of second contact plugs 264 may each include TiN, W, or a combination thereof. In an example, the plurality of first contact plugs 262 and the plurality of second contact plugs 264 may each include only a TiN film. In another example, the plurality of first contact plugs 262 and the plurality of second contact plugs 264 may each include a stack structure of a TiN barrier film and a W film.

In the cell array area MCA, respective upper surfaces of the plurality of first contact plugs 262, a plurality of upper insulating capping patterns 250A, and the plurality of insulating spacers 252 may be planarized to extend on the same plane. In the peripheral circuit area CORE/PERI, respective upper surfaces of the upper insulating capping layer 250 and the plurality of second contact plugs 264 may be planarized to extend on the same plane. In some embodiments, after the plurality of first contact plugs 262 and the plurality of second contact plugs 264 are formed, respective uppermost surfaces of the plurality of first contact plugs 262, the plurality of second contact plugs 264, and the upper insulating capping pattern 250A and the insulating spacer 252 of each of the plurality of bit line structures may be at the same vertical level. As used herein, the term "vertical level" refers to a distance in a vertical direction from the main surface 210M of the substrate 210.

Figure 9A:
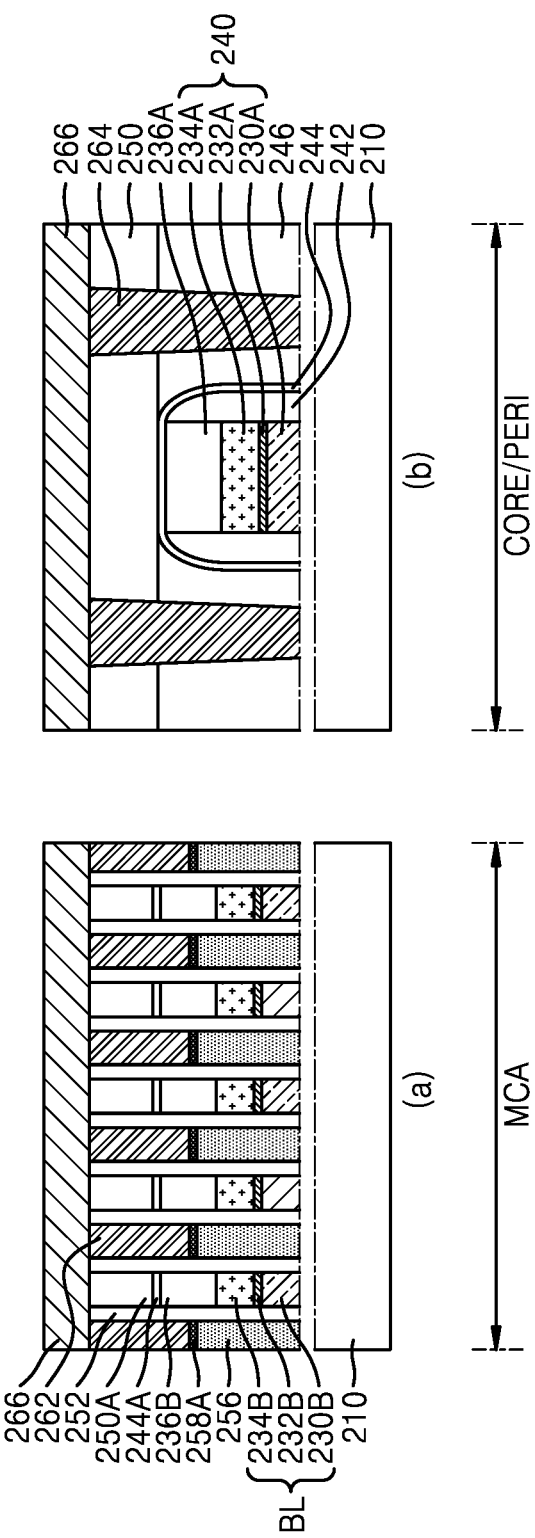

Referring to FIG. 9A, in a resulting product of FIG. 8L, a first conductive layer 266 may be formed in the cell array area MCA and the peripheral circuit area CORE/PERI. The first conductive layer 266 may be formed to cover the plurality of first contact plugs 262 in the cell array area MCA and to cover the plurality of second contact plugs 264 in the peripheral circuit area CORE/PERI.

The first conductive layer 266 may include a metal, a conductive metal nitride, or a combination thereof. In some embodiments, the first conductive layer 266 may include TiN, W, or a combination thereof. In an example, the first conductive layer 266 may include only a TiN film. In another example, the first conductive layer 266 may include a stack structure of a TiN barrier film and a W film.

Figure 9B:
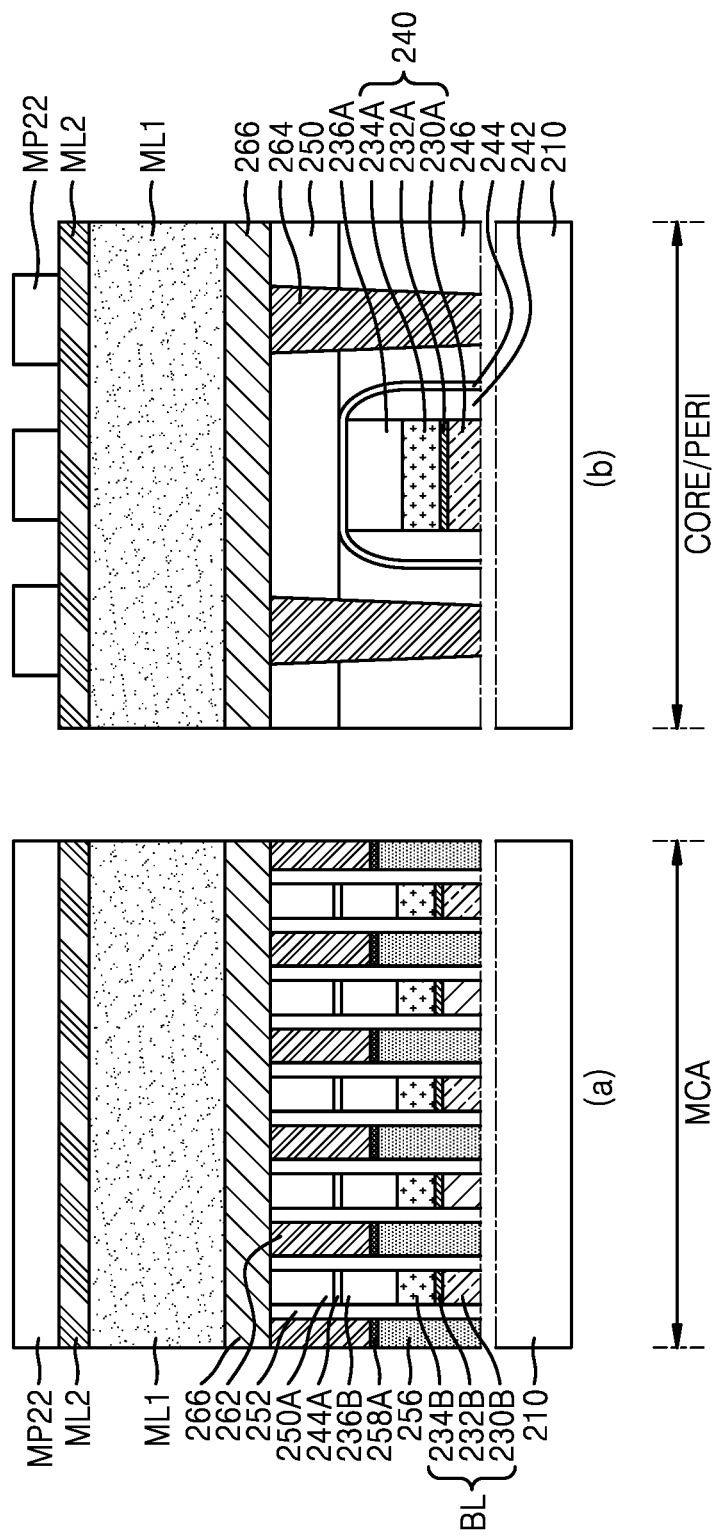

Referring to FIG. 9B, in the cell array area MCA and the peripheral circuit area CORE/PERI, a first hardmask layer ML1 and a second hardmask layer ML2 may be formed to cover the first conductive layer 266 in the stated order, and a photoresist pattern MP22 may be formed to cover the second hardmask layer ML2.

The first hardmask layer ML1 and the second hardmask layer ML2 may include different materials from each other. In some embodiments, the first hardmask layer ML1 may include an amorphous carbon layer (ACL), and the second hardmask layer ML2 may include a polysilicon film, but the inventive concept is not limited thereto. The photoresist pattern MP22 may be obtained from a resist film for EUV light (13.5 nm), a resist film for a KrF excimer laser (248 nm), a resist film for an ArF excimer laser (193 nm), or a resist film for an $F_2$ excimer laser (157 nm).

In some embodiments, the photoresist pattern MP22 may be obtained from a resist film for EUV light. For example, while the resist film for EUV light in the cell array area MCA and the peripheral circuit area CORE/PERI is exposed, the resist film for EUV light only in the peripheral circuit area CORE/PERI out of the cell array area MCA and the peripheral circuit area CORE/PERI may be exposed to light of an EUV light source, and the photoresist pattern MP22 may be formed by developing the light-exposed resist film for EUV light.

Figure 9C:
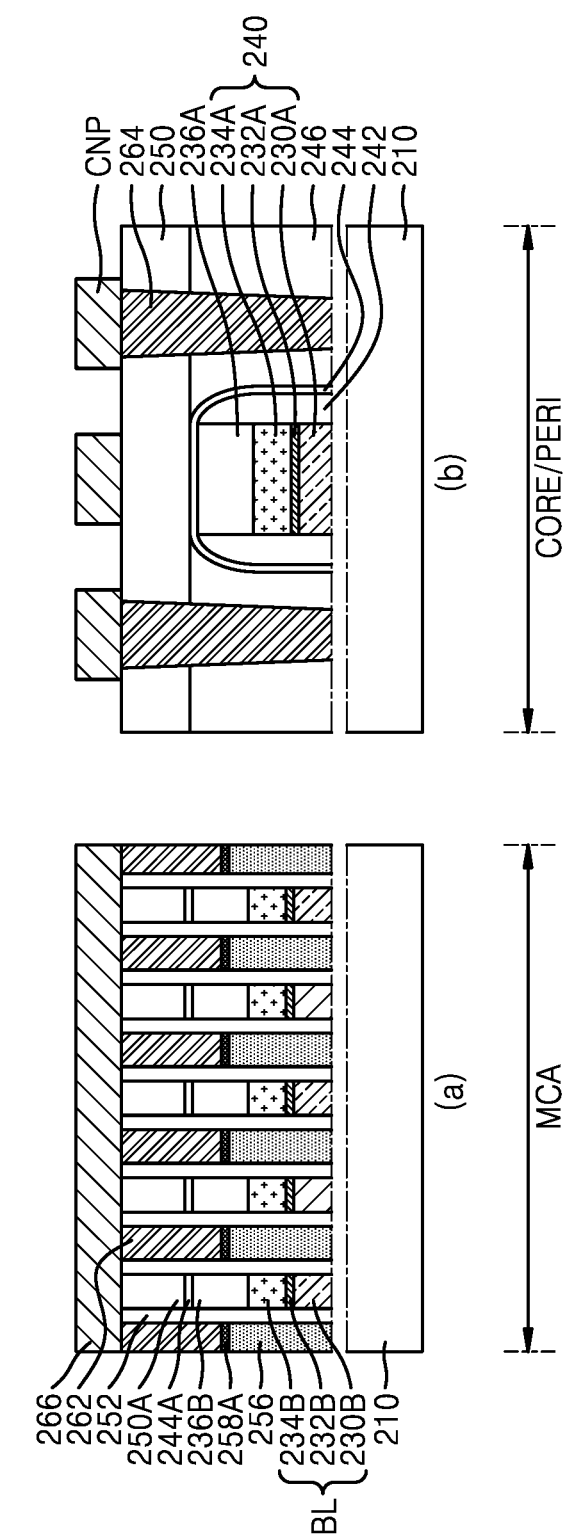

Referring to FIG. 9C, in a resulting product of FIG. 9B, the second hardmask layer ML2 and the first hardmask layer ML1 may be etched in the stated order by using the photoresist pattern MP22 as an etch mask, and the first conductive layer 266 may be patterned by using a resulting product obtained by the etching as an etch mask, thereby forming a plurality of peripheral circuit wiring patterns CNP in the peripheral circuit area CORE/PERI. Some of the peripheral circuit wiring patterns CNP may be connected to the plurality of second contact plugs 264. After the plurality of peripheral circuit wiring patterns CNP are formed, unnecessary films may be removed to expose an upper surface of each of the first conductive layer 266 in the cell array area MCA and the plurality of peripheral circuit wiring patterns CNP in the peripheral circuit area CORE/PERI.

Figure 9D:
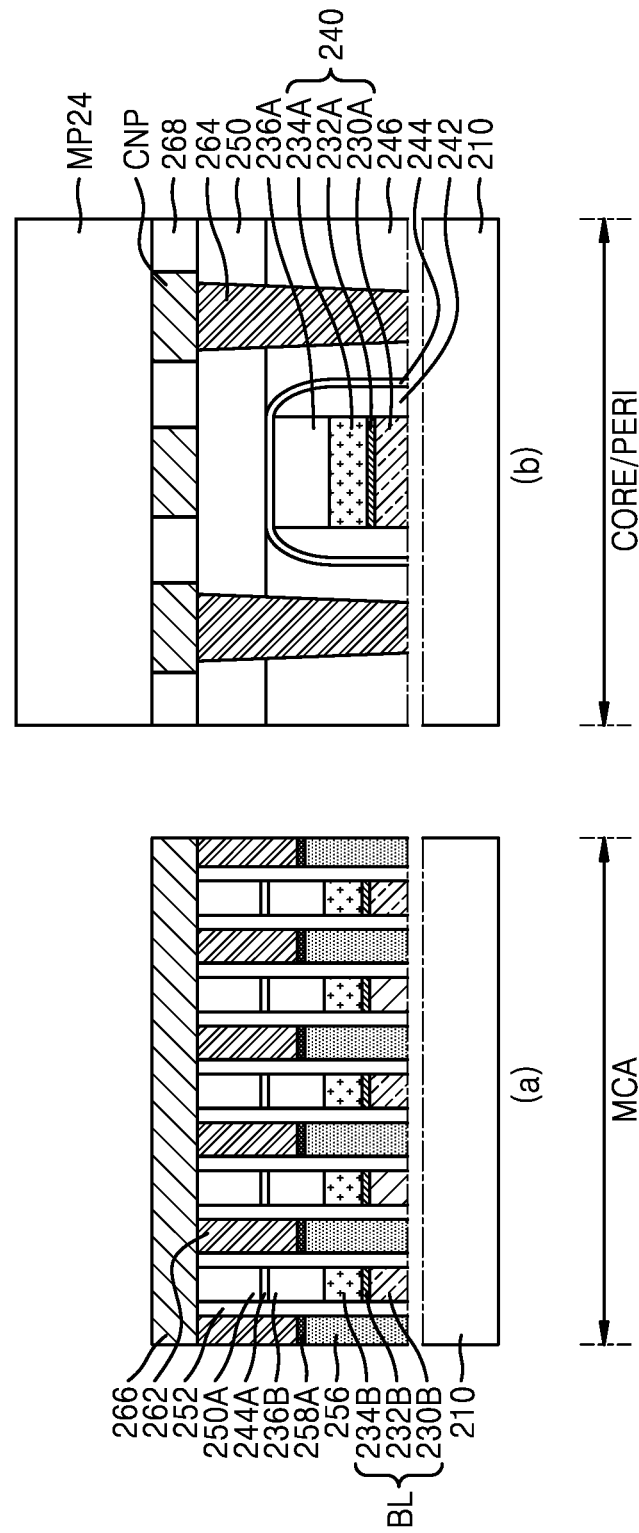

Referring to FIG. 9D, an insulating pattern 268 may be formed to fill each space between the plurality of peripheral circuit wiring patterns CNP in the peripheral circuit area CORE/PERI, and a photoresist pattern MP24 may be formed to cover the plurality of peripheral circuit wiring patterns CNP and the insulating pattern 268. The photoresist pattern MP24 may be obtained from a resist film for a KrF excimer laser (248 nm), a resist film for an ArF excimer laser (193 nm), or a resist film for an $F_2$ excimer laser (157 nm). After the photoresist pattern MP24 is formed, the first conductive layer 266 may be exposed in the cell array area MCA.

Referring to FIG. 9E, in a resulting product of FIG. 9D, the first conductive layer 266 exposed in the cell array area MCA may be removed, thereby exposing respective upper surfaces of the plurality of first contact plugs 262 and the plurality of upper insulating capping patterns 250A. Next, a plurality of first recess contact plugs 262R may be respectively formed from the plurality of first contact plugs 262 by partially removing each of the plurality of first contact plugs 262. As a result, a recess space URS may be formed on each first recess contact plug 262R between the plurality of upper insulating capping patterns 250A of the plurality of bit line structures. After the plurality of first recess contact plugs 262R are formed, a vertical level of an uppermost surface of each of the plurality of first recess contact plugs 262R may be farther from the substrate 210 than a vertical level of an uppermost surface of each of the plurality of bit lines BL. Herein, each of the plurality of first recess contact plugs 262R may be referred to as a recess contact plug.

After the plurality of first recess contact plugs 262R and a plurality of recess spaces URS are formed in the cell array area MCA, the photoresist pattern MP24 (see FIG. 9D) in the peripheral circuit area CORE/PERI may be removed, thereby exposing respective upper surfaces of the insulating pattern 268 and the plurality of peripheral circuit wiring patterns CNP.

Figure 9F:
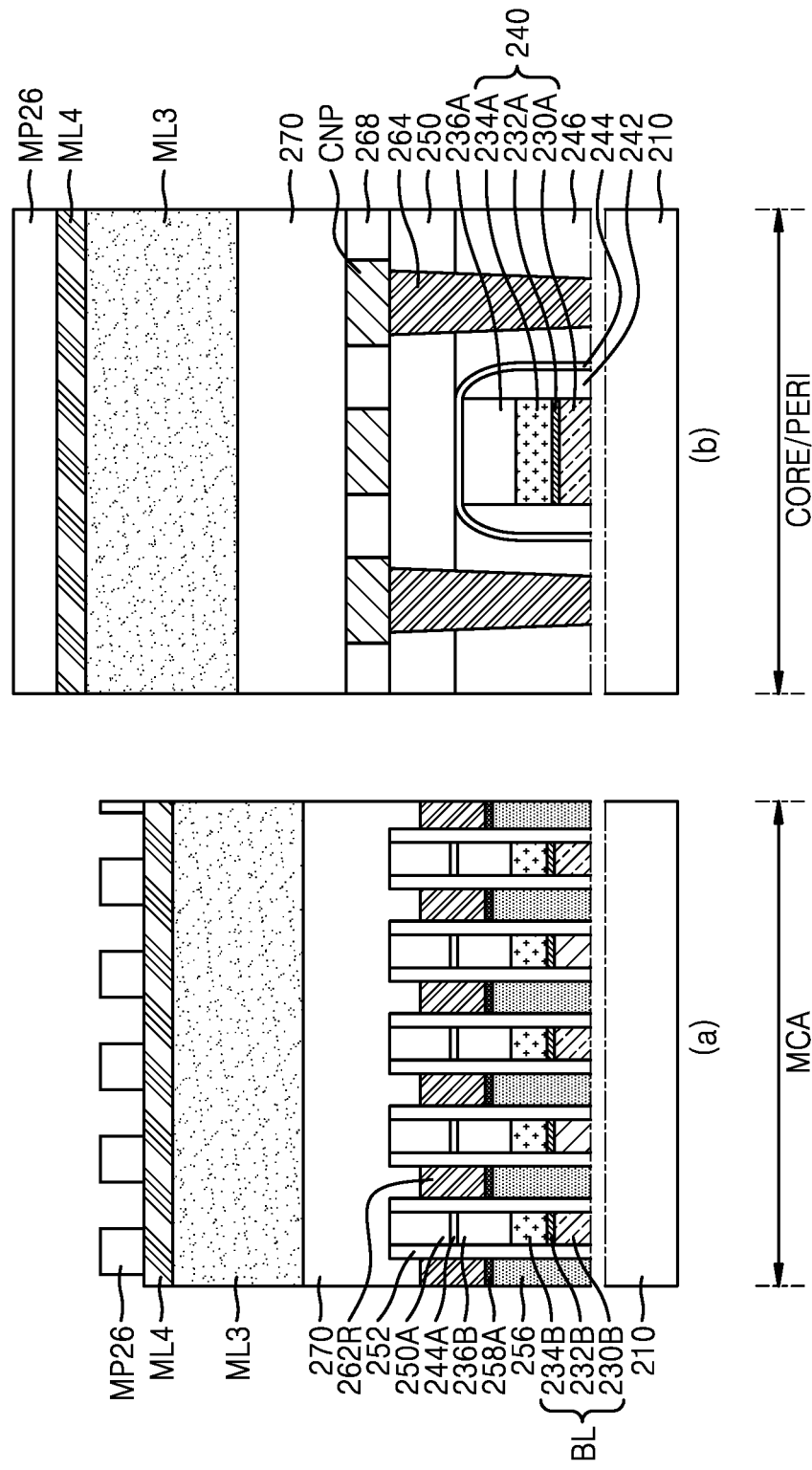

Referring to FIG. 9F, in the cell array area MCA and the peripheral circuit area CORE/PERI, an insulating film 270 may be formed to cover a resulting product of FIG. 9E, followed by forming a third hardmask layer ML3 and a fourth hardmask layer ML4, which include different materials from each other, stacked on the insulating film 270, and then, a photoresist pattern MP26 may be formed on the fourth hardmask layer ML4.

In some embodiments, the insulating film 270 may include, but is not limited to, a silicon nitride film. The third hardmask layer ML3 may include a spin-on-hardmask (SOH) film, and the fourth hardmask layer ML4 may include an SiON film, but the inventive concept is not limited thereto. The SOH film may include a film including a hydrocarbon compound or a derivative thereof, in which carbon is present in a relatively high amount of about 85% by weight (wt %) to about 99 wt %.

The photoresist pattern MP26 may be obtained from a resist film for EUV light (13.5 nm), a resist film for a KrF excimer laser (248 nm), a resist film for an ArF excimer laser (193 nm), or a resist film for an $F_2$ excimer laser (157 nm). In some embodiments, the photoresist pattern MP26 may be obtained from a resist film for EUV light. The photoresist pattern MP26 may be formed by a similar process to the process of forming the photoresist pattern MP22, which is described with reference to FIG. 9B. However, while the resist film for EUV light in the cell array area MCA and the peripheral circuit area CORE/PERI is exposed, the resist film for EUV light only in the cell array area MCA out of the cell array area MCA and the peripheral circuit area CORE/PERI may be exposed to light of an EUV light source, and the light-exposed resist film for EUV light may be developed, thereby forming the photoresist pattern MP26.

Figure 9G:
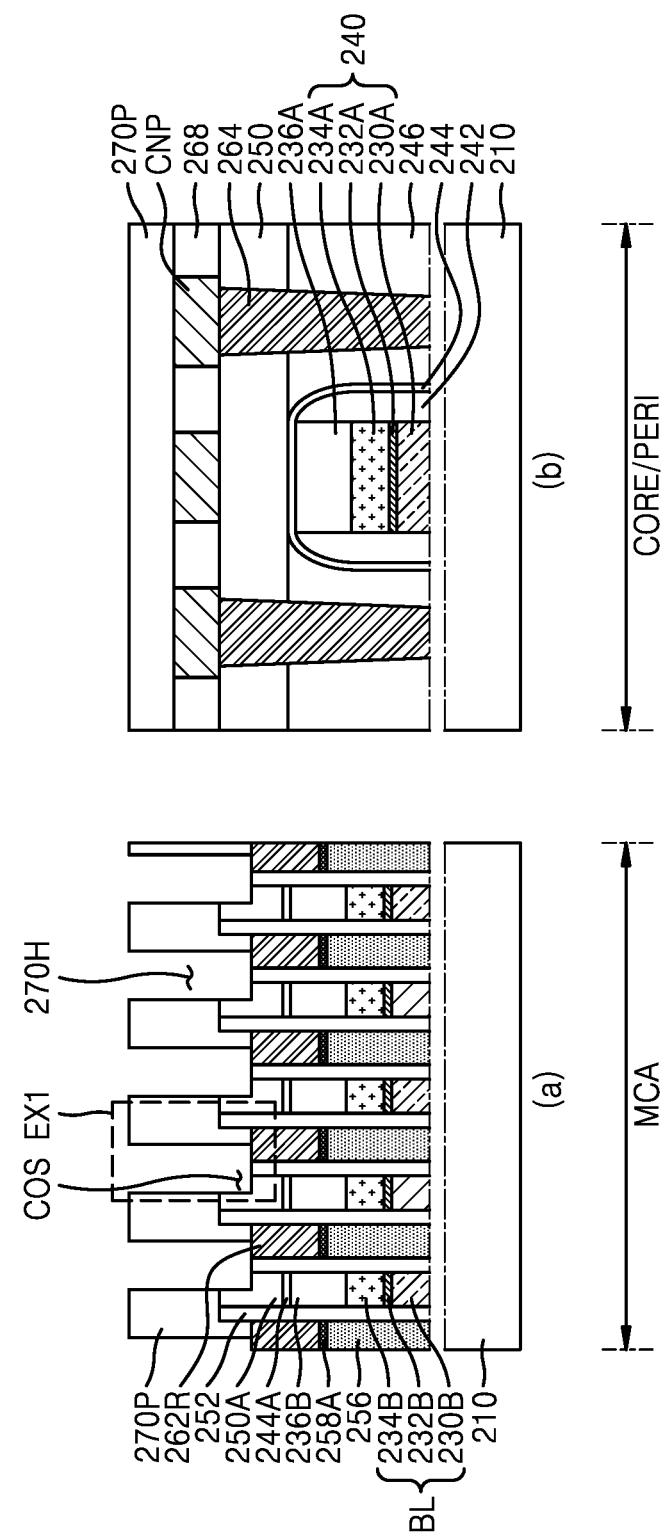

Referring to FIG. 9G, in a resulting product of FIG. 9F, the fourth hardmask layer ML4 and the third hardmask layer ML3 may be etched in the stated order by using the photoresist pattern MP26 as an etch mask, and the insulating film 270 may be patterned by using a resulting product obtained by the etching as an etch mask, thereby forming an engraved insulating pattern 270P. Next, an upper surface of the engraved insulating pattern 270P may be exposed by removing unnecessary films on the engraved insulating pattern 270P.

The engraved insulating pattern 270P may be arranged on the plurality of bit line structures and the plurality of first recess contact plugs 262R in the cell array area MCA and may have a plurality of openings 270H that are arranged to be respectively shifted in a horizontal direction from the plurality of first recess contact plugs 262R. The engraved insulating pattern 270P may include a portion covering the plurality of peripheral circuit wiring patterns CNP in the peripheral circuit area CORE/PERI not to expose the plurality of peripheral circuit wiring patterns CNP.

Figure 10A:
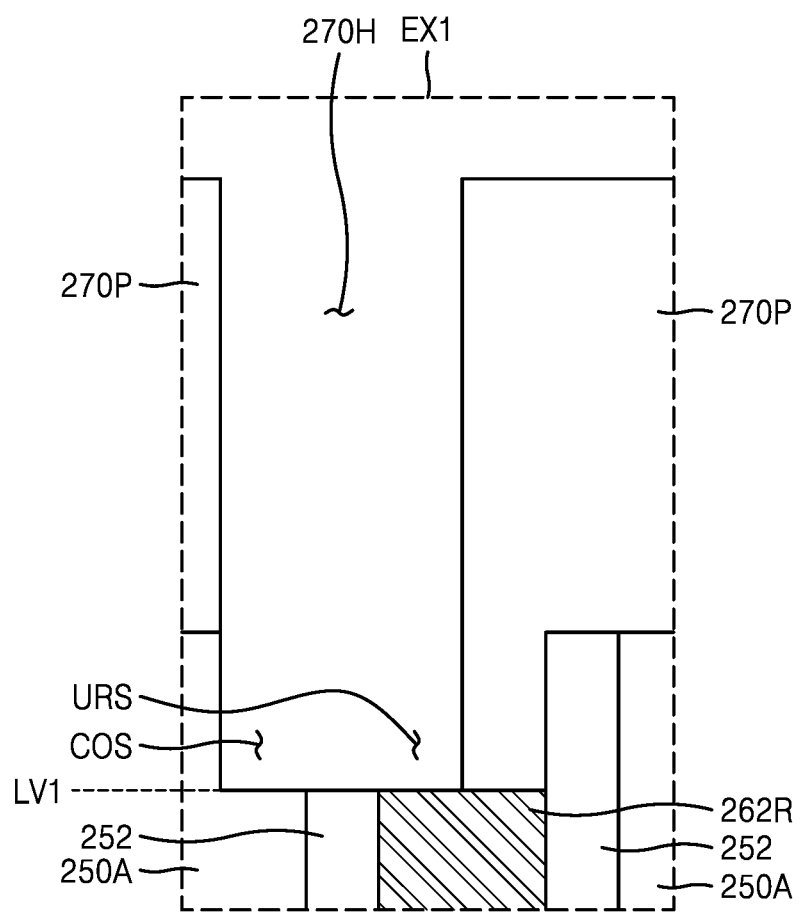
FIG. 10A is an enlarged cross-sectional view of a region EX1 of FIG. 9G.

FIG. 10A is an enlarged cross-sectional view of the region EX1 of FIG. 9G.

Referring to FIGS. 9G and 10A, the engraved insulating pattern 270P may be formed to fill a portion of each of the plurality of recess spaces URS and to cover a portion of each of the plurality of first recess contact plugs 262R and a portion of each of the upper insulating capping pattern 250A and the insulating spacer 252, which are included in each of the plurality of bit line structures. Respective portions of the plurality of upper insulating capping patterns 250A and the plurality of insulating spacers 252 and another portion of each of the plurality of first recess contact plugs 262R may be exposed by the plurality of openings 270H of the engraved insulating pattern 270P.

Next, in the cell array area MCA, an upper corner portion of each of the plurality of upper insulating capping patterns 250A and a portion of each of the plurality of insulating spacers 252 may be removed through the plurality of openings 270H of the engraved insulating pattern 270P, thereby forming a plurality of cut-off spaces COS. Each of the plurality of cut-off spaces COS may be formed to overlap the bit line BL in the vertical direction (Z direction). The plurality of cut-off spaces COS may be respectively connected to the plurality of openings 270H and the plurality of recess spaces URS (see FIGS. 9E and 10A).

In some embodiments, after the plurality of cut-off spaces COS are formed, a bottom surface of each of the plurality of cut-off spaces COS, and respective upper surfaces of portions of the plurality of first recess contact plugs 262R, which are exposed by the plurality of openings 270H, may be at the same vertical level LV1 or similar vertical levels to each other. In the plurality of cut-off spaces COS, a sidewall of each of the plurality of first recess contact plugs 262R, in particular, the sidewall thereof facing the upper insulating capping pattern 250A, may not be exposed.

Figure 9H:
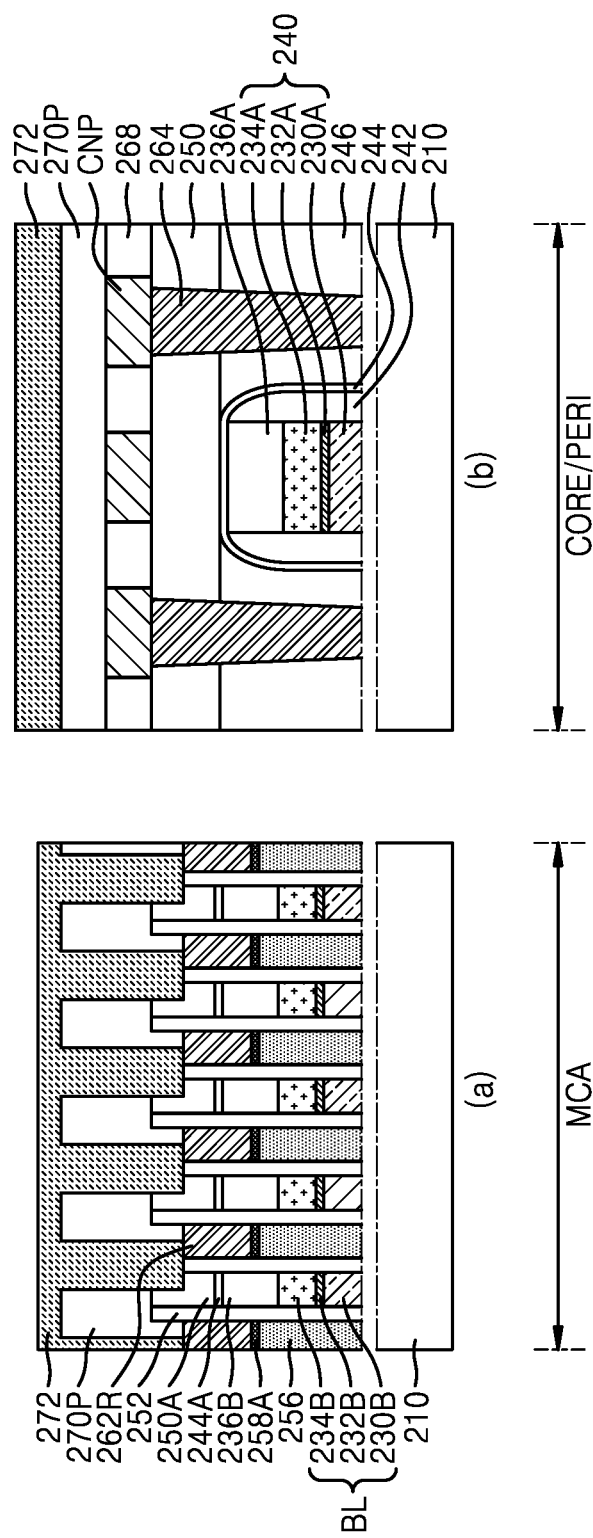

Referring to FIG. 9H, a second conductive layer 272 may be formed on a resulting product of FIG. 9G. The second conductive layer 272 may be formed to fill the plurality of recess spaces URS (see FIGS. 9E and 10A) and the plurality of cut-off spaces COS (see FIGS. 9G and 10A) and to contact an upper surface of each of the plurality of first recess contact plugs 262R, in the cell array area MCA.

The second conductive layer 272 may include a metal, a conductive metal nitride, or a combination thereof. In some embodiments, the second conductive layer 272 may include TiN, W, or a combination thereof. In an example, the second conductive layer 272 may include only a TiN film. In another example, the second conductive layer 272 may include a stack structure of a TiN barrier film and a W film.

Figure 9I:
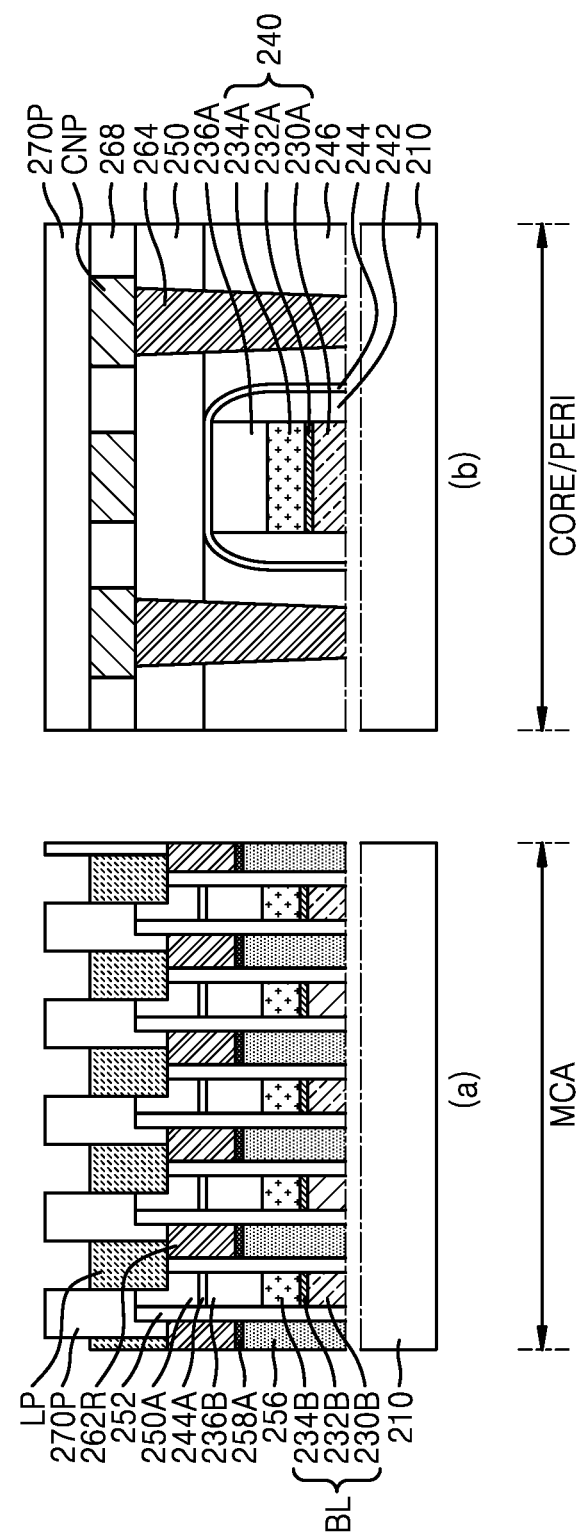

Referring to FIG. 9I, in a resulting product of FIG. 9H, the second conductive layer 272 may be etched back, thereby forming a plurality of conductive landing pads LP in the cell array area MCA and exposing an upper surface of the engraved insulating pattern 270P in the peripheral circuit area CORE/PERI.

The plurality of conductive landing pads LP in the cell array area MCA may respectively fill the plurality of recess spaces URS (see FIGS. 9E and 10A) and the plurality of cut-off spaces COS (see FIGS. 9G and 10A) and may respectively contact at least a portion of upper surfaces of the plurality of first recess contact plugs 262R. An upper surface of each of the plurality of conductive landing pads LP may be lower than the upper surface of the engraved insulating pattern 270P. That is, the upper surface of each of the plurality of conductive landing pads LP may be closer to the substrate 210 than the upper surface of the engraved insulating pattern 270P is. Therefore, after the plurality of conductive landing pads LP are formed, a portion of the engraved insulating pattern 270P may protrude upward from each of the plurality of conductive landing pads LP.

Figure 9J:
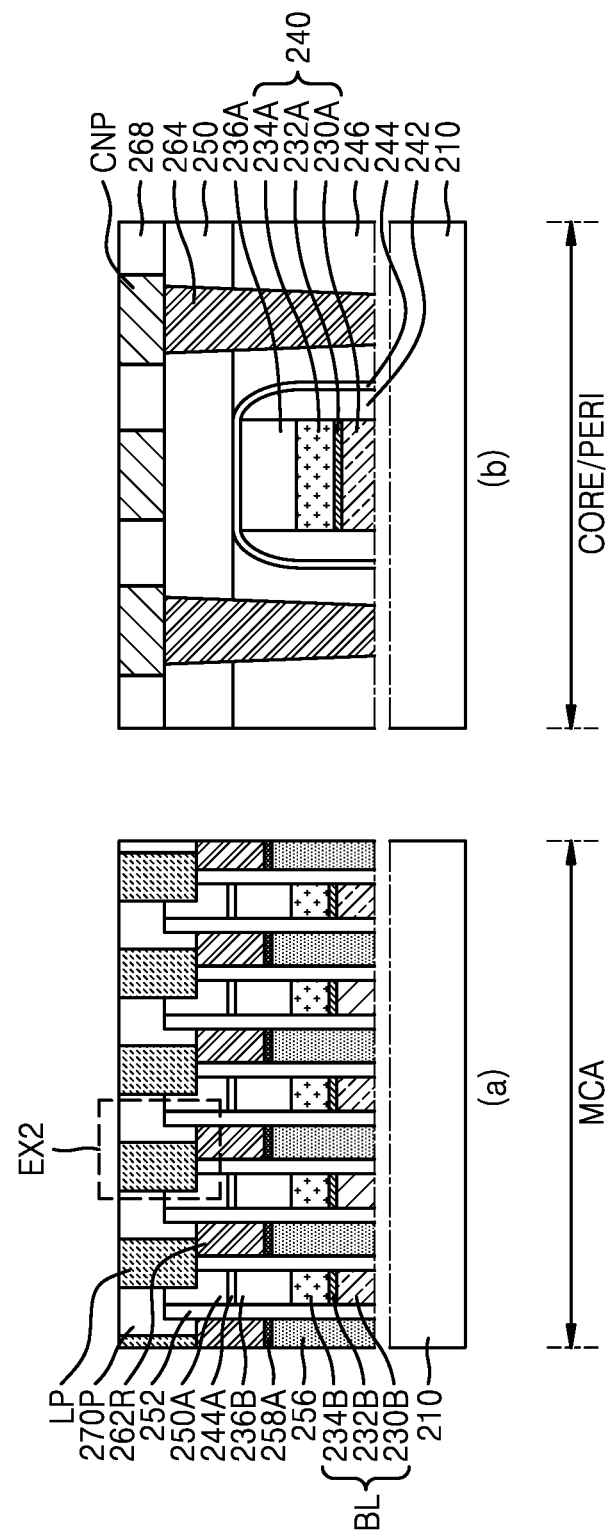

Referring to FIG. 9J, the engraved insulating pattern 270P in the cell array area MCA and the peripheral circuit area CORE/PERI may be partially removed (e.g., by chemical-mechanical polishing (CMP) or another planarization process), whereby an uppermost surface of the engraved insulating pattern 270P and an uppermost surface of each of the plurality of conductive landing pads LP in the cell array area MCA may be at the same vertical level (i.e., coplanar), and an upper surface of each of the insulating pattern 268 and the plurality of peripheral circuit wiring patterns CNP in the peripheral circuit area CORE/PERI may be exposed.

Figure 10B:
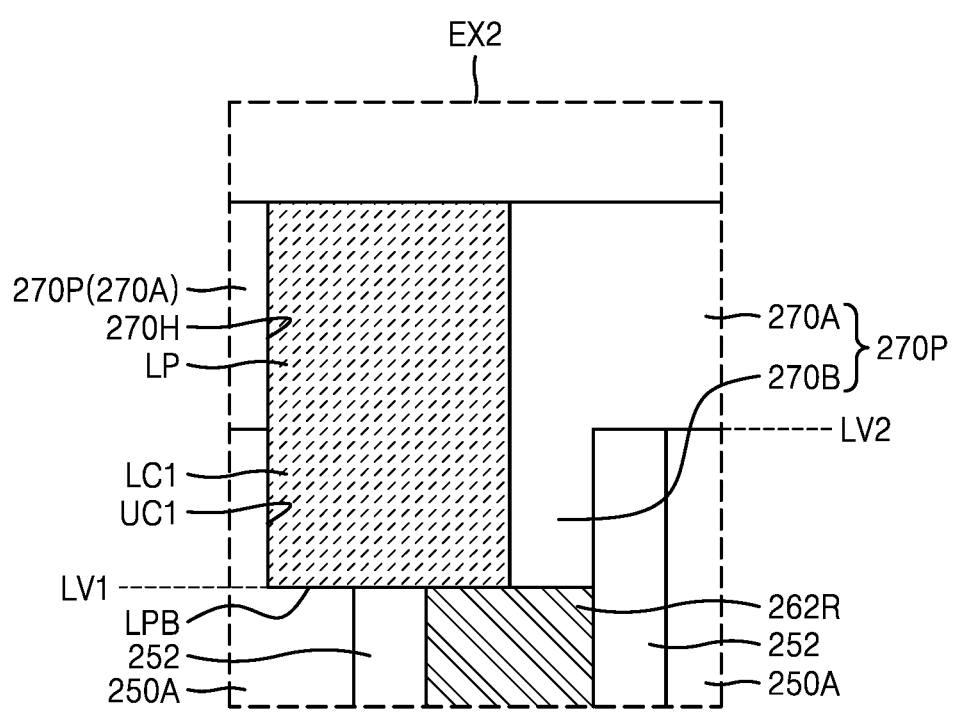
FIG. 10B is an enlarged cross-sectional view of a region EX2 of FIG. 9J.

FIG. 10B is an enlarged cross-sectional view of the region EX2 of FIG. 9J.

Referring to FIGS. 9J and 10B, the lower surface of each of the plurality of conductive landing pads LP and the upper surface of each of the plurality of first recess contact plugs 262R may be at the same vertical level LV1 or similar vertical levels to each other.

The plurality of conductive landing pads LP may have a plurality of island pattern shapes in a plan view, as shown in FIG. 3. The plurality of conductive landing pads LP may be formed to vertically overlap a portion of each of the plurality of bit lines BL.

In some embodiments, each of the plurality of first recess contact plugs 262R and each of the plurality of conductive landing pads LP may include the same material. In some embodiments, each of the plurality of first recess contact plugs 262R and each of the plurality of conductive landing pads LP may include different materials from each other. In an example, at least some of the first recess contact plugs 262R and the plurality of conductive landing pads LP may each include only a TiN film. In another example, at least some of the first recess contact plugs 262R and the plurality of conductive landing pads LP may each include a stack structure of a TiN barrier film and a W film.

In some embodiments, each of the plurality of first recess contact plugs 262R and each of the plurality of conductive landing pads LP may include the same metal. In some embodiments, each of the plurality of first recess contact plugs 262R and each of the plurality of conductive landing pads LP may include different metals from each other. In an example, the plurality of first recess contact plugs 262R and the plurality of conductive landing pads LP may each include a TiN film. In another example, the plurality of first recess contact plugs 262R and the plurality of conductive landing pads LP may each include a stack structure of a TiN barrier film and a W film. In yet another example, each of the plurality of first recess contact plugs 262R may include only a TiN film, and each of the plurality of conductive landing pads LP may include a stack structure of a TiN barrier film and a W film. In yet another example, each of the plurality of first recess contact plugs 262R may include a stack structure of a TiN barrier film and a W film, and each of the plurality of conductive landing pads LP may include only a TiN film.

As shown in FIG. 10B, the upper insulating capping pattern 250A may have an upper cutout portion UC1 that is apart from the bit line BL in the vertical direction (Z direction). The upper cutout portion UC1 of the upper insulating capping pattern 250A may be a result obtained by removing only one of both upper corner portions of the upper insulating capping pattern 250A. An upper surface of the insulating spacer 252, which is adjacent to the upper cutout portion UC1 of the upper insulating capping pattern 250A, may extend on the same plane as a portion of a surface constituting the upper cutout portion UC1 of the upper insulating capping pattern 250A.

The engraved insulating pattern 270P may include a first portion 270A, which is in contact with an upper surface of a region of the upper insulating capping pattern 250A except for the upper cutout portion UC1, and a second portion 270B covering a portion of an upper surface of the first recess contact plug 262R. In the engraved insulating pattern 270P, the vertical level LV1 of a lowermost surface of the second portion 270B may be closer to the substrate 210 than a vertical level LV2 of a lowermost surface of the first portion 270A.

Each of the plurality of conductive landing pads LP may include a lower corner portion LC1 that fills an opening 270H of the engraved insulating pattern 270P and is in contact with the upper cutout portion UC1 of the upper insulating capping pattern 250A. In addition, each of the plurality of conductive landing pads LP may have a surface contacting a portion of the upper surface of the first recess contact plug 262R.

The vertical level LV1 of a lowermost surface of each of the plurality of conductive landing pads LP may be closer to the substrate 210 than a vertical level of an uppermost surface of each of the plurality of bit line structures, that is, an uppermost surface of the upper insulating capping pattern 250A.

As shown in FIG. 10B, in a region adjacent to an interface between the engraved insulating pattern 270P and the upper insulating capping pattern 250A, the upper cutout portion UC1 of the upper insulating capping pattern 250A and a sidewall of the first portion 270A of the engraved insulating pattern 270P may extend along a gentle line having no bends. For example, in the region adjacent to the interface between the engraved insulating pattern 270P and the upper insulating capping pattern 250A, the upper cutout UC1 of the upper insulating capping pattern 250A and the sidewall of the first portion 270A of the engraved insulating pattern 270P may extend on a straight line. Each of the plurality of conductive landing pads LP may be in contact with the upper cutout UC1 of the upper insulating capping pattern 250A and the sidewall of the first portion 270A of the engraved insulating pattern 270P, in the region adjacent to the interface between the engraved insulating pattern 270P and the upper insulating capping pattern 250A.

The lower corner portion LC1 of each of the plurality of conductive landing pads LP may have a convex shape toward the upper cutout portion UC1 of the upper insulating capping pattern 250A, and the upper cutout portion UC1 of the upper insulating capping pattern 250A may have a concave shape toward the lower corner portion LC1 in correspondence with the shape of the lower corner portion LC1.

Each of the plurality of conductive landing pads LP may cover the upper cutout portion UC1 of the upper insulating capping pattern 250A to partially overlap the bit line BL in the vertical direction (Z direction). The plurality of conductive landing pads LP may be electrically insulated from each other by the engraved insulating pattern 270P. In the cell array area MCA, a capacitor lower electrode may be formed on the plurality of conductive landing pads LP.

In the methods of manufacturing an integrated circuit device, shown in FIGS. 5 and 6, process P110 of FIG. 5 and process P112 of FIG. 6 may correspond to the processes described with reference to FIGS. 8B to 8L. Process P114 of FIG. 6 may correspond to the processes described with reference to FIGS. 9A to 9C. Process P120 of FIGS. 5 and 6 may correspond to the processes described with reference to FIG. 9E. Processes P130 and P140 of FIGS. 5 and 6 may correspond to the processes described with reference to FIGS. 9F and 9G. Process P150 of FIGS. 5 and 6 may correspond to the processes described with reference to FIGS. 9H to 9J.

Figure 11A:
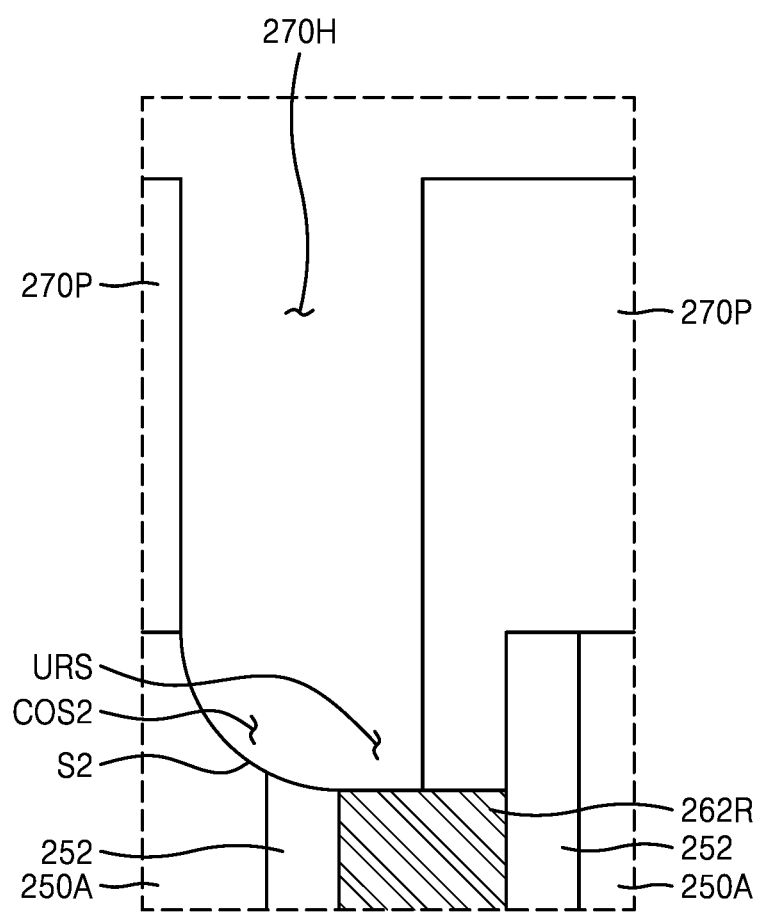
FIGS. 11A and 11B are cross-sectional views respectively illustrating a sequence of intermediate processes of an exemplary method of manufacturing an integrated circuit device, according to some embodiments.
Figure 11B:
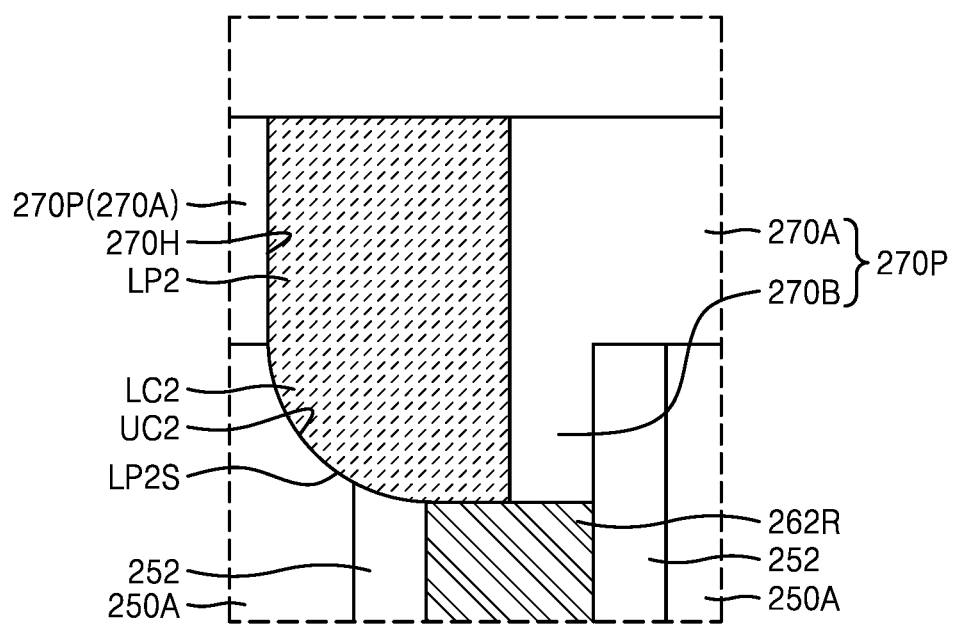

FIGS. 11A and 11B are cross-sectional views respectively illustrating a sequence intermediate of processes of an exemplary method of manufacturing an integrated circuit device, according to some embodiments. In particular, FIG. 11A is an enlarged cross-sectional view of a portion corresponding to the region EX1 of FIG. 9G, and FIG. 11B is an enlarged cross-sectional view of a portion corresponding to the region EX2 of FIG. 9J. In FIGS. 11A and 11B, the same reference numerals as in FIGS. 8A to 10B respectively denote the same members, and here, repeated descriptions thereof are omitted. The method of manufacturing an integrated circuit device, which is described with reference to FIGS. 11A and 11B, is substantially similar to the methods of manufacturing an integrated circuit device, which are described with reference to FIGS. 8A to 9J, and the following description is made with the focus on differences therebetween.

Referring to FIG. 11A, the same processes as described with reference to FIGS. 8A to 9G may be performed. However, in the present example, a cut-off space COS2 may be formed instead of the cut-off space COS. The cut-off space COS2 may be formed by removing an upper corner portion of the upper insulating capping pattern 250A and a portion of each of the plurality of insulating spacers 252 through the opening 270H of the engraved insulating pattern 270P. After the cut-off space COS2 is formed, the upper insulating capping pattern 250A may have a round cutout surface S2 that defines at least a portion of the cut-off space COS2.

Referring to FIG. 11B, the same processes as described with reference to FIGS. 9H to 9J may be performed on a resulting product of FIG. 11A. As a result, in the cell array area MCA, a conductive landing pad LP2 may be formed to fill the recess space URS (see FIG. 11A) and the cut-off space COS2 (see FIG. 11A) and to be in contact with at least a portion of an upper surface of each first recess contact plug 262R.

The conductive landing pad LP2 may have substantially the same configuration as the conductive landing pad LP described with reference to FIGS. 9J and 10B. However, the conductive landing pad LP2 may have a round surface LP2S contacting each of the upper insulating capping pattern 250A and the insulating spacer 252.

The upper insulating capping pattern 250A may have an upper round cutout portion UC2 that is apart from the bit line BL in the vertical direction. The upper round cutout portion UC2 of the upper insulating capping pattern 250A may be obtained by partially removing only one of both upper corner portions of the upper insulating capping pattern 250A.

The conductive landing pad LP2 may include a lower round corner portion LC2 that fills the opening 270H of the engraved insulating pattern 270P and is in contact with the upper round cutout portion UC2 of the upper insulating capping pattern 250A. The lower round corner portion LC2 of the conductive landing pad LP2 may have a round shape that is convex toward the upper round cutout portion UC2 of the upper insulating capping pattern 250A, and the upper round cutout portion UC2 of the upper insulating capping pattern 250A may have a round shape that is concave toward the lower round corner portion LC2 in correspondence with the shape of the lower round corner portion LC2 of the conductive landing pad LP2.

In the region adjacent to the interface between the engraved insulating pattern 270P and the upper insulating capping pattern 250A, the upper round cutout portion UC2 of the upper insulating capping pattern 250A and the sidewall of the first portion 270A of the engraved insulating pattern 270P may extend along a gentle line. Each conductive landing pad LP2 may be in contact with the upper round cutout portion UC2 of the upper insulating capping pattern 250A and the sidewall of the first portion 270A of the engraved insulating pattern 270P, in the region adjacent to the interface between the engraved insulating pattern 270P and the upper insulating capping pattern 250A.

Figure 12A:
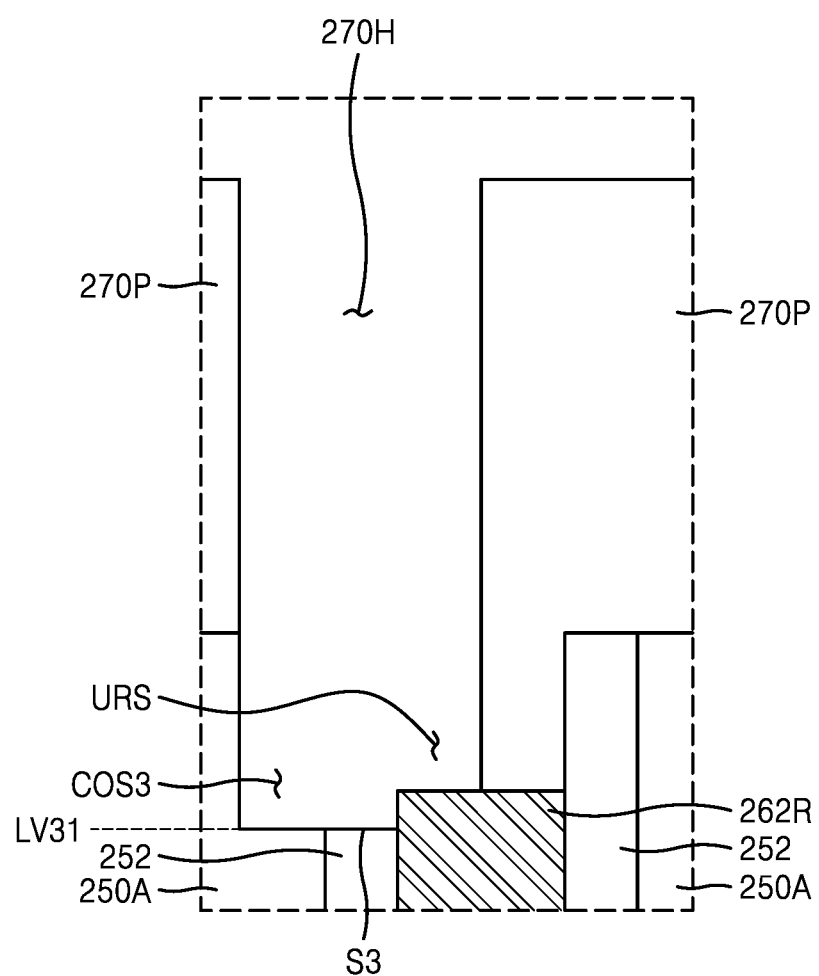
FIGS. 12A and 12B are cross-sectional views respectively illustrating a sequence of intermediate processes of an exemplary method of manufacturing an integrated circuit device, according to some embodiments.
Figure 12B:
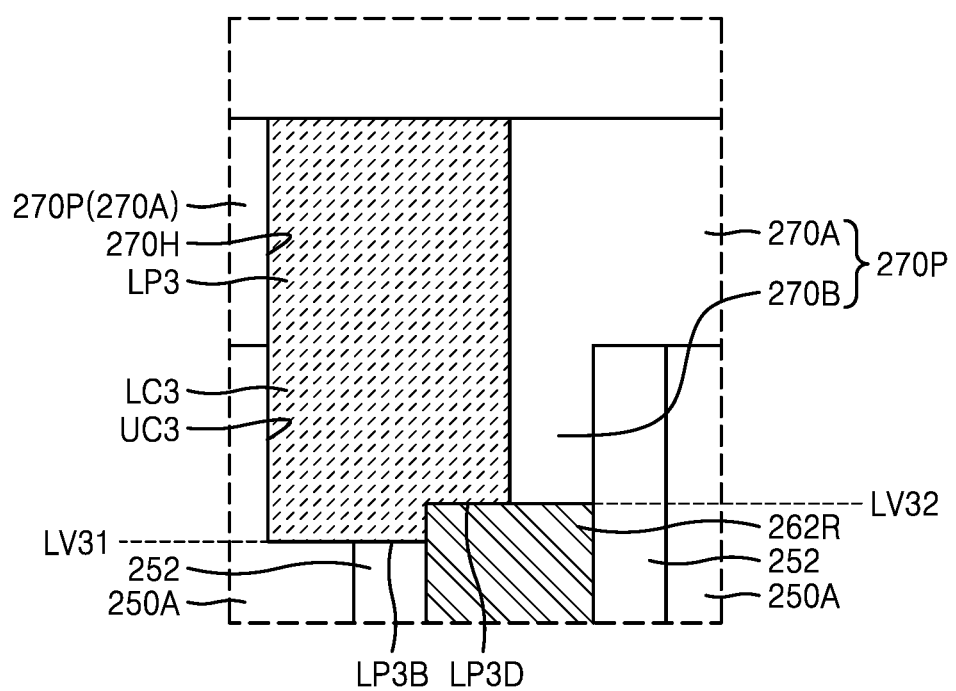

FIGS. 12A and 12B are cross-sectional views respectively illustrating a sequence of intermediate processes of an exemplary method of manufacturing an integrated circuit device, according to some embodiments. In particular, FIG. 12A is an enlarged cross-sectional view of a portion corresponding to the region EX1 of FIG. 9G, and FIG. 12B is an enlarged cross-sectional view of a portion corresponding to the region EX2 of FIG. 9J. In FIGS. 12A and 12B, the same reference numerals as in FIGS. 8A to 10B respectively denote the same members, and here, repeated descriptions thereof are omitted. The method of manufacturing an integrated circuit device, which is described with reference to FIGS. 12A and 12B, is substantially similar to the illustrative methods of manufacturing an integrated circuit device, which are described with reference to FIGS. 8A to 9J, and the following description is made with the focus on differences therebetween.

Referring to FIG. 12A, the same processes as described with reference to FIGS. 8A to 9G may be performed. However, in the present example, a cut-off space COS3 may be formed instead of the cut-off space COS. The cut-off space COS3 may be formed by removing an upper corner portion of the upper insulating capping pattern 250A and a portion of each of the plurality of insulating spacers 252 through the opening 270H of the engraved insulating pattern 270P. After the cut-off space COS3 is formed, the upper insulating capping pattern 250A and the insulating spacer 252 may have a flat surface S3 that defines a bottom surface of the cut-off space COS3. The flat surface S3 may extend substantially flat at a vertical level LV31.

After the cut-off space COS3 is formed, the vertical level LV31 of a lowermost surface of the cut-off space COS3 may be closer to the substrate 210 than a vertical level of an upper surface of a portion of the first recess contact plug 262R, which is exposed by the opening 270H. At least a portion of a sidewall of the first recess contact plug 262R, which faces the upper insulating capping pattern 250A, may be exposed by the cut-off space COS3.

Referring to FIG. 12B, the same processes as described with reference to FIGS. 9H to 9J may be performed on a resulting product of FIG. 12A. As a result, in the cell array area MCA, a conductive landing pad LP3 may be formed to fill the recess space URS (see FIG. 12A) and the cut-off space COS3 (see FIG. 12A) and to be in contact with at least a portion of the upper surface of each first recess contact plug 262R.

The conductive landing pad LP3 may have substantially the same configuration as the conductive landing pad LP described with reference to FIGS. 9J and 10B. However, the vertical level LV31 of a lowermost surface of each conductive landing pad LP3 may be closer to the substrate 210 (see FIG. 9J) than a vertical level LV32 of an uppermost surface of the first recess contact plug 262R. A vertical distance from the lowermost surface of the conductive landing pad LP3 to the main surface 210M of the substrate 210 may be less than a vertical distance from the uppermost surface of the first recess contact plug 262R to the main surface 210M of the substrate 210. The conductive landing pad LP3 may include a pad dent portion LP3D surrounding (i.e., extending around) an upper corner portion of the first recess contact plug 262R. The pad dent portion LP3D of the conductive landing pad LP3 may have a concave shape toward the upper corner portion of the first recess contact plug 262R. The pad dent portion LP3D of the conductive landing pad LP3 may cover an upper surface and a sidewall of the first recess contact plug 262R that is closest to the conductive landing pad LP3 from among the plurality of first recess contact plugs 262R. The sidewall of the first recess contact plug 262R, which is covered by the pad dent portion LP3D of the conductive landing pad LP3, may be a sidewall thereof facing the upper insulating capping pattern 250A.

The upper insulating capping pattern 250A may have an upper cutout portion UC3 that is apart from the bit line BL in the vertical direction. The upper cutout portion UC3 of the upper insulating capping pattern 250A may be obtained by partially removing only one of both upper corner portions of the upper insulating capping pattern 250A.

The conductive landing pad LP3 may include a lower corner portion LC3 that fills the opening 270H of the engraved insulating pattern 270P and is in contact with the upper cutout portion UC3 of the upper insulating capping pattern 250A. The lower corner portion LC3 of the conductive landing pad LP3 may have a convex shape toward the upper cutout portion UC3 of the upper insulating capping pattern 250A, and the upper cutout portion UC3 of the upper insulating capping pattern 250A may have a concave shape toward the lower corner portion LC3 in correspondence with the shape of the lower corner portion LC3 of the conductive landing pad LP3.

Figure 13A:
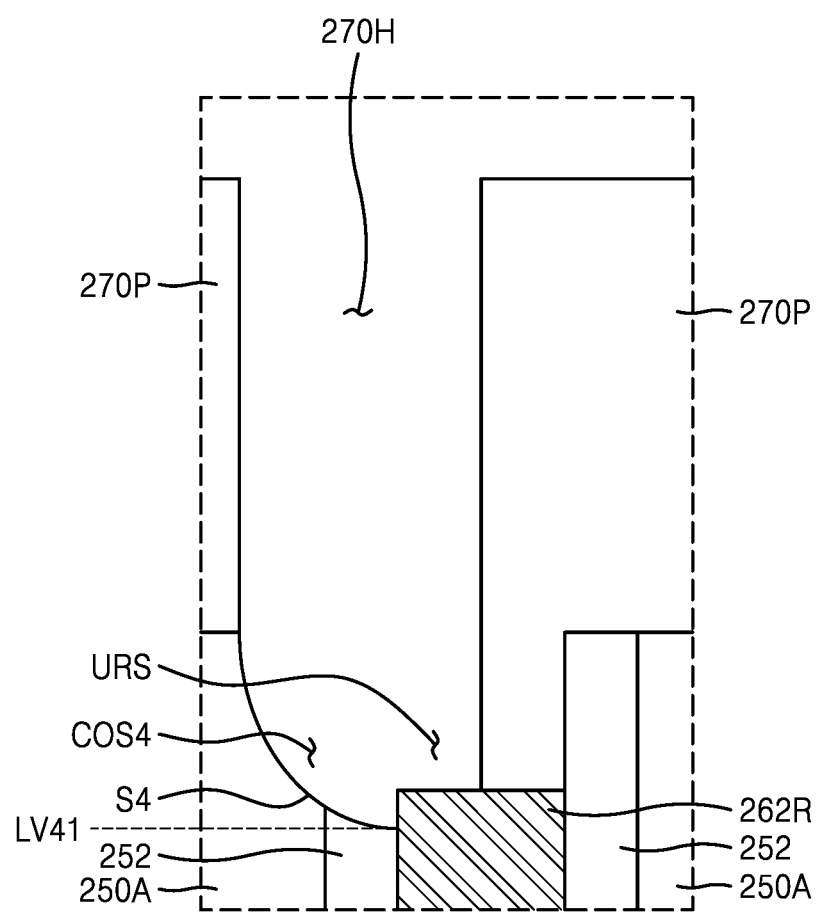
FIGS. 13A and 13B are cross-sectional views respectively illustrating a sequence of intermediate processes of an exemplary method of manufacturing an integrated circuit device, according to some embodiments.
Figure 13B:
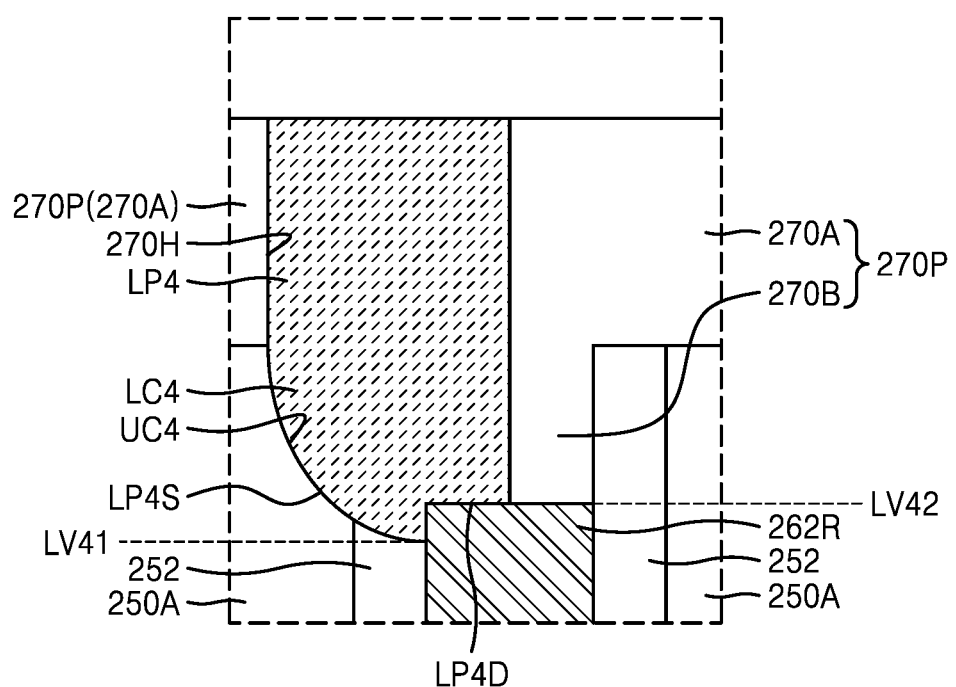

FIGS. 13A and 13B are cross-sectional views respectively illustrating a sequence of intermediate processes of an exemplary method of manufacturing an integrated circuit device, according to some embodiments. In particular, FIG. 13A is an enlarged cross-sectional view of a portion corresponding to the region EX1 of FIG. 9G, and FIG. 13B is an enlarged cross-sectional view of a portion corresponding to the region EX2 of FIG. 9J. In FIGS. 13A and 13B, the same reference numerals as in FIGS. 8A to 10B respectively denote the same members, and here, repeated descriptions thereof are omitted. The method of manufacturing an integrated circuit device, which is described with reference to FIGS. 13A and 13B, is substantially similar to the methods of manufacturing an integrated circuit device, which are described with reference to FIGS. 8A to 9J, and the following description is made with the focus on differences therebetween.

Referring to FIG. 13A, the same processes as described with reference to FIGS. 8A to 9G may be performed. However, in the present example, a cut-off space COS4 may be formed instead of the cut-off space COS. The cut-off space COS4 may be formed by removing an upper corner portion of the upper insulating capping pattern 250A and a portion of each of the plurality of insulating spacers 252 through the opening 270H of the engraved insulating pattern 270P. After the cut-off space COS4 is formed, the upper insulating capping pattern 250A may have a round cutout surface S4 that defines the cut-off space COS4.

After the cut-off space COS4 is formed, a vertical level LV41 of a lowermost surface of the cut-off space COS4 may be closer to the substrate 210 than a vertical level of an upper surface of a portion of the first recess contact plug 262R, which is exposed by the opening 270H. A sidewall of the first recess contact plug 262R, which faces the upper insulating capping pattern 250A, may be exposed by the cut-off space COS4.

Referring to FIG. 13B, the same processes as described with reference to FIGS. 9H to 9J may be performed on a resulting product of FIG. 13A. As a result, in the cell array area MCA, a conductive landing pad LP4 may be formed to fill the recess space URS (see FIG. 13A) and the cut-off space COS4 (see FIG. 13A) and to be in contact with at least a portion of the upper surface of each first recess contact plug 262R.

The conductive landing pad LP4 may have substantially the same configuration as the conductive landing pad LP described with reference to FIGS. 9J and 10B. However, the conductive landing pad LP4 may have a round surface LP4S contacting each of the upper insulating capping pattern 250A and the insulating spacer 252.

The vertical level LV41 of a lowermost surface of each conductive landing pad LP4 may be closer to the substrate 210 than a vertical level LV42 of the uppermost surface of the first recess contact plug 262R. A vertical distance from the lowermost surface of the conductive landing pad LP4 to the main surface 210M of the substrate 210 may be less than a vertical distance from the uppermost surface of the first recess contact plug 262R to the main surface 210M of the substrate 210. The conductive landing pad LP4 may include a pad dent portion LP4D surrounding (i.e., extending around) an upper corner portion of the first recess contact plug 262R. The pad dent portion LP4D of the conductive landing pad LP4 may have a concave shape toward the upper corner portion of the first recess contact plug 262R. The pad dent portion LP4D of the conductive landing pad LP4 may cover an upper surface and a sidewall of the first recess contact plug 262R that is closest to the conductive landing pad LP4 from among the plurality of first recess contact plugs 262R. The sidewall of the first recess contact plug 262R, which is covered by the pad dent portion LP4D of the conductive landing pad LP4, may be a sidewall thereof facing the upper insulating capping pattern 250A.

The upper insulating capping pattern 250A may have an upper round cutout portion UC4 that is apart from the bit line BL in the vertical direction. The upper round cutout portion UC4 of the upper insulating capping pattern 250A may be obtained by partially removing only one of both upper corner portions of the upper insulating capping pattern 250A.

The conductive landing pad LP4 may include a lower round corner portion LC4 that fills the opening 270H of the engraved insulating pattern 270P and is in contact with the upper round cutout portion UC4 of the upper insulating capping pattern 250A. The lower round corner portion LC4 of the conductive landing pad LP4 may have a convex shape toward the upper round cutout portion UC4 of the upper insulating capping pattern 250A, and the upper round cutout portion UC4 of the upper insulating capping pattern 250A may have a concave shape toward the lower round corner portion LC4 in correspondence with the shape of the lower round round corner portion LC4 of the conductive landing pad LP4.

Figure 14A:
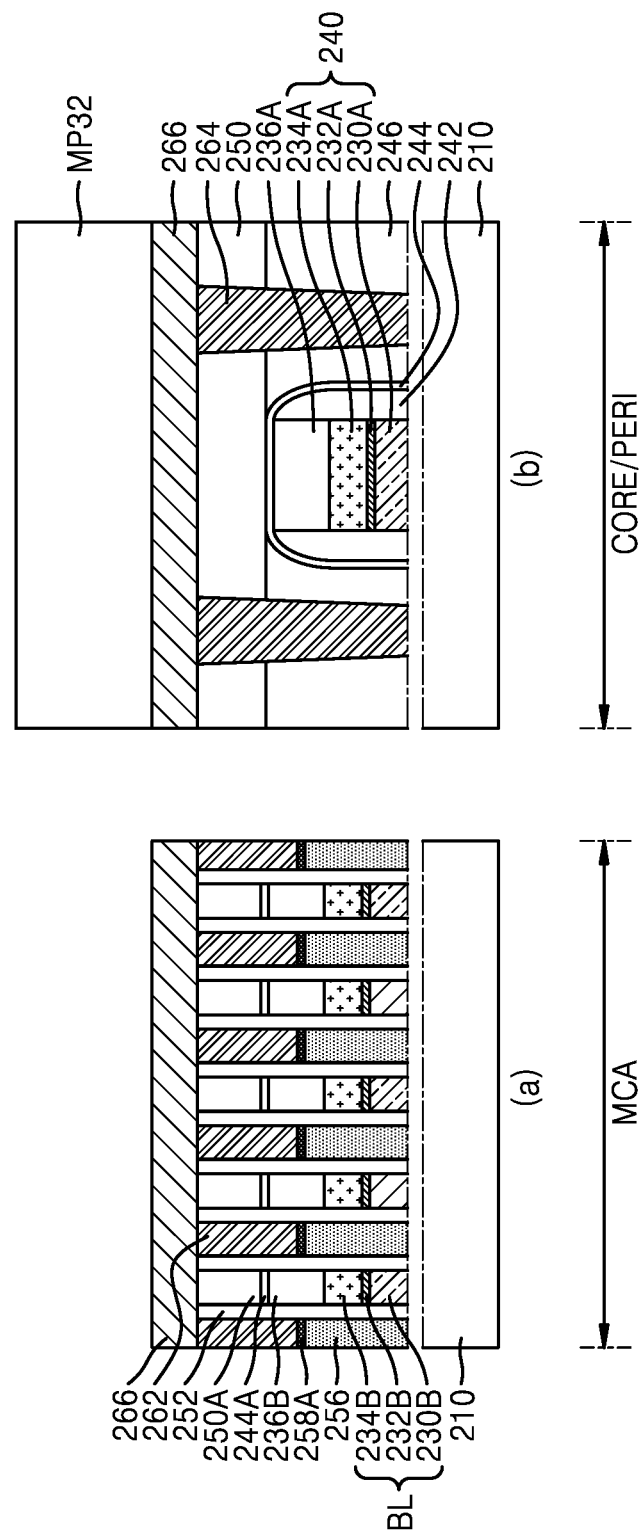
FIGS. 14A to 14P are cross-sectional views respectively illustrating a sequence of intermediate processes of an exemplary method of manufacturing an integrated circuit device, according to some embodiments.

Next, an example of the method of manufacturing an integrated circuit device, shown in FIG. 7, is described with reference to FIGS. 14A to 14P. In FIGS. 14A to 14P, the same reference numerals as in FIGS. 8A to 9J respectively denote the same members, and here, repeated descriptions thereof are omitted.

Referring to FIG. 14A, the processes described with reference to FIGS. 8A to 8L may be performed, and the first conductive layer 266 may be formed in the cell array area MCA and the peripheral circuit area CORE/PERI, as described with reference to FIG. 9A. Next, a photoresist pattern MP32 may be formed to cover the first conductive layer 266 in the peripheral circuit area CORE/PERI.

The photoresist pattern MP32 may be obtained from a resist film for a KrF excimer laser (248 nm), a resist film for an ArF excimer laser (193 nm), or a resist film for an $F_2$ excimer laser (157 nm). After the photoresist pattern MP32 is formed, the first conductive layer 266 may be exposed in the cell array area MCA.

Referring to FIG. 14B, in a similar manner to that described with reference to FIG. 9E, in a resulting product of FIG. 14A, the first conductive layer 266 exposed in the cell array area MCA may be removed, and each of the plurality of first contact plugs 262 may be partially removed, thereby forming the plurality of first recess contact plugs 262R respectively from the plurality of first contact plugs 262. As a result, the recess space URS may be formed on each first recess contact plug 262R between the plurality of upper insulating capping patterns 250A of the plurality of bit line structures. Next, the photoresist pattern MP32 (see FIG. 14A) may be removed, thereby exposing the first conductive layer 266 in the peripheral circuit area CORE/PERI.

Figure 14C:
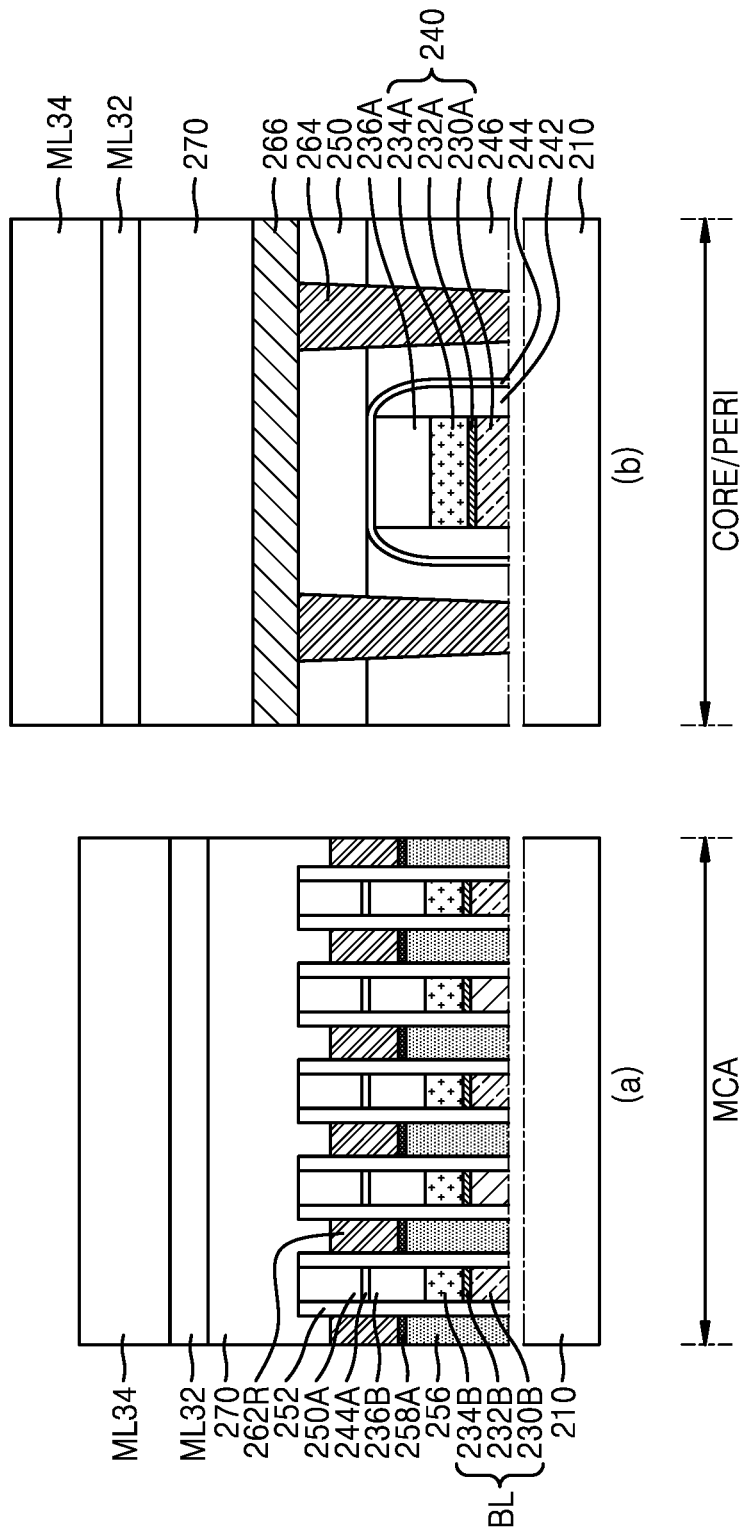

Referring to FIG. 14C, in the cell array area MCA and the peripheral circuit area CORE/PERI, the insulating film 270, a first hardmask layer ML32, and a second hardmask layer ML34 may be formed to cover a resulting product of FIG. 14B in a stacked manner in the stated order.

The insulating film 270 may include a silicon nitride film, the first hardmask layer ML32 may include a polysilicon film, and the second hardmask layer ML34 may include a silicon oxide film, but the inventive concept is not limited thereto.

Figure 14D:
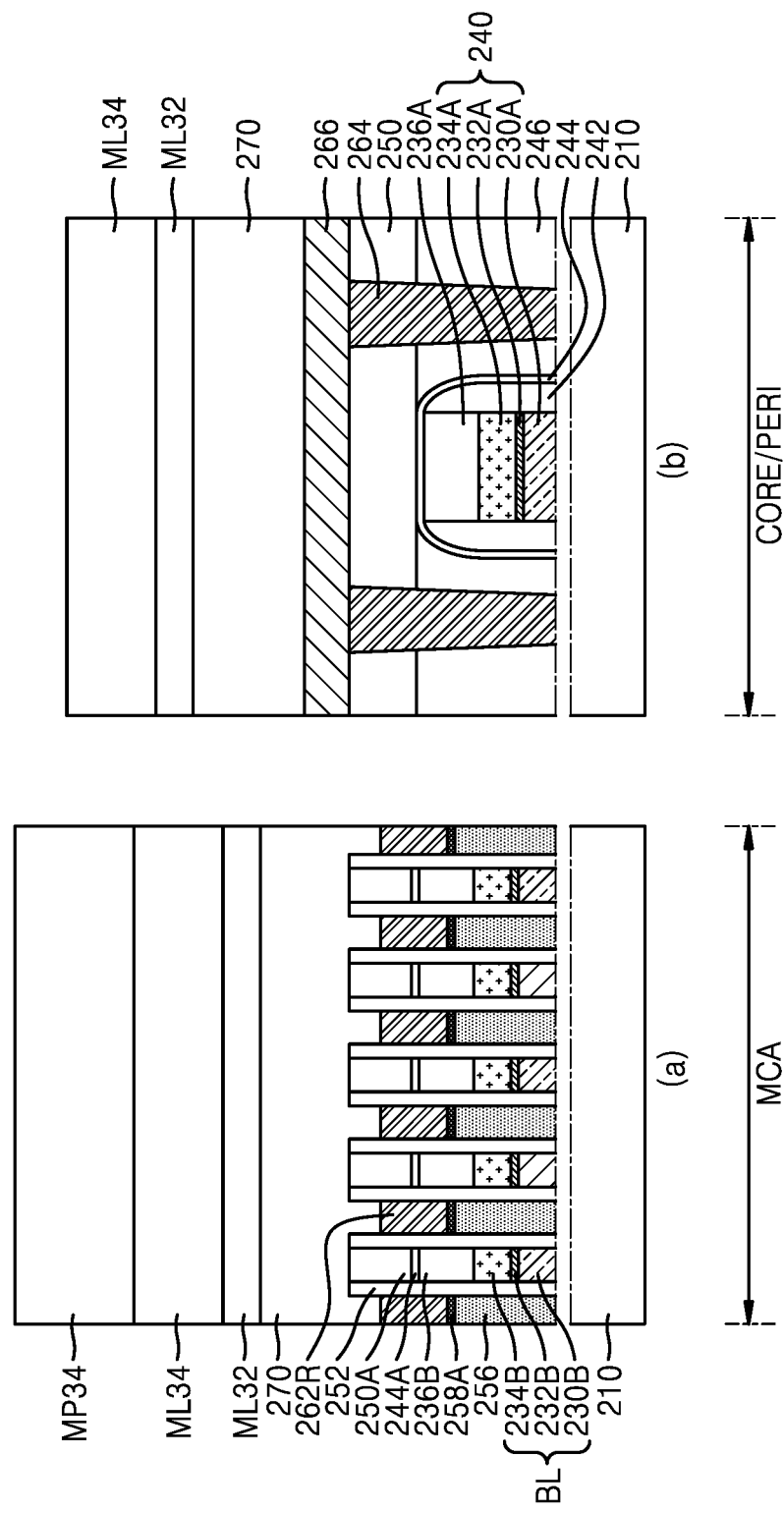

Referring to FIG. 14D, a photoresist pattern MP34 may be formed to cover the second hardmask layer ML34 in the cell array area MCA. The photoresist pattern MP34 may have substantially the same configuration as the photoresist pattern MP32 described with reference to FIG. 14A. After the photoresist pattern MP34 is formed, the second hardmask layer ML34 may be exposed in the peripheral circuit area CORE/PERI.

Figure 14E:
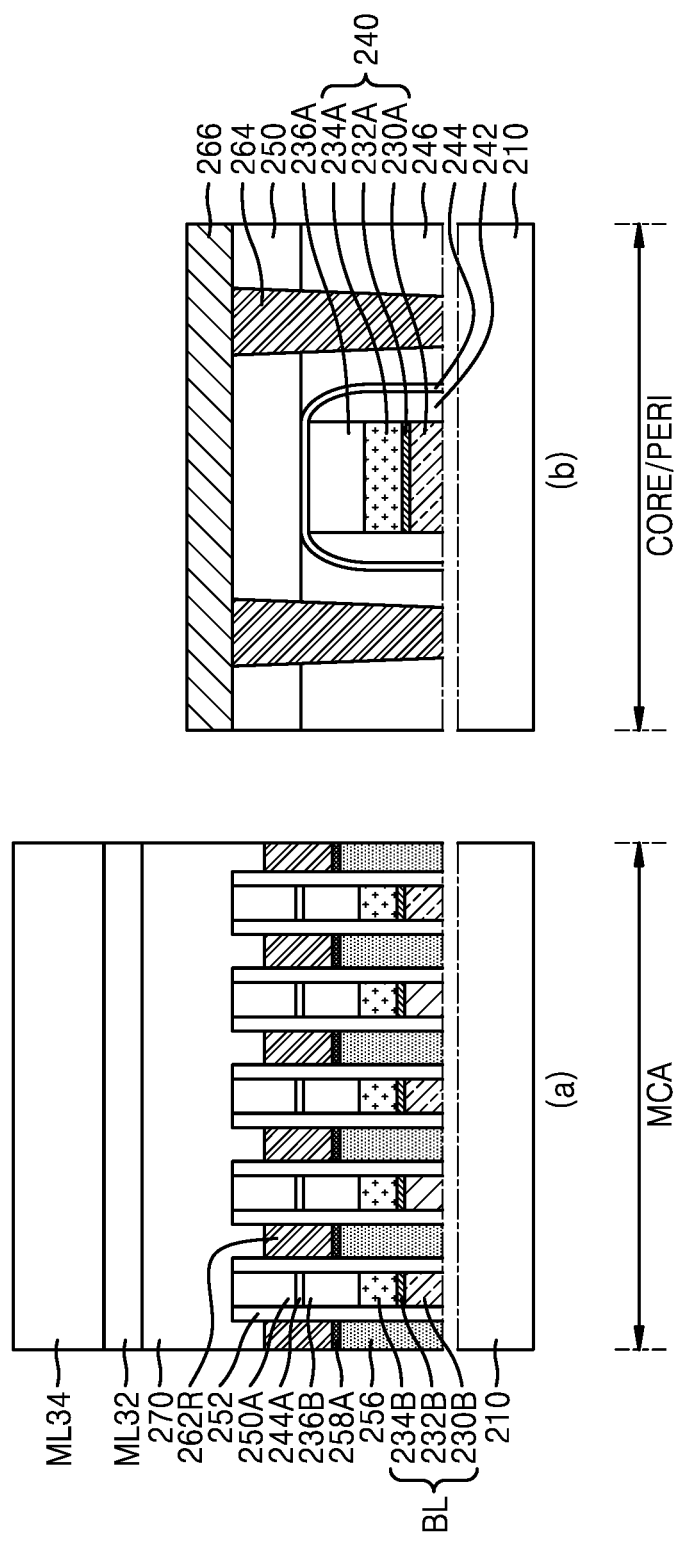

Referring to FIG. 14E, in a resulting product of FIG. 14D, the second hardmask layer ML34, the first hardmask layer ML32, and the insulating film 270 in the peripheral circuit area CORE/PERI may be etched and removed by using the photoresist pattern MP34 as an etch mask, thereby exposing the first conductive layer 266. Next, the photoresist pattern MP34 in the cell array area MCA may be removed.

Figure 14F:
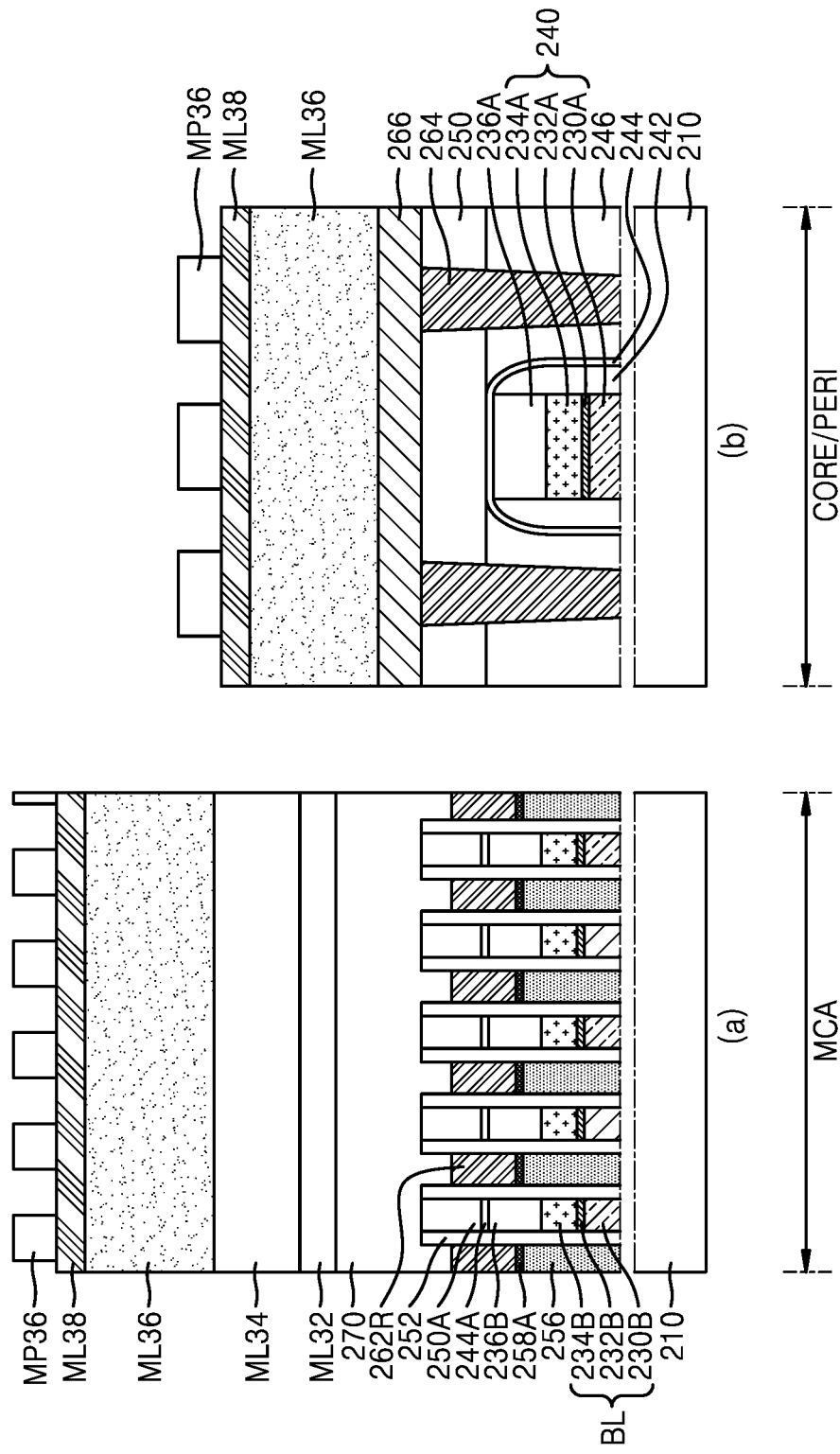

Referring to FIG. 14F, in the cell array area MCA and the peripheral circuit area CORE/PERI, a third hardmask layer ML36, a fourth hardmask layer ML38, and a photoresist pattern MP36 may be formed in the stated order on a resulting product of FIG. 14E.

The third hardmask layer ML36 may include an ACL, and the fourth hardmask layer ML38 may include a polysilicon film, but the inventive concept is not limited thereto. The photoresist pattern MP36 may be obtained from a resist film for EUV light (13.5 nm), a resist film for a KrF excimer laser (248 nm), a resist film for an ArF excimer laser (193 nm), or a resist film for an $F_2$ excimer laser (157 nm). In some embodiments, to form the photoresist pattern MP36, a resist film for EUV light may be formed in the cell array area MCA and the peripheral circuit area CORE/PERI. Next, the resist film for EUV light in the cell array area MCA and the peripheral circuit area CORE/PERI may be simultaneously exposed to light of an EUV light source, and the light-exposed resist film for EUV light may be developed, thereby forming the photoresist pattern MP36.

Figure 14G:
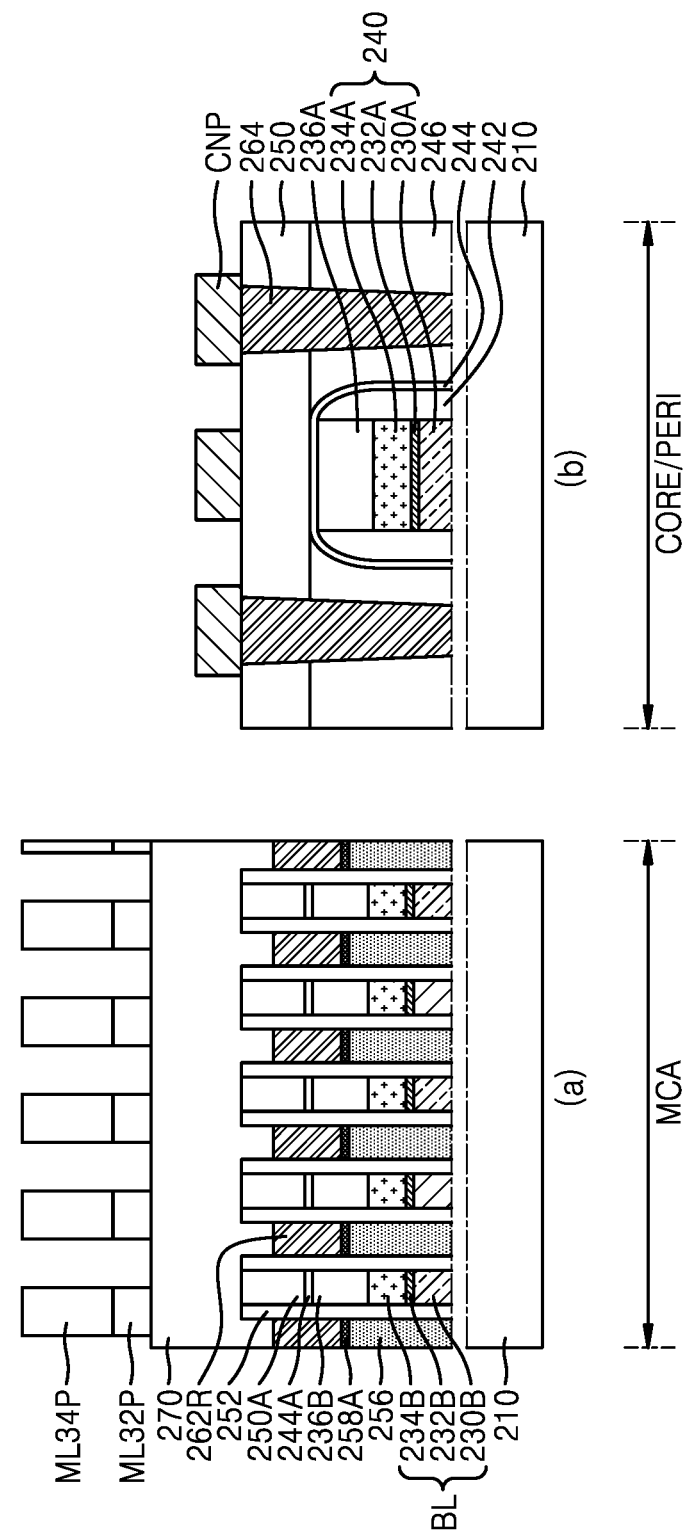

Referring to FIG. 14G, in a resulting product of FIG. 14F, a portion of a lower structure may be etched by using the photoresist pattern MP36 as an etch mask. Here, in the peripheral circuit area CORE/PERI, the fourth hardmask layer ML38 and the third hardmask layer ML36 may be etched in the stated order by using the photoresist pattern MP36 as an etch mask, and the first conductive layer 266 may be patterned by using a resulting product obtained by the etching as an etch mask, thereby forming the plurality of peripheral circuit wiring patterns CNP. In the cell array area MCA, by using the photoresist pattern MP36 as an etch mask, the fourth hardmask layer ML38 and the third hardmask layer ML36 may be etched in the stated order, and then, the second hardmask layer ML34 and the first hardmask layer ML32 may be etched in the stated order. As a result, the plurality of peripheral circuit wiring patterns CNP may remain on the plurality of second contact plugs 264 and the upper insulating capping layer 250 in the peripheral circuit area CORE/PERI, and a first hardmask pattern ML32P and a second hardmask pattern ML34P, which are respectively etching results of the first hardmask layer ML32 and the second hardmask layer ML34, may remain on the insulating film 270 in the cell array area MCA.

At least portions of the first hardmask pattern ML32P and the second hardmask pattern ML34P, which remain in the cell array area MCA, may be used as an etch mask for etching the insulating film 270 to form the engraved insulating pattern 270P (see FIG. 14K) having the plurality of openings 270H, in a subsequent process.

Figure 14H:
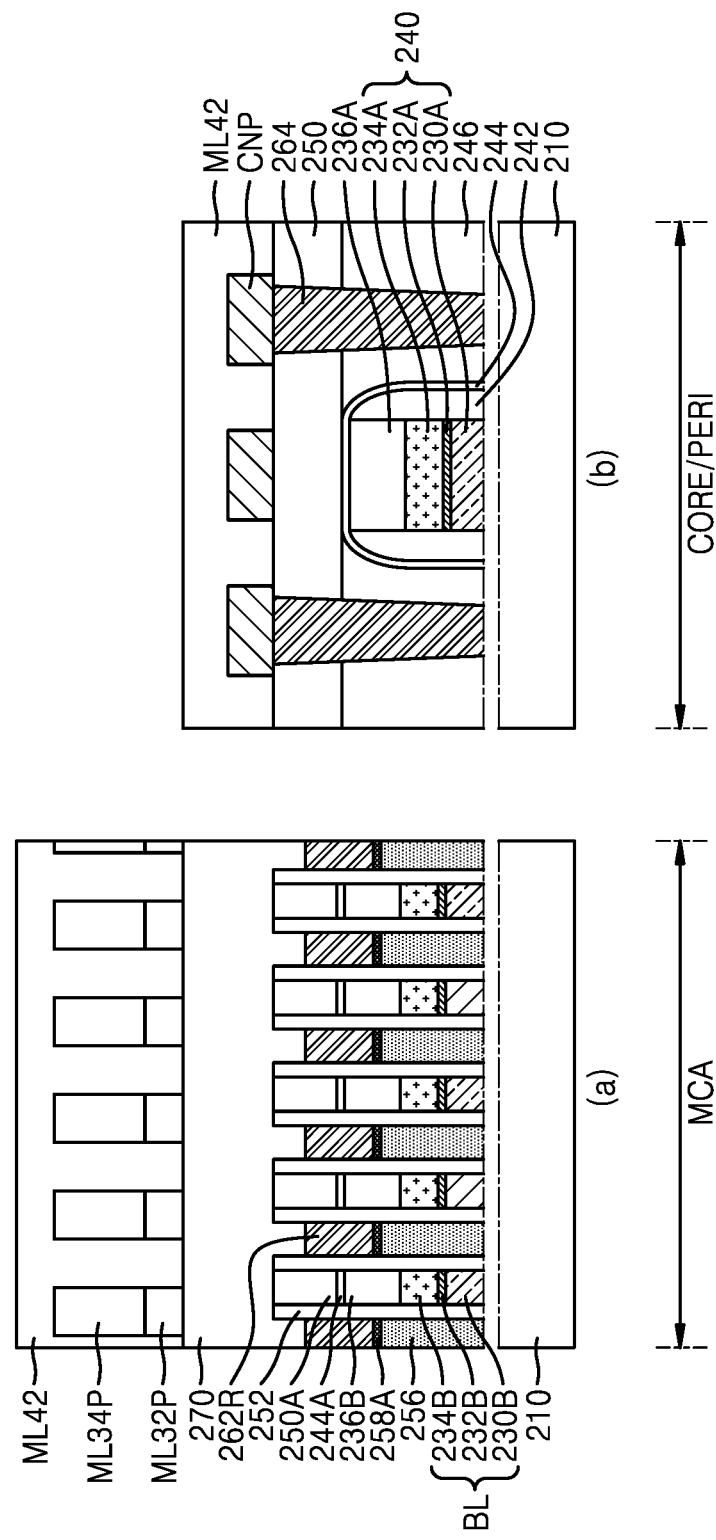

Referring to FIG. 14H, in the cell array area MCA and the peripheral circuit area CORE/PERI, a fifth hardmask layer ML42 may be formed to cover a resulting product of FIG. 14G. The fifth hardmask layer ML42 may be formed of flowable oxide. For example, the fifth hardmask layer ML42 may include, but is not limited to, TOSZ.

Figure 14I:
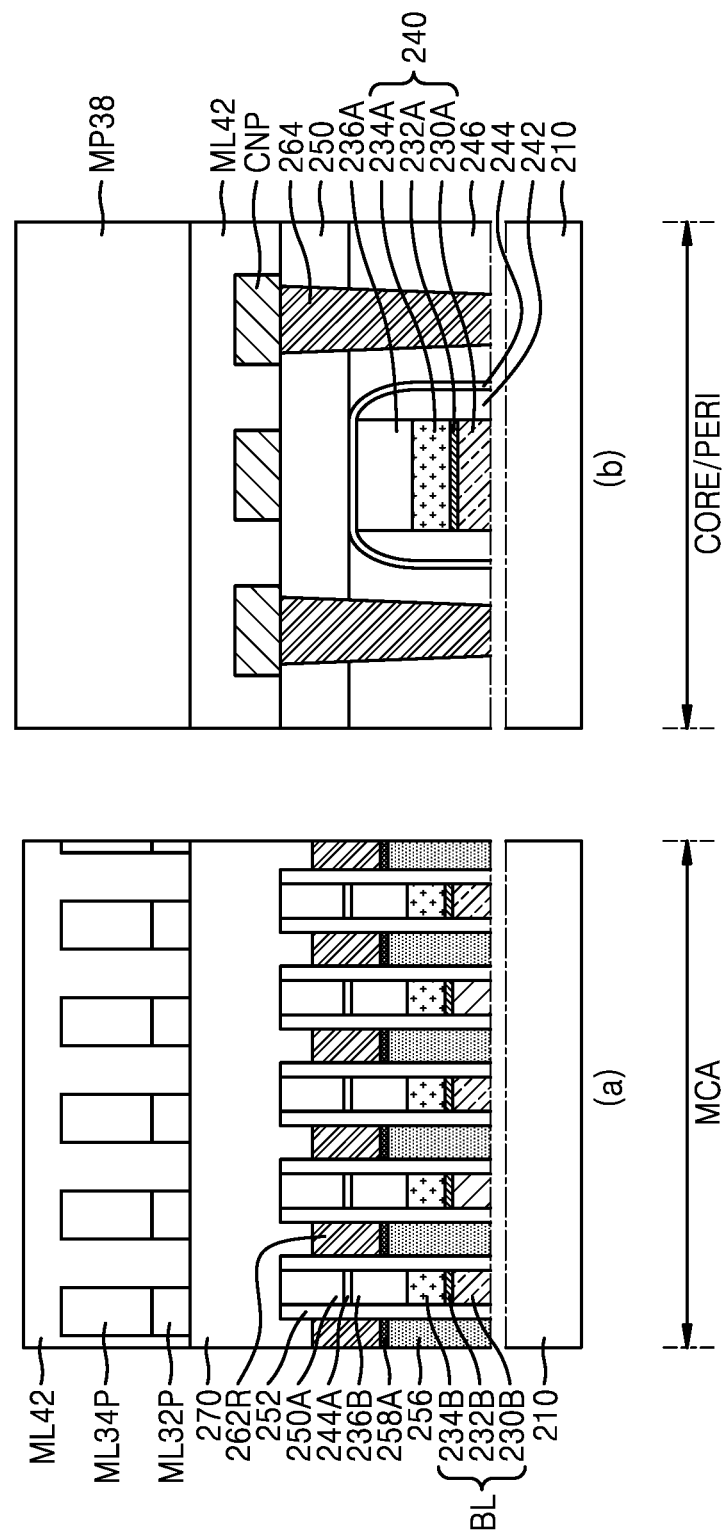

Referring to FIG. 14I, in a resulting product of FIG. 14H, a photoresist pattern MP38 may be formed to cover the fifth hardmask layer ML42 in the peripheral circuit area CORE/PERI. The photoresist pattern MP38 may have substantially the same configuration as the photoresist pattern MP32 described with reference to FIG. 14A. After the photoresist pattern MP38 is formed, the fifth hardmask layer ML42 may be exposed in the cell array area MCA.

Figure 14J:
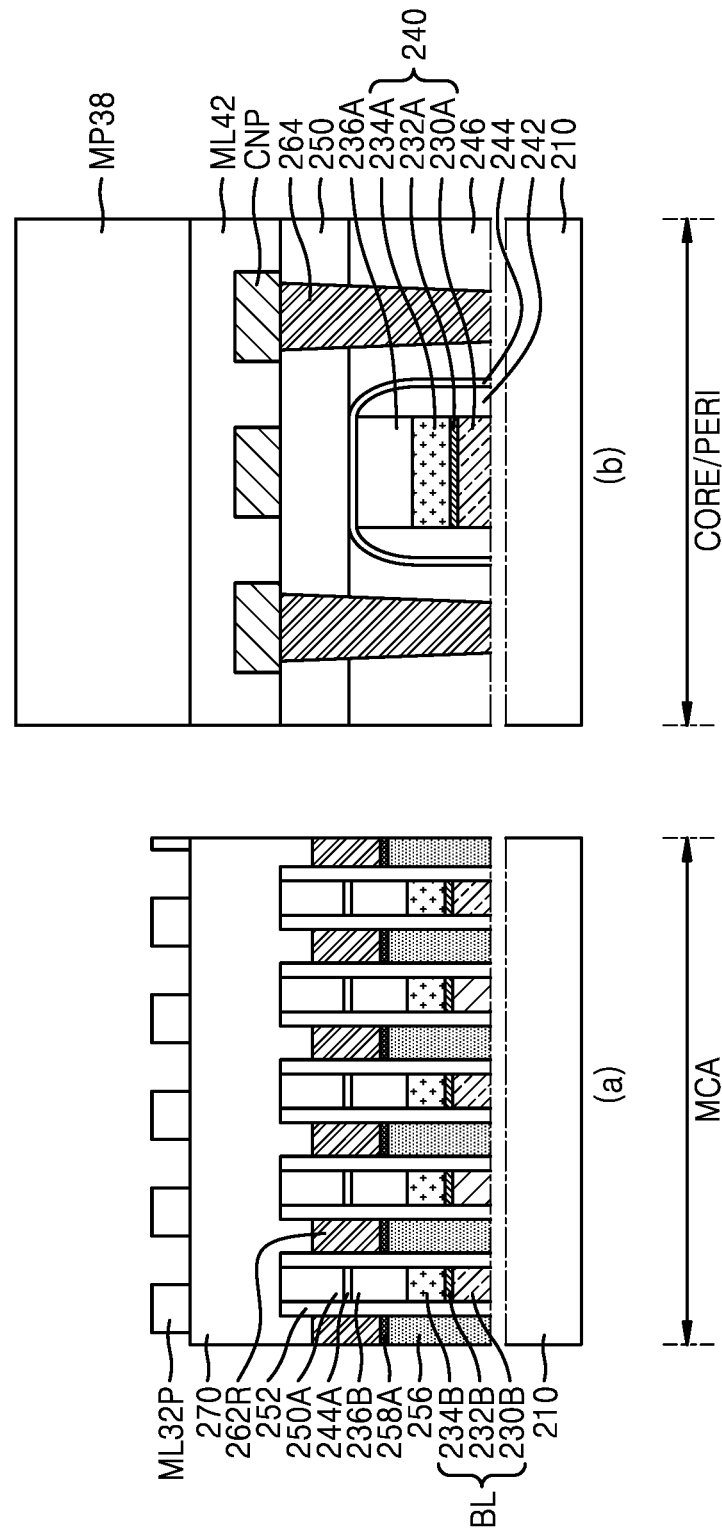

Referring to FIG. 14J, in a resulting product of FIG. 14I, the fifth hardmask layer ML42 and the second hardmask pattern ML34P in the cell array area MCA may be wet-removed by using the photoresist pattern MP38 as an etch mask, thereby exposing the first hardmask pattern ML32P in the cell array area MCA. The upper surface of the insulating film 270 may be exposed by the first hardmask pattern ML32P.

Figure 14K:
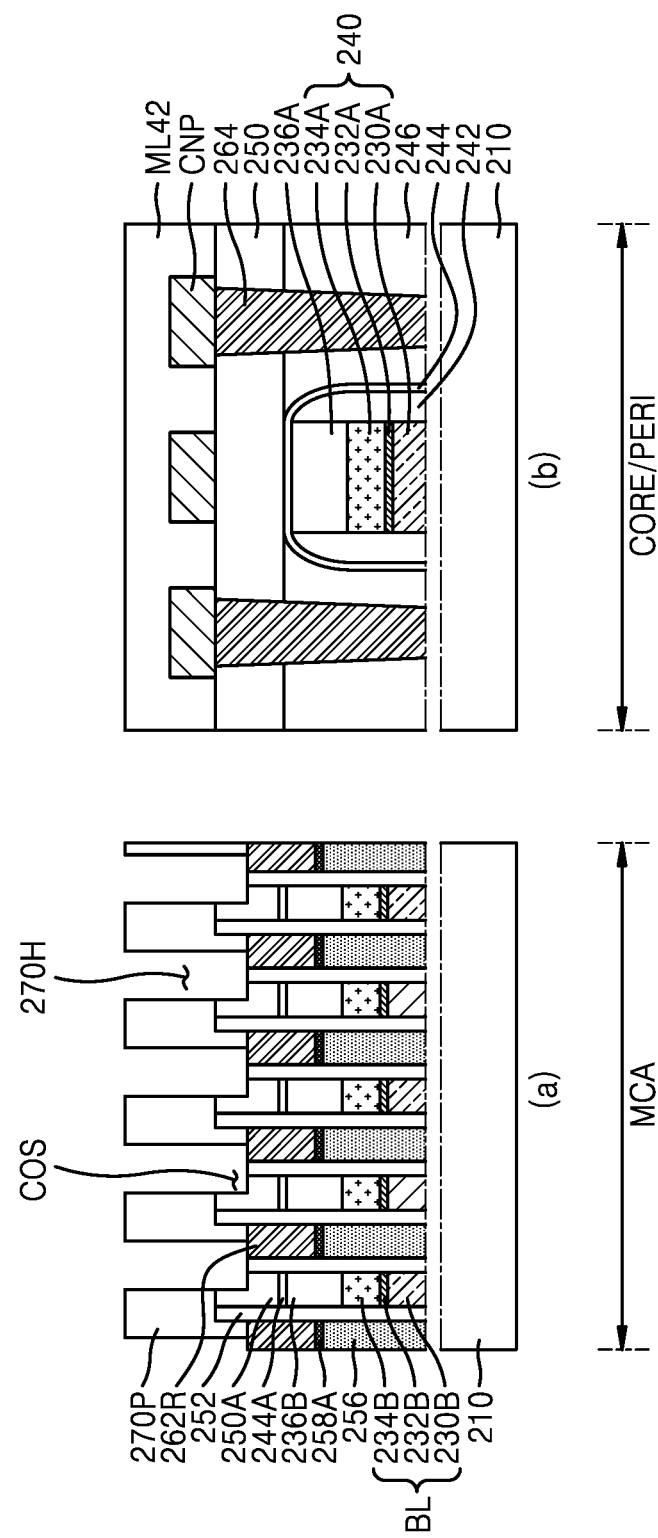

Referring to FIG. 14K, in a resulting product of FIG. 14J, the insulating film 270 may be patterned by using the first hardmask pattern ML32P as an etch mask, thereby forming the engraved insulating pattern 270P. Next, the upper surface of the engraved insulating pattern 270P may be exposed by removing unnecessary films on the engraved insulating pattern 270P. The engraved insulating pattern 270P may be arranged on the plurality of bit line structures and the plurality of first recess contact plugs 262R in the cell array area MCA and may have the plurality of openings 270H arranged to be respectively and horizontally shifted from the plurality of first recess contact plugs 262R.

Next, in the cell array area MCA, an upper corner portion of each of the plurality of upper insulating capping patterns 250A and a portion of each of the plurality of insulating spacers 252 may be removed through the plurality of openings 270H of the engraved insulating pattern 270P, thereby forming the plurality of cut-off spaces COS.

While or after the engraved insulating pattern 270P is formed in the cell array area MCA, the photoresist pattern MP38 in the peripheral circuit area CORE/PERI may be removed, and an upper surface of the fifth hardmask layer ML42 may be exposed.

In some embodiments, in the process described with reference to FIG. 14K, the cut-off space COS2 shown in FIG. 11A, the cut-off space COS3 shown in FIG. 12A, or the cut-off space COS4 shown in FIG. 13A may be formed instead of the cut-off space COS.

Figure 14L:
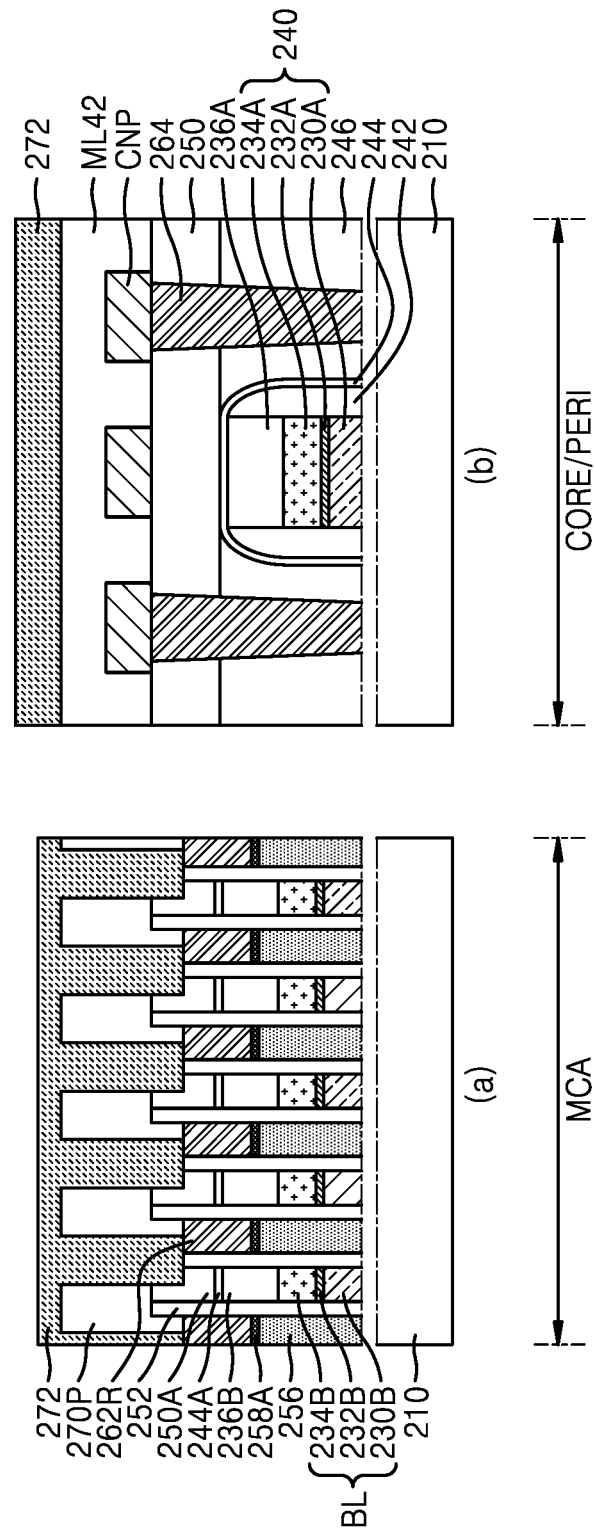

Referring to FIG. 14L, the second conductive layer 272 may be formed on a resulting product of FIG. 14K. A detailed configuration of the second conductive layer 272 may be the same as described with reference to FIG. 9H.

Figure 14M:
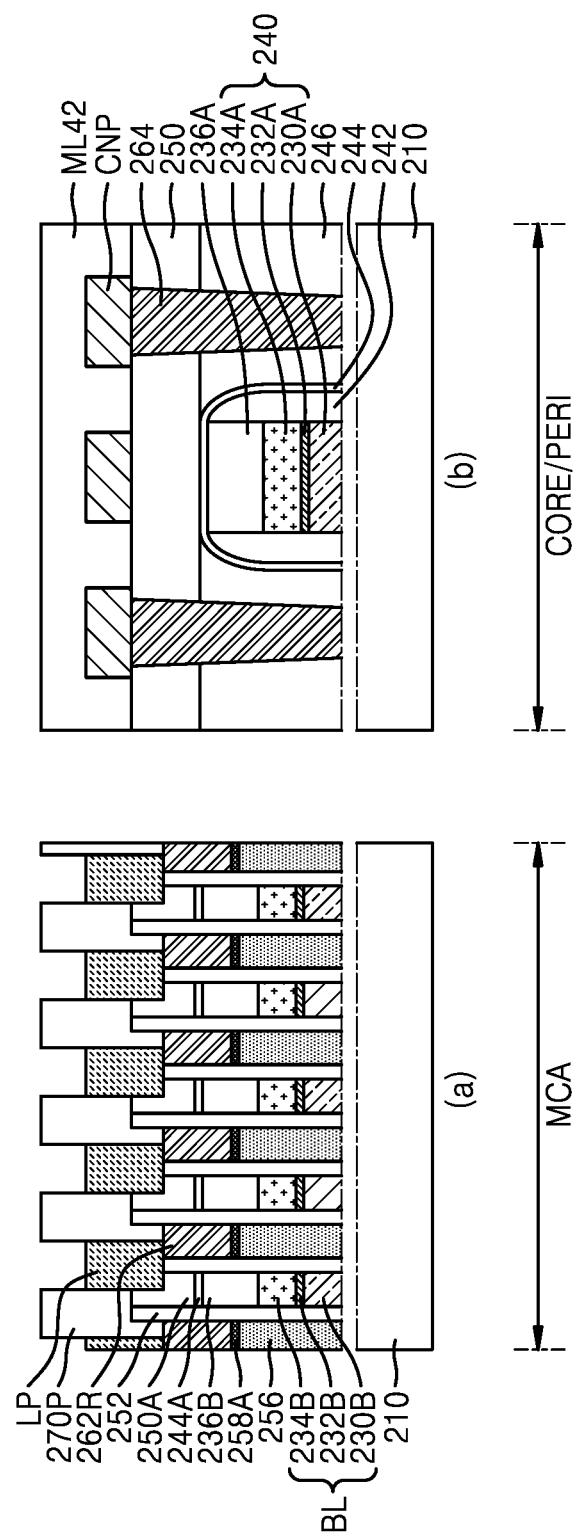

Referring to FIG. 14M, in a resulting product of FIG. 14L, by etching-back the second conductive layer 272, the plurality of conductive landing pads LP may be formed in the cell array area MCA, and the upper surface of the fifth hardmask layer ML42 may be exposed in the peripheral circuit area CORE/PERI.

Figure 14N:
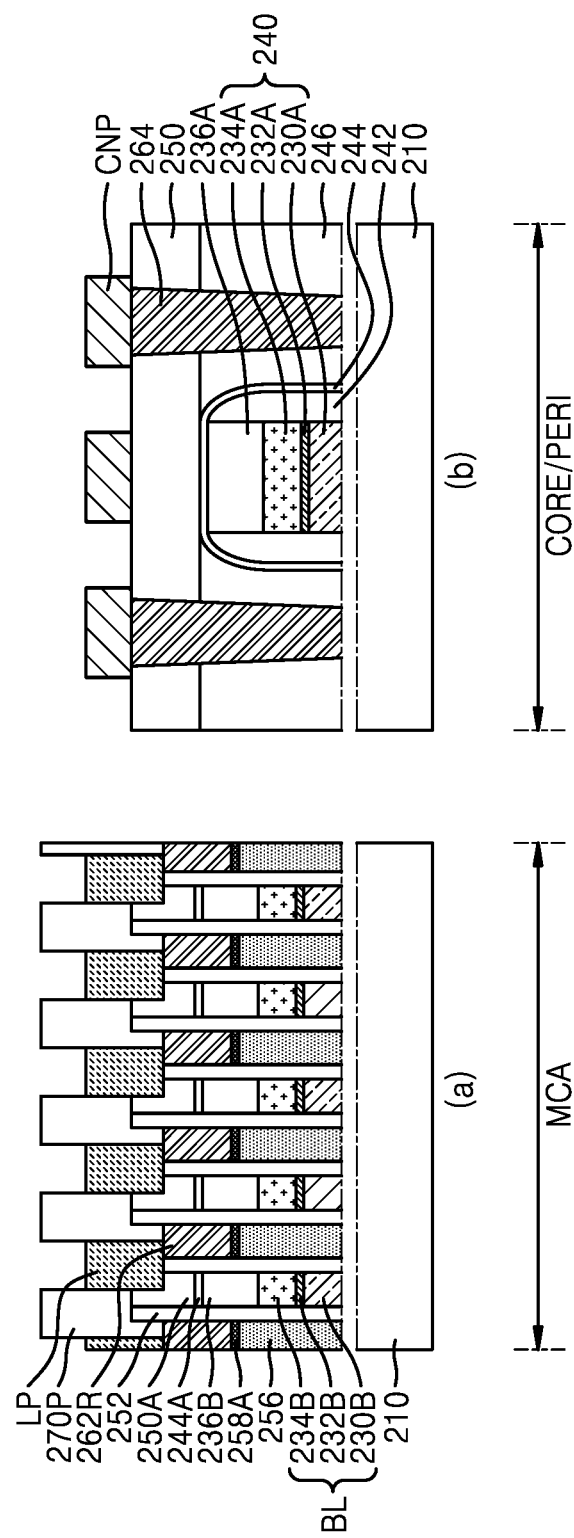
Figure 140:
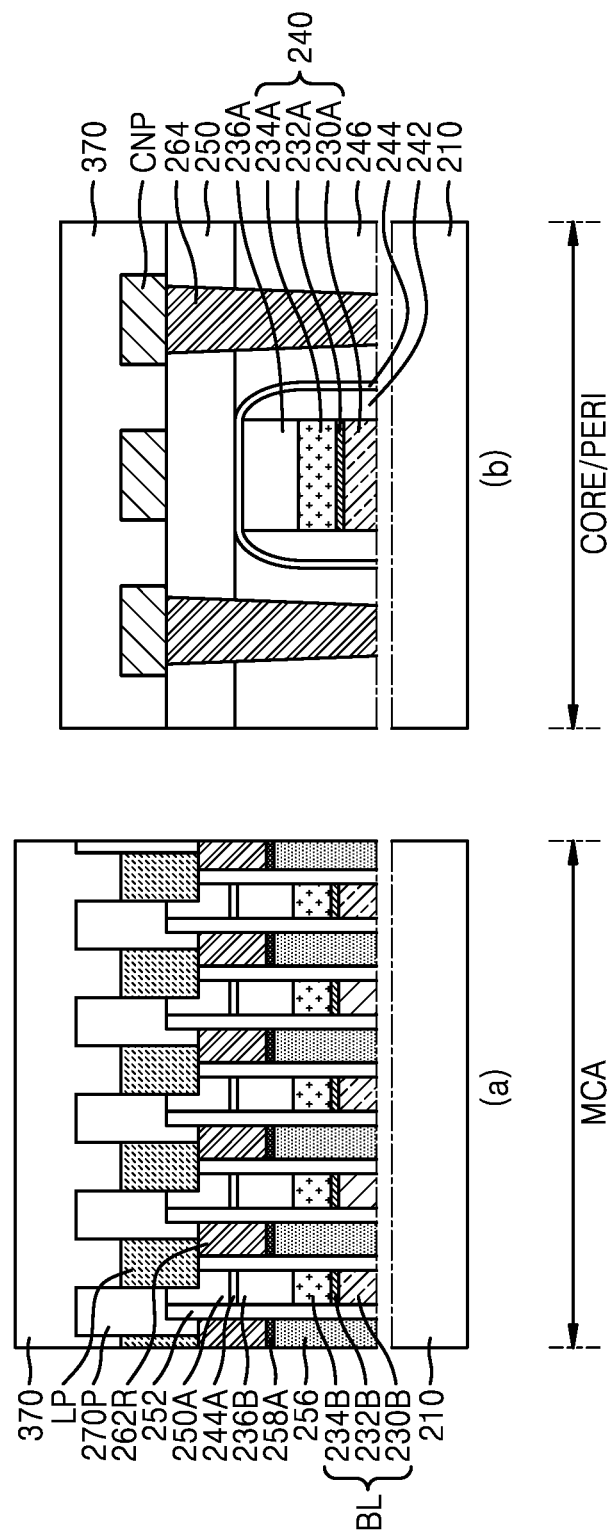
Figure 14P:
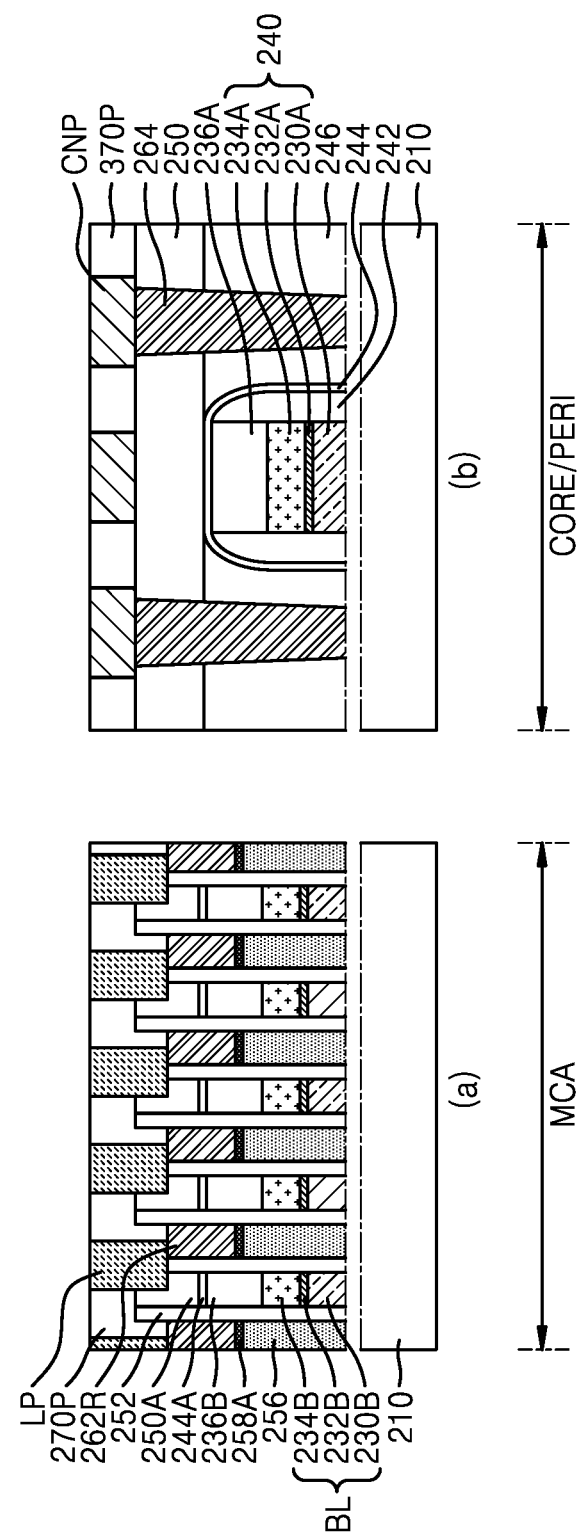

Referring to FIG. 14N, in the peripheral circuit area CORE/PERI, the fifth hardmask layer ML42 may be removed. In some embodiments, to remove the fifth hardmask layer ML42, a wet etching process may be used.

Referring to FIG. 14O, in the cell array area MCA and the peripheral circuit area CORE/PERI, an insulating film 370 may be formed to cover a resulting product of FIG. 14H. In some embodiments, the insulating film 370 may include, but is not limited to, a silicon nitride film.

Referring to FIG. 14P, a portion of each of the insulating film 370 and the engraved insulating pattern 270P may be etched-back from a resulting product of FIG. 14O in the cell array area MCA and the peripheral circuit area CORE/PERI, such that the upper surface of each of the plurality of conductive landing pads LP is exposed in the cell array area MCA and the upper surface of each of the plurality of peripheral circuit wiring patterns CNP is exposed in the peripheral circuit area CORE/PERI. As a result, the uppermost surface of the engraved insulating pattern 270P and the uppermost surface of each of the plurality of conductive landing pads LP may be at the same vertical level (i.e., coplanar), in the cell array area MCA, and an insulating pattern 370P may be formed to fill each space between the plurality of peripheral circuit wiring patterns CNP in the peripheral circuit area CORE/PERI. Next, in the cell array area MCA, a capacitor lower electrode may be formed on the plurality of conductive landing pads LP.

In some embodiments, the conductive landing pad LP2 shown in FIG. 11B, the conductive landing pad LP3 shown in FIG. 12B, or the conductive landing pad LP4 shown in FIG. 13B may be formed instead of the conductive landing pad LP shown in FIG. 14P.

In the methods of manufacturing an integrated circuit device, which are shown in FIGS. 5 and 7, process P110 of FIG. 5 and process P112 of FIG. 7 may correspond to the processes described with reference to FIGS. 8B to 8L. Process P120 of FIGS. 5 and 7 may correspond to the process described with reference to FIG. 14B. Process P124 of FIG. 7 may correspond to the processes described with reference to FIGS. 14A and 14E to 14G. Processes P130 and P140 of FIGS. 5 and 7 may correspond to the processes described with reference to FIGS. 14J and 14K. Process P150 of FIGS. 5 and 7 may correspond to the processes described with reference to FIGS. 14L to 14P.

According to the methods of manufacturing an integrated circuit device, described with reference to FIGS. 8A to 14P, engraved patterning is used to form the plurality of conductive landing pads LP, LP2, LP3, or LP4 arranged in the cell array area MCA having a relatively high pattern density, and embossed patterning is used to form a plurality of conductive patterns (that is, CNP) in the peripheral circuit area CORE/PERI having a relatively low pattern density. As such, a plurality of conductive patterns may be formed in areas having different pattern densities from each other by using different methods from each other, out of engraved patterning and embossed patterning, depending upon the density of patterns intended to be formed. In addition, a series of processes for respectively forming the plurality of conductive landing pads LP, LP2, LP3, or LP4 and the plurality of conductive patterns (that is, CNP) in areas having different pattern densities from each other may include one or two photolithography processes using an EUV light source. Therefore, according to the methods of manufacturing an integrated circuit device, according to the inventive concept, patterns having various shapes and various sizes may be formed in a plurality of areas having different pattern densities from each other by using a simple and relatively low-cost process. In addition, even when there is a difference in pattern density, pattern shape, pattern size, or pattern level between the plurality of areas, there is no concern of an increase in process difficulty or the generation of process defects due to such a difference, and the reliability of the integrated circuit device may be improved by maximizing a process margin.

In addition, according to the methods of manufacturing an integrated circuit device, according to the inventive concept, because engraved patterning is used in the cell array area MCA, after the plurality of conductive landing pads LP, LP2, LP3, or LP4 densely arranged with a relatively small pitch are formed, the generation of pattern defects, such as sticking between the plurality of conductive landing pads LP, LP2, LP3, or LP4, a break in some of the conductive landing pads LP, LP2, LP3, or LP4, or the like, may be prevented, and the electrical reliability of the integrated circuit device may improve due to an increased contact area between the first recess contact plug 262R and each of the plurality of conductive landing pads LP, LP2, LP3, or LP4. Furthermore, because embossed patterning is used in the peripheral circuit area CORE/PERI, the plurality of conductive patterns (that is, CNP) having various widths and spaced apart from each other with various-width spaces therebetween may be easily formed with intended shapes. As such, according to the methods of manufacturing an integrated circuit device, according to some embodiments, intended patterns having various shapes and various sizes may be effectively formed in the cell array area MCA and the peripheral circuit area CORE/PERI, which have different pattern densities from each other, by a simplified and relatively low-cost process by limiting a high-cost exposure process using an EUV light source to one or two times. Therefore, a process margin may be maximized while minimizing the possibility of generating process defects.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Spatially descriptive terms such as "above," "below," "upper" and "lower" may be used herein to indicate a position of elements, structures or features relative to one another as illustrated in the figures, rather than absolute positioning. Thus, the semiconductor device may be otherwise oriented (e.g., rotated 90 degrees or at other orientations), and the spatially relative descriptions used herein may be interpreted accordingly.

It will also be understood that when an element such as a layer, region or substrate is referred to as being "atop," "above," "on" or "over" another element, it is broadly intended that the element be in direct contact with the other element or intervening elements can also be present. In contrast, when an element is referred to as being "directly on" or "directly over" another element, it is intended that there are no intervening elements present. Likewise, it should be appreciated that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

While the inventive concept has been particularly shown and described with reference to embodiments thereof, it will be understood that various changes in form and details may be made therein without departing from the spirit and scope of the following claims.

What is claimed is:

1. A method of manufacturing an integrated circuit device, the method comprising:
    forming, on a substrate, a plurality of bit line structures, each of the bit line structures comprising a bit line and an insulating capping pattern, and a plurality of contact plugs between the plurality of bit line structures;
    forming a plurality of recess contact plugs respectively from the plurality of contact plugs and forming a plurality of recess spaces respectively on the plurality of recess contact plugs between the plurality of bit line structures, by partially removing each of the plurality of contact plugs;
    forming an engraved insulating pattern having a plurality of openings, on the plurality of bit line structures and the plurality of recess contact plugs, the plurality of openings being arranged to be respectively shifted in a horizontal direction from the plurality of recess contact plugs;
    forming a plurality of cut-off spaces, which are respectively connected to the plurality of recess spaces and overlap at least a portion of the bit line in a vertical direction, by partially removing the insulating capping pattern of each of the plurality of bit line structures through the plurality of openings; and
    forming a plurality of conductive landing pads respectively in the plurality of recess spaces and the plurality of cut-off spaces and respectively contacting upper surfaces of the plurality of recess contact plugs.

2. The method of claim 1, wherein, in the forming of the plurality of contact plugs, each of the plurality of contact plugs has an uppermost surface that is coplanar with an uppermost surface of each of the plurality of bit line structures, and,
    in the forming of the plurality of recess contact plugs, a vertical level of an uppermost surface of each of the plurality of recess contact plugs is farther from the substrate than a vertical level of an uppermost surface of the bit line of each of the plurality of bit line structures.

3. The method of claim 1, wherein, in the forming of the engraved insulating pattern, the engraved insulating pattern is in a portion of each of the plurality of recess spaces and is on a portion of each of the plurality of recess contact plugs and the plurality of bit line structures, and,
    after the engraved insulating pattern is formed, another portion of each of the plurality of recess contact plugs and the plurality of bit line structures is exposed by each of the plurality of openings of the engraved insulating pattern.

4. The method of claim 1, wherein, in the forming of the plurality of cut-off spaces, an upper corner portion of the insulating capping pattern of each of the plurality of bit line structures is removed through the plurality of openings of the engraved insulating pattern, and,
    after the plurality of cut-off spaces are formed, a vertical level of a bottom surface of each of the plurality of cut-off spaces is coplanar with an uppermost surface of a portion of each of the plurality of recess contact plugs, which is exposed by each of the plurality of openings.

5. The method of claim 1, wherein the forming of the plurality of cut-off spaces comprises removing an upper corner portion of the insulating capping pattern of each of the plurality of bit line structures through the plurality of openings of the engraved insulating pattern,
    and wherein, after the plurality of cut-off spaces are formed, a vertical level of a lowermost surface of each of the plurality of cut-off spaces is closer to the substrate than a vertical level of an uppermost surface of a portion of each of the plurality of recess contact plugs, which is exposed by each of the plurality of openings, and a sidewall of each of the plurality of recess contact plugs is exposed by each of the plurality of cut-off spaces.

6. The method of claim 1, wherein, after the plurality of conductive landing pads are formed, a vertical level of a lower surface of each of the plurality of conductive landing pads is coplanar with an upper surface of each of the plurality of recess contact plugs.

7. The method of claim 1, wherein, after the plurality of conductive landing pads are formed, a vertical level of a lowermost surface of each of the plurality of conductive landing pads is closer to the substrate than a vertical level of an uppermost surface of each of the plurality of recess contact plugs, and each of the plurality of conductive landing pads is on an upper surface and a sidewall of a recess contact plug closest thereto from among the plurality of recess contact plugs.

8. The method of claim 1, wherein, after the plurality of conductive landing pads are formed, each of the plurality of conductive landing pads comprises a lower corner portion that is convex toward the insulating capping pattern of each of the plurality of bit line structures, and the insulating capping pattern comprises an upper cutout portion that is configured having a contour that is in correspondence with a shape of the lower corner portion of each of the plurality of conductive landing pads.

9. The method of claim 1, wherein, after the plurality of conductive landing pads are formed, each of the plurality of conductive landing pads comprises a lower round corner portion that is convex toward the insulating capping pattern of each of the plurality of bit line structures, and the insulating capping pattern comprises an upper round cutout portion that is configured having a contour that is in correspondence with a shape of the lower round corner portion of each of the plurality of conductive landing pads.

10. The method of claim 1, wherein the plurality of recess contact plugs and the plurality of conductive landing pads each include at least one of a metal and a conductive metal nitride.

11. A method of manufacturing an integrated circuit device, the method comprising:
on a substrate having a cell array area and a peripheral circuit area, forming a plurality of bit line structures, each of the bit line structures comprising a bit line and an insulating capping pattern, and a plurality of first contact plugs between the plurality of bit line structures, in the cell array area, and forming a plurality of second contact plugs, which are configured to be electrically connected to the substrate, in the peripheral circuit area;
forming a plurality of peripheral circuit wiring patterns, which are connected to at least a subset of the plurality of second contact plugs, in the peripheral circuit area;
after the plurality of peripheral circuit wiring patterns are formed, forming a plurality of first recess contact plugs respectively from the plurality of first contact plugs and forming a plurality of recess spaces respectively on the plurality of first recess contact plugs between the plurality of bit line structures, by removing a portion of each of the plurality of first contact plugs in the cell array area;
forming an engraved insulating pattern having a plurality of openings, on the plurality of bit line structures and the plurality of first recess contact plugs in the cell array area, the plurality of openings being arranged to be respectively shifted in a horizontal direction from the plurality of first recess contact plugs;
forming, in the cell array area, a plurality of cut-off spaces, which are respectively connected to the plurality of recess spaces and overlap at least a portion of the bit line in a vertical direction, by removing a portion of the insulating capping pattern of each of the plurality of bit line structures through the plurality of openings; and
forming, in the cell array area, a plurality of conductive landing pads respectively in the plurality of recess spaces and the plurality of cut-off spaces and respectively contacting upper surfaces of the plurality of first recess contact plugs.

12. The method of claim 11, wherein the forming of the plurality of first contact plugs and the forming of the plurality of second contact plugs are simultaneously performed, and,
after the plurality of first contact plugs and the plurality of second contact plugs are formed, respective uppermost surfaces of the plurality of first contact plugs, the plurality of second contact plugs, and the plurality of bit line structures are coplanar with each other.

13. The method of claim 11, wherein the forming of the plurality of peripheral circuit wiring patterns is performed after the forming of the plurality of second contact plugs and before the forming of the plurality of recess spaces, and
the forming of the plurality of peripheral circuit wiring patterns comprises:
forming a first conductive layer over at least a portion of the substrate on the plurality of first contact plugs in the cell array area and on the plurality of second contact plugs in the peripheral circuit area;
forming the plurality of peripheral circuit wiring patterns by patterning the first conductive layer in the peripheral circuit area; and
exposing the plurality of first contact plugs by removing a portion of the first conductive layer, which remains in the cell array area.

14. The method of claim 11, wherein, in the forming of the engraved insulating pattern, the engraved insulating pattern comprises a portion on the plurality of peripheral circuit wiring patterns that is configured not to expose the plurality of peripheral circuit wiring patterns in the peripheral circuit area.

15. The method of claim 11, wherein, in at least one of the forming of the plurality of peripheral circuit wiring patterns and the forming of the engraved insulating pattern, a photolithography process using an extreme ultraviolet (EUV) light source is performed.

16. The method of claim 11, wherein the forming of the plurality of conductive landing pads comprises:
forming a second conductive layer over at least a portion of the substrate in the plurality of recess spaces and the plurality of cut-off spaces and on the engraved insulating pattern, in the cell array area;
forming the plurality of conductive landing pads, each of at least a subset of the plurality of conductive landing pads having an upper surface that is lower than an upper surface of the engraved insulating pattern, in the cell array area, and exposing the engraved insulating pattern in the peripheral circuit area, by etching the second conductive layer in the cell array area and the peripheral circuit area; and
etching a portion of the engraved insulating pattern in the cell array area and the peripheral circuit area, such that an uppermost surface of the engraved insulating pattern and an uppermost surface of each of the plurality of conductive landing pads are coplanar in the cell array area and the plurality of peripheral circuit wiring patterns are exposed in the peripheral circuit area.

17. A method of manufacturing an integrated circuit device, the method comprising:
on a substrate having a cell array area and a peripheral circuit area, forming a plurality of bit line structures, each of the bit line structures comprising a bit line and an insulating capping pattern, and a plurality of first contact plugs between the plurality of bit line structures, in the cell array area, and forming a plurality of second contact plugs, which are configured to be electrically connected to the substrate, in the peripheral circuit area;
forming a plurality of first recess contact plugs respectively from the plurality of first contact plugs and forming a plurality of recess spaces respectively on the plurality of first recess contact plugs between the plurality of bit line structures, by removing a portion of each of the plurality of first contact plugs in the cell array area;

after the plurality of recess spaces are formed, forming a plurality of peripheral circuit wiring patterns, which are respectively connected to at least a subset of the plurality of second contact plugs, in the peripheral circuit area;

forming an engraved insulating pattern having a plurality of openings, on the plurality of bit line structures and the plurality of first recess contact plugs in the cell array area, the plurality of openings being arranged to be respectively shifted in a horizontal direction from the plurality of first recess contact plugs;

forming, in the cell array area, a plurality of cut-off spaces, which are respectively connected to the plurality of recess spaces and overlap at least a portion of the bit line in a vertical direction, by removing a portion of the insulating capping pattern of each of the plurality of bit line structures through the plurality of openings; and forming, in the cell array area, a plurality of conductive landing pads respectively in the plurality of recess spaces and the plurality of cut-off spaces and respectively contacting upper surfaces of the plurality of first recess contact plugs.

18. The method of claim 17, wherein the forming of the plurality of peripheral circuit wiring patterns comprises:

before the forming of the plurality of recess spaces, forming a first conductive layer over at least a portion of the substrate on the plurality of first contact plugs in the cell array area and on the plurality of second contact plugs in the peripheral circuit area; and, after the forming of the plurality of recess spaces, forming the plurality of peripheral circuit wiring patterns by patterning the first conductive layer in the peripheral circuit area, and the forming of the plurality of recess spaces comprises:

after the first conductive layer is formed, exposing the plurality of first contact plugs by removing the first conductive layer in the cell array area; and removing a portion of each of the plurality of first contact plugs in the cell array area, while the first conductive layer is on the plurality of second contact plugs in the peripheral circuit area.

19. The method of claim 17, wherein the forming of the engraved insulating pattern comprises:

forming, in the cell array area, an insulating film on at least a portion of a resulting product in which the plurality of recess spaces are formed;

forming a first hardmask structure to on the insulating film, in the cell array area;

forming a first photoresist pattern on at least a portion of the first hardmask structure in the cell array area; and forming, in the cell array area, a first hardmask pattern by etching the first hardmask structure by using the first photoresist pattern as an etch mask, and etching the insulating film by using the first hardmask pattern as an etch mask, wherein the forming of the plurality of peripheral circuit wiring patterns comprises:

forming a first conductive layer on the plurality of second contact plugs, in the peripheral circuit area;

forming a second hardmask structure on the first conductive layer, in the peripheral circuit area;

forming a second photoresist pattern on at least a portion of the second hardmask structure in the peripheral circuit area; and forming a second hardmask pattern by etching the second hardmask structure by using the second photoresist pattern as an etch mask, in the peripheral circuit area, and forming the plurality of peripheral circuit wiring patterns by etching the first conductive layer by using the second hardmask pattern as an etch mask, wherein the first hardmask structure and the second hardmask structure are simultaneously formed, and the first photoresist pattern and the second photoresist pattern are simultaneously formed by a photolithography process using an extreme ultraviolet (EUV) light source.

20. The method of claim 17, wherein the forming of the plurality of conductive landing pads comprises:

forming an insulating film on at least a portion of the plurality of peripheral circuit wiring patterns, in the peripheral circuit area;

forming a second conductive layer over at least a portion of the substrate in the plurality of recess spaces and the plurality of cut-off spaces in the cell array area and on the insulating film in the peripheral circuit area;

forming the plurality of conductive landing pads, each of at least a portion of the conductive landing pads having an upper surface that is lower than an upper surface of the engraved insulating pattern, in the cell array area, and exposing the insulating film in the peripheral circuit area, by etching the second conductive layer in the cell array area and the peripheral circuit area; and etching a portion of the engraved insulating pattern such that an uppermost surface of the engraved insulating pattern and an uppermost surface of each of the plurality of conductive landing pads are coplanar, in the cell array area.

* * * * *